United States Patent
Tanabe et al.

(10) Patent No.: US 11,659,768 B2
(45) Date of Patent: May 23, 2023

(54) PIEZOELECTRIC MATERIAL FILLER, COMPOSITE PIEZOELECTRIC MATERIAL, COMPOSITE PIEZOELECTRIC DEVICE, COMPOSITE PIEZOELECTRIC MATERIAL FILLER, AND METHOD FOR PRODUCING ALKALI NIOBATE COMPOUND

(71) Applicant: Nippon Chemical Industrial Co., Ltd., Tokyo (JP)

(72) Inventors: Shinji Tanabe, Tokyo (JP); Hajime Kunita, Tokyo (JP); Shunsuke Kikuchi, Tokyo (JP)

(73) Assignee: NIPPON CHEMICAL INDUSTRIAL CO., LTD., Tokyo (JP)

( * ) Notice: Subject to any disclaimer, the term of this patent is extended or adjusted under 35 U.S.C. 154(b) by 0 days.

(21) Appl. No.: 17/543,093

(22) Filed: Dec. 6, 2021

(65) Prior Publication Data

US 2022/0093845 A1 Mar. 24, 2022

Related U.S. Application Data

(63) Continuation of application No. 16/310,988, filed as application No. PCT/JP2017/022533 on Jun. 19, 2017, now Pat. No. 11,239,409.

(30) Foreign Application Priority Data

| Jun. 23, 2016 | (JP) | 2016-124284 |
| Jun. 23, 2016 | (JP) | 2016-124285 |
| Jun. 23, 2016 | (JP) | 2016-124286 |
| Nov. 14, 2016 | (JP) | 2016-221324 |
| Jun. 5, 2017 | (JP) | 2017-110787 |
| Jun. 5, 2017 | (JP) | 2017-110788 |
| Jun. 5, 2017 | (JP) | 2017-110789 |
| Jun. 16, 2017 | (JP) | 2017-118243 |
| Jun. 16, 2017 | (JP) | 2017-118244 |
| Jun. 16, 2017 | (JP) | 2017-118245 |

(51) Int. Cl.
| H10N 30/85 | (2023.01) |
| C01G 33/00 | (2006.01) |
| H10N 30/853 | (2023.01) |
| H10N 30/097 | (2023.01) |
| H10N 30/30 | (2023.01) |
| H01L 41/18 | (2006.01) |
| H01L 41/187 | (2006.01) |
| H01L 41/43 | (2013.01) |
| H01L 41/113 | (2006.01) |

(52) U.S. Cl.
CPC .......... *H01L 41/183* (2013.01); *C01G 33/006* (2013.01); *H01L 41/1873* (2013.01); *H01L 41/43* (2013.01); *C01P 2002/72* (2013.01); *C01P 2002/74* (2013.01); *C01P 2004/03* (2013.01); *C01P 2004/51* (2013.01); *C01P 2004/52* (2013.01); *C01P 2004/53* (2013.01); *C01P 2004/61* (2013.01); *C01P 2004/62* (2013.01); *C01P 2006/12* (2013.01); *C01P 2006/40* (2013.01); *H01L 41/113* (2013.01)

(58) Field of Classification Search
CPC .............. H01L 41/183; H01L 41/1873; C01P 2004/53; C01P 2004/61; C01P 2004/62; C01P 2006/12; C01P 2006/40
See application file for complete search history.

(56) References Cited

U.S. PATENT DOCUMENTS

| 2007/0024162 A1* | 2/2007 | Shibata | H01L 41/0805 |
| | | | 310/358 |
| 2017/0018700 A1 | 1/2017 | Miyoshi et al. | |

FOREIGN PATENT DOCUMENTS

| CN | 105073683 | * 11/2015 |
| EP | 1975137 | * 10/2008 |
| GB | 858042 A | 1/1961 |
| JP | 2007-22854 A | 2/2007 |
| JP | 2007-201388 A | 8/2007 |
| JP | 2010-241658 A | 10/2010 |
| JP | 2011-236091 A | 11/2011 |
| JP | 2012-142546 A | 7/2012 |
| JP | 2014-11344 A | 1/2014 |
| JP | 2015-50432 A | 3/2015 |
| JP | 2015-192120 A | 11/2015 |
| JP | 2015-222780 A | 12/2015 |
| WO | 2016/157092 A1 | 10/2016 |
| WO | WO 2016/157092 | * 10/2016 |
| WO | 2017/010135 A1 | 1/2017 |

OTHER PUBLICATIONS

International Search Report w/English translation and Written Opinion in Japanese dated Sep. 12, 2017, issued in counterpart International Application No. PCT/JP2017/022533 (12 pages).

Office Action dated Dec. 8, 2020, issued in counterpart TW Application No. 106120803, with English Translation. (12 pages).

* cited by examiner

*Primary Examiner* — C Melissa Koslow
(74) *Attorney, Agent, or Firm* — WHDA, LLP

(57) ABSTRACT

Provided is a piezoelectric material filler including alkali niobate compound particles having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms. The present invention can provide a piezoelectric material filler having excellent piezoelectric properties, and a composite piezoelectric material including the piezoelectric material filler and a polymer matrix.

20 Claims, 11 Drawing Sheets

PIEZOELECTRIC MATERIAL FILLER, COMPOSITE PIEZOELECTRIC MATERIAL, COMPOSITE PIEZOELECTRIC DEVICE, COMPOSITE PIEZOELECTRIC MATERIAL FILLER, AND METHOD FOR PRODUCING ALKALI NIOBATE COMPOUND

CROSS-REFERENCE TO RELATED APPLICATIONS

This application is a divisional of U.S. application Ser. No. 16/310,988, filed on Dec. 18, 2018, issued as U.S. Pat. No. 11,239,409, which is a 371 of International Application No. PCT/JP2017/022533, filed on Jun. 19, 2017, which is based upon and claims the benefit of priority from the prior Japanese Patent Application No. 2016-124284, filed on Jun. 23, 2016, Japanese Patent Application No. 2016-124285, filed on Jun. 23, 2016, Japanese Patent Application No. 2016-124286, filed on Jun. 23, 2016, Japanese Patent Application No. 2016-221324, filed on Nov. 14, 2016, Japanese Patent Application No. 2017-110787, filed on Jun. 5, 2017, Japanese Patent Application No. 2017-110788, filed on Jun. 5, 2017, Japanese Patent Application No. 2017-110789, filed on Jun. 5, 2017, Japanese Patent Application No. 2017-118243, filed on Jun. 16, 2017, Japanese Patent Application No. 2017-118244, filed on Jun. 16, 2017 and Japanese Patent Application No. 2017-118245, filed on Jun. 16, 2017, the entire contents of which are incorporated herein by reference.

TECHNICAL FIELD

The present invention relates to a piezoelectric material filler, a composite piezoelectric material using the piezoelectric material filler, and a composite piezoelectric device using the same.

Further, the present invention relates to a composite piezoelectric material filler that is used as a filler of a composite piezoelectric material comprising a polymer matrix and a filler dispersed in the matrix, a composite piezoelectric material using the composite piezoelectric material filler, and a composite piezoelectric device using the same.

Further, the present invention relates to a method for producing an alkali niobate compound that is used as a piezoelectric ceramic raw material for sintering production or a composite piezoelectric material filler of a composite piezoelectric material in which a filler a for composite piezoelectric material is contained and dispersed in a polymer matrix.

BACKGROUND ART

Conventionally, lead zirconate titanate having good piezoelectric properties has been often used as piezoelectric ceramics used for piezoelectric devices, sensors, or the like. However, in recent years, development of lead-free materials without using lead is required due to the growing interest in environmental pollution. Among lead-free materials, niobate piezoelectric ceramics having comparatively excellent piezoelectric properties have been researched.

Examples of the niobate piezoelectric ceramics include niobate ceramics of alkali metals such as Li, Na, and K. For example, Patent Literature 1 discloses alkali niobate piezoelectric ceramics represented by $AMO_3$ (where A represents an alkali metal, M represents Nb, and O represents oxygen). Further, Patent Literature 2 discloses potassium sodium niobate lead-free piezoelectric ceramics represented by $(1-n)K_xNa_{1-x}NbO_3 \cdot nMH$ (where MH represents a metal oxide or a metal carbonate, M represents a metal element having a different valence, H represents an O or $CO_3$ radical, $0.2 \leq x \leq 0.95$, and $0 \leq n \leq 0.30$). Further, Patent Literature 3 discloses piezoelectric ceramics of $KNbO_3$ ceramics.

Further, Patent Literature 4 and Patent Literature 5 disclose composite piezoelectric materials in which piezoelectric particles are dispersed in a polymer matrix, for example.

CITATION LIST

Patent Literature

Patent Literature 1: Japanese Patent Application Laid-Open No. 2011-236091
Patent Literature 2: Japanese Patent Application Laid-Open No. 2007-22854
Patent Literature 3: Japanese Patent Application Laid-Open No. 2010-241658
Patent Literature 4: Japanese Patent Application Laid-Open No. 2012-142546
Patent Literature 5: Japanese Patent Application Laid-Open No. 2015-50432

SUMMARY OF INVENTION

Technical Problem

Examples of the niobate piezoelectric ceramics include niobate ceramics of alkali metals such as Li, Na, and K, as described above, where attempts to adjust the composition ratio of alkali metals have been made in order to achieve excellent piezoelectric properties, but sufficient piezoelectric properties could not have been achieved yet. Further, also for the composite piezoelectric materials in which piezoelectric particles are dispersed in a polymer matrix, optimization of the composition ratio of alkali metals for achieving excellent piezoelectric properties in the niobate alkali metal compound used as the piezoelectric particles is still being discussed.

Accordingly, it is an object of the present invention to provide a piezoelectric material filler having excellent piezoelectric properties by adjusting the composition ratio of alkali metals in a niobate alkali metal compound and to provide a composite piezoelectric material using the piezoelectric material filler.

Further, the aforementioned piezoelectric ceramics have difficulty in formability. In contrast, examples of piezoelectric materials having excellent formability include composite piezoelectric materials in which piezoelectric particles are dispersed in a polymer matrix, and composite piezoelectric materials comprising a polymer matrix are expected to be used in applications in which conventional piezoelectric ceramics have not been used, because of their good formability.

However, Patent Literature 4 and Patent Literature 5, for example, disclose composite piezoelectric materials in which piezoelectric particles are dispersed in a polymer matrix, as such composite piezoelectric materials, but the composite piezoelectric materials in which piezoelectric particles are dispersed in a polymer matrix have not been studied sufficiently so far. Therefore, development of composite piezoelectric materials comprising a polymer matrix having excellent piezoelectric properties has been desired.

Accordingly, it is an object of the present invention to provide a composite piezoelectric material comprising a polymer matrix having excellent piezoelectric properties and to provide a composite piezoelectric material filler used for the composite piezoelectric material.

Further, in production of conventional alkali niobate compounds, when alkali compounds and a niobium compound are dry-mixed and fired, the alkali compounds deliquesce, thereby making uniform mixing difficult. Therefore, there has been a problem that the molar ratio of the alkali metals in the composite metal oxide obtained by firing deviates from a desired molar ratio, and precise adjustment of the molar ratio of the alkali metals is difficult.

Accordingly, it is an object of the present invention to provide a method for producing an alkali niobate compound by dry-mixing firing raw materials, the method enabling precise adjustment of the molar ratio of alkali metals.

Solution to Problem

The aforementioned problem is solved by the present invention below.

(1) A piezoelectric material filler comprising alkali niobate compound particles having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms.
(2) The piezoelectric material filler according to (1), wherein the alkali niobate compound particles have an average particle size of 0.1 to 15 μm.
(3) The piezoelectric material filler according to (1) or (2), wherein a ratio (Li/(Li+Na+K)) of the number of moles of lithium to the total number of moles of alkali metal elements in the alkali niobate compound particles is 0 or more and less than 0.10 in terms of atoms.
(4) A composite piezoelectric material comprising:
the piezoelectric material filler according to any of (1) to (3); and
a polymer matrix.
(5) A composite piezoelectric device comprising:
the composite piezoelectric material according to (4) which has been polarized.
(6) A composite piezoelectric material comprising:
a polymer matrix; and
a piezoelectric material filler dispersed in the polymer matrix, wherein
the piezoelectric material filler comprises alkali niobate compound particles having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms.
(7) The composite piezoelectric material according to (6), wherein
a content of the composite piezoelectric material filler is 20 to 80 vol % based on the entire composite piezoelectric material.
(8) The composite piezoelectric material according to (6) or (7), wherein
a ratio (Li/(Li+Na+K)) of the number of moles of lithium to the total number of moles of alkali metal elements in the alkali niobate compound particles is 0 or more and less than 0.10 in terms of atoms.
(9) A composite piezoelectric device comprising:
the composite piezoelectric material according to any of (6) to (8) which has been polarized.
(10) A composite piezoelectric material comprising:
a polymer matrix; and
a composite piezoelectric material filler dispersed in the polymer matrix, wherein
the composite piezoelectric material filler comprises:
a small-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms; and
a large-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms,
a total content of the small-particle size filler and the large-particle size filler is 20 to 80 vol % based on the entire composite piezoelectric material,
the small-particle size filler has an average particle size (D50) of 0.1 to 1.2 μm,
the large-particle size filler has an average particle size (D50) of 1 to 15 μm, and
a content ratio of the large-particle size filler to the small-particle size filler (large-particle size filler:small-particle size filler) is 10:90 to 90:10 by volume.
(11) The composite piezoelectric material according to (10), wherein the small-particle size filler has a BET specific surface area of 2 to 15 $m^2/g$, and the large-particle size filler has a BET specific surface area of 0.1 to 3 $m^2/g$.
(12) The composite piezoelectric material according to (10) or (11), wherein a ratio (large-particle size filler/small-particle size filler) of the average particle size (D50) of the large-particle size filler to the average particle size (D50) of the small-particle size filler is 2 to 150.
(13) The composite piezoelectric material according to any of (10) to (12), wherein
a ratio (Li/(Li+Na+K)) of the number of moles of lithium to the total number of moles of alkali metal elements in the small-particle size filler is 0 or more and less than 0.10 in terms of atoms, and
a ratio (Li/(Li+Na+K)) of the number of moles of lithium to the total number of moles of alkali metal elements in the large-particle size filler is 0 or more and less than 0.10 in terms of atoms.
(14) A composite piezoelectric device comprising:
the composite piezoelectric material according to any of (10) to (13) which has been polarized.
(15) A composite piezoelectric material comprising:
a polymer matrix; and
a composite piezoelectric material filler dispersed in the polymer matrix, wherein
the composite piezoelectric material filler comprises an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms,
a content of the alkali niobate compound is 20 to 80 vol % based on the entire composite piezoelectric material, and
the alkali niobate compound exhibits a bimodal particle size distribution including a first peak having a peak top in a particle size range of 0.1 to 1.2 μm and a second peak having a peak top in a particle size range of 1 to 15 μm in a particle size distribution measurement, wherein a ratio (B/A) of a value (B) of a frequency (%) of a particle size at the peak top of the second peak to a value (A) of a frequency (%) of a particle size at the peak top of the first peak is 0.1 to 20.

(16) The composite piezoelectric material according to (15), wherein a ratio (the particle size at the peak top of the second peak/the particle size at the peak top of the first peak) of the particle size at the peak top of the second peak to the particle size at the peak top of the first peak is 2 to 150.

(17) The composite piezoelectric material according to any of (15) or (16), wherein a ratio (Li/(Li+Na+K)) of the number of moles of lithium to the total number of moles of alkali metal elements in the alkali niobate compound is 0 or more and less than 0.10 in terms of atoms.

(18) A composite piezoelectric device comprising:
the composite piezoelectric material according to any of (15) to (17) which has been polarized.

(19) A composite piezoelectric material filler comprising a mixture of:
a small-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms; and
a large-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein
the small-particle size filler has an average particle size (D50) of 0.1 to 1.2 μm,
the large-particle size filler has an average particle size (D50) of 1 to 15 μm, and
a mixing ratio (large-particle size filler:small-particle size filler) of the large-particle size filler to the small-particle size filler is 10:90 to 90:10 by volume.

(20) The composite piezoelectric material according to (19), wherein
the small-particle size filler has a BET specific surface area of 2 to 15 $m^2/g$, and
the large-particle size filler has a BET specific surface area of 0.1 to 3 $m^2/g$.

(21) The composite piezoelectric material filler according to (19) or (20), wherein a ratio (large-particle size filler/small-particle size filler) of the average particle size (D50) of the large-particle size filler to the average particle size (D50) of the small-particle size filler is 2 to 150.

(22) The composite piezoelectric material according to any of (19) to (21), wherein a ratio (Li/(Li+Na+K)) of the number of moles of lithium to the total number of moles of alkali metal elements in the small-particle size filler is 0 or more and less than 0.10 in terms of atoms, and a ratio (Li/(Li+Na+K)) of the number of moles of lithium to the total number of moles of alkali metal elements in the large-particle size filler is 0 or more and less than 0.10 in terms of atoms.

(23) A composite piezoelectric material comprising:
the composite piezoelectric material filler according to any of (19) to (22); and
a polymer matrix.

(24) A composite piezoelectric device comprising:
the composite piezoelectric material according to (23) which has been polarized.

(25) A composite piezoelectric material filler comprising:
an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms,
the composite piezoelectric material filler exhibiting a bimodal particle size distribution including a first peak having a peak top in a particle size range of 0.1 to 1.2 μm and a second peak having a peak top in a particle size range of 1 to 15 μm in a particle size distribution measurement, wherein a ratio (B/A) of a value (B) of a frequency (%) of a particle size at the peak top of the second peak to a value (A) of a frequency (%) of a particle size at the peak top of the first peak is 0.1 to 20.

(26) The composite piezoelectric material filler according to (25), wherein a ratio (Li/(Li+Na+K)) of the number of moles of lithium to the total number of moles of alkali metal elements in the alkali niobate compound is 0 or more and less than 0.10 in terms of atoms.

(27) The composite piezoelectric material filler according to (25) or (26), wherein a ratio (the particle size at the peak top of the second peak/the particle size at the peak top of the first peak) of the particle size at the peak top of the second peak to the particle size at the peak top of the first peak is 2 to 150.

(28) A composite piezoelectric material comprising:
the composite piezoelectric material filler according to any of (25) to (27); and
a polymer matrix.

(29) A composite piezoelectric device comprising:
the composite piezoelectric material according to (28) which has been polarized.

(30) A composite piezoelectric material filler used for the composite piezoelectric material according to (10), the composite piezoelectric material filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, and the composite piezoelectric material filler having an average particle size (D50) of 0.1 to 1.2 μm.

(31) The composite piezoelectric material filler according to (30), wherein a ratio (Li/(Li+Na+K)) of the number of moles of lithium to the total number of moles of alkali metal elements in the alkali niobate compound is 0 or more and less than 0.10 in terms of atoms.

(32) A composite piezoelectric material filler used for the composite piezoelectric material according to (10), the composite piezoelectric material filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, and the composite piezoelectric material filler having an average particle size (D50) of 1 to 15 μm.

(33) The composite piezoelectric material filler according to (32), wherein a ratio (Li/(Li+Na+K)) of the number of moles of lithium to the total number of moles of alkali metal elements in the alkali niobate compound is 0 or more and less than 0.10 in terms of atoms.

(34) A method for producing an alkali niobate compound having a ratio ((Li+Na+K)/Nb) of the total number of moles of alkali metal elements to the number of moles of Nb of 0.995 to 1.005 in terms of atoms, the method comprising:

a first step of dry-mixing alkali compounds and a niobium compound in an amount giving a ratio ((Li+Na+K)/Nb) of the total number of moles of alkali metal elements to the number of moles of Nb of 0.900 to 1.000 in terms of atoms and a difference of a ratio (K/(Na+K)) of the number of moles of K to the total number of moles of Na and K from a ratio (K/(Na+K)) of the number of moles of K to the total number of moles of Na and K in the alkali niobate compound as a production object falling within ±0.015, to prepare a first firing raw material;

a second step of firing the first firing raw material at 500 to 750° C., to obtain a first fired product;

a third step of dry-mixing alkali compounds with the first fired product in an amount giving a ratio ((Li+Na+K)/Nb) of the total number of moles of alkali metal elements to the number of moles of Nb of 0.995 to 1.005 in terms of atoms and a difference of a ratio (K/(Na+K)) of the number of moles of K to the total number of moles of Na and K from a ratio (K/(Na+K)) of the number of moles of K to the total number of moles of Na and K in the alkali niobate compound as a production object falling within ±0.010, to prepare a second firing raw material; and a fourth step of firing the second firing raw material at 500 to 1000° C., to obtain the alkali niobate compound.

(35) The method for producing an alkali niobate compound according to (34), wherein the alkali compounds are any of $Li_2CO_3$, $Na_2CO_3$, and $K_2CO_3$, or a combination of any two or more of $Li_2CO_3$, $Na_2CO_3$, and $K_2CO_3$, and the niobium compound is $Nb_2O_5$.

(36) The method for producing an alkali niobate compound according to (34) or (35), wherein the first fired product obtained in the second step is ground to obtain a ground product.

(37) The method for producing an alkali niobate compound according to any of (34) to (36), wherein the alkali niobate compound obtained in the fourth step is ground to obtain a ground product.

(38) The method for producing an alkali niobate compound according to any of (34) to (37), wherein the alkali niobate compound obtained in the fourth step is further fired at 500 to 1000° C.

(39) The method for producing an alkali niobate compound according to any of (34) to (38), wherein in the alkali niobate compound, the ratio (K/(Na+K)) of the number of moles of K to the total number of moles of Na and K is 0 to 1.000 in terms of atoms, and a ratio (Li/(Li+Na+K)) of the number of moles of lithium to the total number of moles of alkali metal elements is 0 to 0.100 in terms of atoms.

Advantageous Effects of Invention

The present invention can provide a piezoelectric material filler having excellent piezoelectric properties, and a composite piezoelectric material comprising the piezoelectric material filler and a polymer matrix.

Further, the present invention can provide a composite piezoelectric material comprising a polymer matrix having excellent piezoelectric properties, and a composite piezoelectric material filler used for the composite piezoelectric material.

Further, the present invention can provide a method for producing an alkali niobate compound by dry-mixing firing raw materials, the method enabling precise adjustment of the molar ratio of alkali metals.

DESCRIPTION OF EMBODIMENTS

Figure 1:
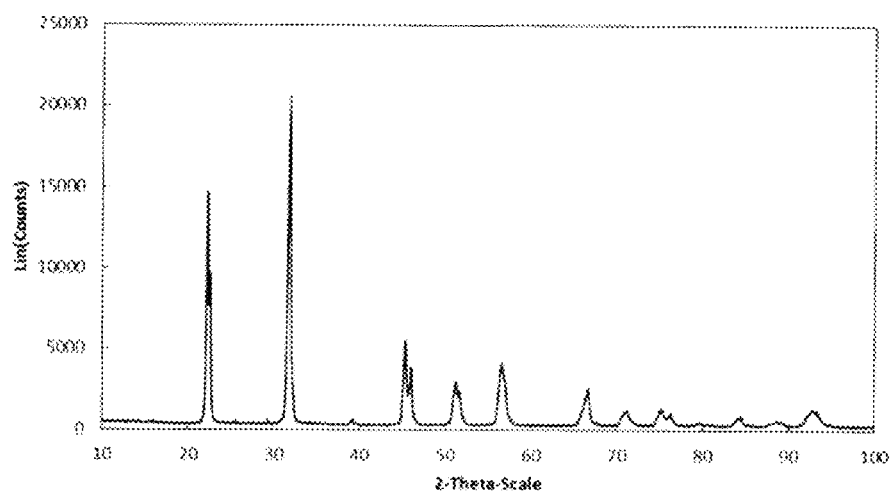
FIG. 1 is an XRD chart of potassium sodium niobate obtained in Example 1.

A first invention of the present invention will be described.

<First Invention>

A piezoelectric material filler of the present invention comprises alkali niobate compound particles having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms.

The piezoelectric material filler of the present invention is a filler for piezoelectric materials used for producing a composite piezoelectric material comprising a polymer matrix and a filler by being contained and dispersed in the polymer matrix or used as a raw material for producing piezoelectric ceramics.

In the alkali niobate compound particles according to the piezoelectric material filler of the present invention, the ratio (K/(Na+K)) of the number of moles of potassium to the total number of moles of sodium and potassium is 0.460 to 0.495, preferably 0.465 to 0.495, particularly preferably 0.470 to 0.490, in terms of atoms. The ratio (K/(Na+K)) of the number of moles of potassium to the total number of moles of sodium and potassium falling within the aforementioned ranges enhances the piezoelectric properties.

In the alkali niobate compound particles according to the piezoelectric material filler of the present invention, the ratio ((Li+Na+K)/Nb) of the total number of moles of alkali metal elements to the number of moles of niobium is 0.995 to 1.005, preferably 0.997 to 1.003, in terms of atoms.

The alkali niobate compound particles according to the piezoelectric material filler of the present invention essentially contain sodium and potassium as alkali compounds, and the alkali niobate compound particles according to the piezoelectric material filler of the present invention may contain lithium for purposes such as improving the sinterability and controlling the variation of piezoelectric properties. In the composition ratio of lithium in the alkali niobate compound particles, a ratio (Li/(Li+Na+K)) of the number of moles of lithium to the total number of moles of alkali metal elements is 0 or more and less than 0.10, preferably 0 or more and less than 0.09, in terms of atoms, in order not to impair the piezoelectric properties while achieving the aforementioned purposes.

The alkali niobate compound constituting the piezoelectric material filler of the present invention is a perovskite alkali niobate compound represented by the following general formula (1):

$$ANbO_3 \qquad (1).$$

In the alkali niobate compound represented by the general formula (1), A essentially contains sodium and potassium and may contain lithium, the ratio (K/(Na+K)) of the number of moles of potassium to the total number of moles of sodium and potassium is 0.460 to 0.495, preferably 0.465 to 0.495, particularly preferably 0.470 to 0.490, in terms of atoms, and the ratio ((Li+Na+K)/Nb) of the total number of moles of alkali metal elements to the number of moles of niobium is 0.995 to 1.005, preferably 0.997 to 1.003, in terms of atoms.

The piezoelectric material filler of the present invention is a particulate alkali niobate compound. The average particle size of the alkali niobate compound particles according to the piezoelectric material filler of the present invention is preferably 0.1 to 15 μm, particularly preferably 0.2 to 12 μm. In the present invention, the average particle size is a cumulative particle size at 50% (D50) determined in a volume frequency particle size distribution measurement measured by laser light scattering using MT3300EXII, manufactured by MicrotracBEL Corp.

The BET specific surface area of the alkali niobate compound particles according to the piezoelectric material filler of the present invention is preferably 0.1 to 15 $m^2/g$, particularly preferably 0.2 to 10 $m^2/g$.

The piezoelectric material filler of the present invention is suitably produced by a method for producing an alkali niobate compound according to the present invention described below.

The method for producing an alkali niobate compound according to the present invention is a method for producing an alkali niobate compound having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms, the method comprising: a first step of dry-mixing alkali compounds and a niobium compound in an amount giving a ratio ((Li+Na+K)/Nb) of the number of moles of alkali metal elements to the number of moles of Nb of 0.900 to 1.000 in terms of atoms and a difference of a ratio (K/(Na+K)) of the number of moles of K to the total number of moles of Na and K from the ratio of the number of moles of K to the total number of moles of Na and K in the alkali niobate compound as a production object falling within ±0.015, to prepare a first firing raw material; a second step of firing the first firing raw material at 500 to 750° C., to obtain a first fired product; a third step of dry-mixing alkali compounds with the first fired product in an amount giving a ratio ((Li+Na+K)/Nb) of the total number of moles of alkali metal elements to the number of moles of Nb of 0.995 to 1.005 in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.010, to prepare a second firing raw material; and a fourth step of firing the second firing raw material at 500 to 1000° C., to obtain the alkali niobate compound.

The first step is a step of dry-mixing alkali compounds and a niobium compound, to prepare a first firing raw material. The alkali compounds according to the first step essentially contain both a sodium compound and a potassium compound, and may contain a lithium compound, as required.

The sodium compound according to the first step is a compound having a sodium atom, and examples thereof include sodium carbonate, sodium hydrogencarbonate, sodium hydroxide, sodium oxalate, and sodium tartrate. The sodium compound may be of one type or a combination of two or more types. As the sodium compound, sodium carbonate ($Na_2CO_3$) is preferable for good handleability and good reactivity. Further, a higher purity of the sodium compound is preferable.

The average particle size (D50) of the sodium compound according to the first step is not particularly limited, and is preferably 1000 μm or less, particularly preferably 10 to 100 μm. The average particle size (D50) of the sodium compound falling within the aforementioned ranges increases the mixability with other raw materials and facilitates the adjustment of the composition, thereby enabling effective reaction in firing, which will be described below. Further, the BET specific surface area of the sodium compound according to the first step is not particularly limited, and is preferably 0.01 to 5 $m^2/g$, particularly preferably 0.1 to 3 $m^2/g$. The BET specific surface area of the sodium compound falling within the aforementioned ranges increases the mixability with other raw materials and facilitates the adjustment of the composition, thereby enabling effective reaction in firing, which will be described below.

The potassium compound according to the first step is a compound having a potassium atom, and examples thereof include potassium carbonate, potassium hydrogencarbonate, potassium hydroxide, potassium oxalate, and potassium tartrate. The potassium compound may be of one type or a combination of two or more types. As the potassium compound, potassium carbonate ($K_2CO_3$) is preferable for good handleability and good reactivity throughout blending to firing. Further, a higher purity of the potassium compound is preferable.

The average particle size (D50) of the potassium compound according to the first step is not particularly limited, and is preferably 1000 μm or less, particularly preferably 10 to 100 μm. The average particle size (D50) of the potassium compound falling within the aforementioned ranges increases the mixability with other raw materials and facilitates the adjustment of the composition, thereby enabling effective reaction in firing, which will be described below. Further, the BET specific surface area of the potassium compound according to the first step is not particularly limited, and is preferably 0.01 to 5 $m^2/g$, particularly preferably 0.1 to 3 $m^2/g$. The BET specific surface area of the potassium compound falling within the aforementioned ranges increases the mixability with other raw materials and facilitates the adjustment of the composition, thereby enabling effective reaction in firing, which will be described below.

The lithium compound according to the first step is a compound having a lithium atom, and examples thereof include lithium carbonate, sodium hydrogencarbonate, lithium hydroxide, lithium oxalate, and lithium tartrate. The lithium compound may be of one type or a combination of two or more types. As the lithium compound, lithium carbonate ($Li_2CO_3$) is preferable for good handleability and good reactivity. Further, a higher purity of the lithium compound is preferable.

The average particle size (D50) of the lithium compound according to the first step is not particularly limited, and is preferably 1000 μm or less, particularly preferably 10 to 100 μm. The average particle size (D50) of the lithium compound falling within the aforementioned ranges increases the mixability with other raw materials and facilitates the adjustment of the composition, thereby enabling effective reaction in firing, which will be described below. Further, the BET specific surface area of the lithium compound according to the first step is not particularly limited, and is preferably 0.01 to 5 $m^2/g$, particularly preferably 0.1 to 3 $m^2/g$. The BET specific surface area of the lithium compound falling within the aforementioned ranges increases the mixability with other raw materials and facilitates the adjustment of the composition, thereby enabling effective reaction in firing, which will be described below.

The niobium compound according to the first step is a compound having a niobium atom, and examples thereof include niobium pentoxide, niobium hydroxide, and ammonium niobium oxalate. The niobium compound may be of one type or a combination of two or more types. As the niobium compound, niobium pentoxide ($Nb_2O_5$) is preferable for easy handleability and good precise composition control. Further, a higher purity of the niobium compound is preferable.

The average particle size (D50) of the niobium compound according to the first step is not particularly limited, and is preferably 0.1 to 15 μm, particularly preferably 0.2 to 12 μm. The average particle size (D50) of the niobium compound falling within the aforementioned ranges increases the mixability with other raw materials and facilitates the adjustment of the composition, thereby enabling effective reaction in firing, which will be described below. Further, the BET specific surface area of the niobium compound according to the first step is not particularly limited, and is preferably 0.1 to 15 $m^2/g$, particularly preferably 0.2 to 10 $m^2/g$. The BET specific surface area of the niobium compound falling within the aforementioned ranges enables production of an alkali niobate compound having excellent dispersibility and good crystallinity even in the dry method. The average particle size in the present invention is a cumulative particle size at 50% (D50) determined in a volume frequency particle size distribution measurement measured by laser light scattering using MT3300EXII, manufactured by MicrotracBEL Corp.

In the first step, the first firing raw material is obtained by dry-mixing the alkali compounds and the niobium compound in an amount giving a ratio (($Li+Na+K$)/Nb) of the total number of moles of alkali metal elements to the number of moles of Nb of 0.900 to 1.000, preferably 0.920 to 0.995, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.015. That is, in the first step, the amount of the alkali metal elements in the first firing raw material is made equimolar to Nb or slightly less than the equimolar amount to Nb. Further, in the first step, the ratio of the amounts of Na and K in the first firing raw material is made equivalent to the molar ratio of Na and K in the alkali niobate compound as a production object. The alkali niobate compound as a production object is an alkali niobate compound that is intended to be obtained by performing the method for producing an alkali niobate compound according to the present invention. When the alkali niobate compound as a production object is an alkali niobate compound containing lithium, a lithium compound as an alkali compound may be mixed or not mixed to the first firing raw material in the first step, as long as the ratio (($Li+Na+K$)/Nb) of the total number of moles of alkali metal elements to the number of moles of Nb is 0.900 to 1.000, preferably 0.920 to 0.995, in terms of atoms. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms. Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the present invention, the phrase, the difference of the ratio (K/(Na+K)) of the number of moles of K to the total number of moles of Na and K in the first firing raw material from the ratio (K/(Na+K)) of the number of moles of K to the total number of moles of Na and K in the alkali niobate compound as a production object falls within ±0.015, means that, when the ratio (K/(Na+K)) of the number of moles of K to the total number of moles of Na and K in the first firing raw material in terms of atoms is referred to as Y, and the ratio (K/(Na+K)) of the number of moles of K to the total number of moles of Na and K in the alkali niobate compound as a production object is referred to as Z, the value "Y–Z" falls within ±0.015. For example, when producing an alkali niobate compound having a ratio (K/(Na+K)) of the number of moles of K to the total number of moles of Na and K of 0.45, the ratio (K/(Na+K)) of the number of moles of K to the total number of moles of Na and K in the first firing raw material is set to a molar ratio of 0.435 to 0.465 in terms of atoms. Further, the same applies to the ratio (K/(Na+K))

of the number of moles of K to the total number of moles of Na and K in the second firing raw material, which will be described below.

In the first step, alkali compounds and a niobium compound are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The second step is a step of firing the first firing raw material obtained by performing the first step, to obtain a first fired product.

In the second step, the firing temperature when firing the first firing raw material is 500 to 750° C., preferably 550 to 700° C. Further, in the second step, the firing time when firing the first firing raw material is appropriately selected, and is preferably 3 to 20 hours, particularly preferably 5 to 15 hours, and the firing atmosphere is an oxidizing atmosphere such as oxygen gas and air.

After the second step is performed to obtain the first fired product, the obtained first fired product may be ground, as required. For grinding the first fired product, grinding devices such as a jet mill, a ball mill, a bead mill, an ultimizer, an atomizer, a nanomizer, a pulverizer, and a pin mill can be used.

The third step is a step of dry-mixing alkali compounds with the first fired product obtained by performing the second step, to prepare a second firing raw material.

The alkali compounds according to the third step are the same as the alkali compounds according to the first step. The sodium compound used in the third step may be the same as the sodium compound used in the first step or may be different from the sodium compound used in the first step. Further, the potassium compound used in the third step may be the same as the potassium compound used in the first step or may be different from the potassium compound used in the first step. Further, the lithium compound used in the third step may be the same as the lithium compound used in the first step or may be different from the lithium compound used in the first step.

In the third step, the composition of the first fired product is analyzed to grasp the mol % of Nb, Li, Na, and K in the first fired product, and then the alkali compounds are mixed with the first fired product based on the obtained results of the compositional analysis, to obtain the second firing raw material having a ratio ((Li+Na+K)/Nb) of the total number of moles of alkali metal elements to the number of moles of Nb of 0.995 to 1.005, preferably 0.997 to 1.003, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.010. That is, in the third step, the amount of alkali metal elements in the second firing raw material is set to a molar ratio thereof to Nb of 1.000±0.005, so as to be almost equimolar to Nb. Further, in the third step, the ratio of the amounts of Na and K in the second firing raw material is made equivalent to the molar ratio of Na and K in the alkali niobate compound as a production object. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms.

Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the third step, the sodium compound, the potassium compound, and the first fired product, and further the lithium compound, if desired, are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The fourth step is a step of firing the second firing raw material obtained by performing the third step, to obtain an alkali niobate compound having a ratio (K/(Na+K)) of the number of moles of potassium to the total number of moles of sodium and potassium of 0.460 to 0.495, preferably 0.465 to 0.495, particularly preferably 0.470 to 0.490, in terms of atoms and a ratio ((Li+Na+K)/Nb) of the total number of moles of alkali metal elements to the number of moles of niobium of 0.995 to 1.005, preferably 0.997 to 1.003, in terms of atoms.

The ratio (Li/(Li+Na+K)) of the number of moles of lithium to the total number of moles of alkali metal elements in the alkali niobate compound obtained by performing the fourth step is preferably 0 or more and less than 0.10 in terms of atoms. When the molar ratio (Li/(Li+Na+K)) is 0, that is, when a sodium compound and a potassium compound are used as alkali compounds, the alkali niobate compound to be obtained is potassium sodium niobate. When the molar ratio (Li/(Li+Na+K)) is more than 0, that is, when a lithium compound, a sodium compound, and a potassium compound are used in combination as alkali compounds, the alkali niobate compound to be obtained is lithium potassium sodium niobate.

In the fourth step, the firing temperature when firing the second firing raw material is 500 to 1000° C., preferably 550 to 900° C. Further, in the fourth step, the firing time when firing the second firing raw material is appropriately selected, and is preferably 3 to 20 hours, particularly preferably 5 to 15 hours, and the firing atmosphere is an oxidizing atmosphere such as oxygen gas and air.

After the fourth step is performed to obtain the fired product, the obtained fired product may be ground, as required. For grinding the fired product, grinding devices such as a jet mill, a ball mill, a bead mill, an ultimizer, an atomizer, a nanomizer, a pulverizer, and a pin mill can be used.

The alkali niobate compound obtained by performing the fourth step may be further fired at preferably 500 to 1000° C., particularly preferably 700 to 900° C., for the purpose of enhancing the crystallinity. Further, the firing temperature at this time is appropriately selected, and is preferably 3 to 20 hours, particularly preferably 5 to 15 hours. The firing atmosphere is an oxidizing atmosphere such as oxygen gas and air.

The alkali niobate compound obtained through firing may be ground, as required. For grinding the alkali niobate compound, grinding devices such as a jet mill, a ball mill, a bead mill, an ultimizer, an atomizer, a nanomizer, a pulverizer, and a pin mill can be used.

Thus, alkali niobate compound particles having a ratio (K/(Na+K)) of the number of moles of potassium to the total number of moles of sodium and potassium of 0.460 to 0.495, preferably 0.465 to 0.495, particularly preferably 0.470 to 0.490, in terms of atoms and a ratio ((Li+Na+K)/Nb) of the total number of moles of alkali metal elements to the number of moles of niobium of 0.995 to 1.005, preferably 0.997 to 1.003, in terms of atoms can be obtained by the method for producing an alkali niobate compound according to the present invention.

Thus, the method for producing alkali niobate compound particles according to the present invention is performed to obtain alkali niobate compound particles having a ratio (K/(Na+K)) of the number of moles of potassium to the total number of moles of sodium and potassium of 0.460 to 0.495, preferably 0.465 to 0.495, particularly preferably 0.470 to 0.490, in terms of atoms and a ratio ((Li+Na+K)/Nb) of the total number of moles of alkali metal elements to the number of moles of niobium of 0.995 to 1.005, preferably 0.997 to 1.003, in terms of atoms, that is, the piezoelectric material filler of the present invention.

The alkali niobate compound particles according to the present invention thus obtained may be subjected to surface treatment in order to improve various properties such as water resistance, stability, and dispersibility, as long as their properties are not impaired. For the surface treatment, surface-treating agents such as silane, titanate, aluminate, and zirconate coupling agents, fatty acids, fatty acid esters, higher alcohols, and hardened oils can be used.

The surface treatment method is not particularly limited, and the surface treatment can be carried out using known methods. Examples of the surface treatment method include a wet method in which surface treatment is performed by dispersing the alkali niobate compound particles according to the present invention and a surface-treating agent in water or an organic solvent, followed by filtration and drying. Further, examples of the surface treatment method include a dry method in which surface treatment is performed by adding a surface-treating agent to the alkali niobate compound particles according to the present invention by spraying or dripping, during the step of treating the alkali niobate compound particles with mixing/grinding devices such as a Henschel mixer, a ball mill, and a jet mill, followed by drying, heating, or the like.

The piezoelectric material filler of the present invention is suitably used also as a production raw material for piezoelectric ceramics produced by sintering ceramic raw materials, and a filler for electret materials whose use as electrostatic induction conversion devices is proposed, other than the composite piezoelectric material of the present invention, which will be described below.

The composite piezoelectric material of the present invention comprises a polymer matrix; and a piezoelectric material filler dispersed in the polymer matrix, wherein the piezoelectric material filler comprises alkali niobate compound particles having a ratio (K/(Na+K)) of the number of moles of potassium to the total number of moles of sodium and potassium of 0.460 to 0.495 in terms of atoms and a ratio ((Li+Na+K)/Nb) of the total number of moles of alkali metal elements to the number of moles of niobium of 0.995 to 1.005 in terms of atoms.

The composite piezoelectric material of the present invention comprises a polymer matrix that serves as a base material in which a filler is contained and dispersed, and a piezoelectric material filler dispersed in the polymer matrix.

The polymer matrix according to the composite piezoelectric material of the present invention is a synthetic resin or rubber. Examples of the synthetic resin include thermosetting resins and thermoplastic resins. Examples of the thermosetting resins include epoxy resins such as bisphenol A and other epoxy resins, phenolic resins such as phenol formaldehyde resins, polyimide resins (PI), melamine resins, cyanate resins, bismaleimides, addition polymers of bismaleimides and diamines, polyfunctional cyanate ester resins, double-bond-added polyphenylene oxide resins, unsaturated polyester resins, polyvinyl benzyl ether resins, polybutadiene resins, and fumarate resins. Examples of the thermoplastic resins include acrylic resins such as polymethylmethacrylate, hydroxystyrene resins, phenolic resins such as novolak, polyester resins such as polyethylene terephthalate, polyimide resins (TPI), polylactic acid resins, nylon resins, polyetherimide resins, silicone resins, ABS resins, and fluororesins such as polyvinylidene fluoride. Examples of the rubber include natural rubbers, and synthetic rubbers such as isoprene rubber, butadiene rubber, styrene butadiene rubber, chloroprene rubber, nitrile rubber, ethylene propylene rubber, acrylic rubber, fluororubber, epichlorohydrin rubber, urethane rubber, and silicone rubber.

The piezoelectric material filler according to the composite piezoelectric material of the present invention comprises alkali niobate compound particles having a ratio (K/(Na+K)) of the number of moles of potassium to the total number of moles of sodium and potassium of 0.460 to 0.495, preferably 0.465 to 0.495, particularly preferably 0.470 to 0.490, in terms of atoms and a ratio ((Li+Na+K)/Nb) of the total number of moles of alkali metal elements to the number of moles of niobium of 0.995 to 1.005, preferably 0.997 to 1.003, in terms of atoms. That is, the piezoelectric material filler according to the composite piezoelectric material of the present invention is the piezoelectric material filler of the present invention. Accordingly, the piezoelectric material filler according to the composite piezoelectric material of the present invention is the same as the piezoelectric material filler of the present invention.

The piezoelectric material filler according to the composite piezoelectric material of the present invention essentially contains sodium and potassium as alkali compounds, and the composite piezoelectric material filler according to the composite piezoelectric material of the present invention may contain lithium for controlling the variation of piezoelectric properties. As the composition ratio of lithium in the composite piezoelectric material filler, the ratio (Li/(Li+Na+K)) of the number of moles of lithium to the total number of moles of alkali metal elements is 0 or more and less than 0.10, preferably 0 or more and less than 0.09, in terms of atoms, for achieving the aforementioned purposes.

In the composite piezoelectric material of the present invention, the content of the alkali niobate compound particles, that is, the content of the piezoelectric material filler of the present invention is 20 to 80 vol %, preferably 40 to 60 vol %, based on the entire composite piezoelectric material.

The composite piezoelectric material of the present invention may contain electrically conductive materials such as nickel particles, carbon black particles, and resin particles with their surfaces plated with nickel or gold, other than the piezoelectric material filler of the present invention, within a range in which sufficient insulating properties as a composite piezoelectric body are maintained. Further, curing agents, glass powder, coupling agents, polymer additives, reactivity diluents, polymerization inhibitors, leveling agents, wettability improvers, surfactants, plasticizers, ultraviolet absorbers, antioxidants, inorganic fillers, antifungal agents, moisture control agents, dye dissolving agents, buffers, chelating agents, flame retardants, silane coupling agents, and the like may be contained in a range that does not affect main electrical properties. Further, common solvents and the like may be used for adjusting the process suitability, as required. Examples of the solvents include alcohols such as toluene and ethanol, ketones such as methyl ethyl ketone, and cycloalkanes such as cyclohexane.

The form of the composite piezoelectric material of the present invention is not particularly limited, and examples thereof include various forms such as sheet, film, plate, porous, membrane, and fibrous forms, and laminated layers having an internal electrode structure. The form is appropriately selected therefrom corresponding to the usage of the composite piezoelectric material.

The method for producing the composite piezoelectric material of the present invention is not particularly limited. For example, in the case of producing the composite piezoelectric material of the present invention in the form of a sheet, a method for producing the composite piezoelectric material of the present invention in the form of a sheet by first mixing the piezoelectric material filler of the present invention and a curing accelerator into a thermosetting resin, followed by kneading and dispersion, to obtain a resin paste, then forming the obtained resin paste into a sheet on a substrate by printing or the like, and then heating the resin paste formed into a sheet together with the substrate for thermosetting can be mentioned. In addition, examples thereof include a method for producing the composite piezoelectric material of the present invention in a desired shape by mixing the piezoelectric material filler of the present invention into a thermoplastic resin for mixing and dispersion by heating and melting, followed by injection molding using a mold. In addition, examples thereof include a method for producing the composite piezoelectric material of the present invention in the form of a sheet by mixing the piezoelectric material filler of the present invention and a vulcanization accelerator into a rubber substrate, followed by kneading and dispersion, to obtain a rubber raw material mixture, then forming the obtained rubber raw material mixture into a sheet on a substrate, and then heating the rubber raw material mixture formed into a sheet together with the substrate for vulcanization. Electrodes are formed using an existing suitable technique such as printing, vapor deposition, or the like, in the sheet composite material obtained by such a method and, further appropriately polarization is performed using a corona discharge system or the like, and thereby a composite piezoelectric device can be obtained exceptionally conveniently.

The composite piezoelectric device of the present invention is the composite piezoelectric material of the present invention formed into a shape corresponding to the form of use, that is, a composite piezoelectric material comprising the piezoelectric material filler of the present invention and a polymer matrix, in which electrode formation and polarization are performed by suitable methods. That is, the composite piezoelectric device of the present invention is a composite piezoelectric device having the composite piezoelectric material of the present invention subjected to polarization operation by a suitable polarization method.

The composite piezoelectric device of the present invention can be suitably used for various sensors such as pressure sensors, pressure distribution sensors, gyro sensors, shock sensors, seat sensors, and wearable sensors; damping materials used in precision electronics, automobiles, and buildings; power generating devices using environmental vibration generated by human walking, driving of automobiles, or the like; ignition devices such as lighters and gas appliances; oscillation circuits used in receiving machines such as radios and televisions; various actuators used in driving devices of scanning probe microscopes or ultrasonic motors, and droplet discharge heads of inkjet printers; and medical materials relating to tissue reproduction.

In production of conventional alkali niobate compounds, when alkali compounds and a niobium compound are mixed and fired, the alkali compounds deliquesce, thereby making uniform mixing difficult, and therefore the molar ratio of alkali metals in the composite metal oxide obtained by firing deviates from a desired molar ratio, and precise adjustment of the molar ratio of alkali metals has been difficult.

Therefore, in the application research of the piezoelectric ceramics and piezoelectric particles of conventional alkali niobate compounds, attempts to achieve excellent piezoelectric properties have been made by mixing potassium niobate containing 100 mol % of potassium, sodium niobate containing 100 mol % of sodium, and lithium niobate containing 100 mol % of lithium, as alkali metals, while adjusting the blending ratio of each compound so that desired piezoelectric properties can be obtained, using potassium sodium niobate with a molar ratio of sodium and potassium of about 50 mol %:50 mol %, or further using the potassium sodium niobate and lithium niobate in combination. However, sufficient results could not have been obtained.

In contrast, in the method for producing alkali niobate compound particles according to the piezoelectric material filler of the present invention, after the molar ratio of Na and K is first adjusted to a desired molar ratio in the first step and the second step, and the ratio of the total number of moles of Li, Na, and K to the number of moles of Nb is set to 0.900 to 1.000, so that the total amount of Li, Na, and K is equivalent to or slightly smaller than that of Nb, followed by firing, to obtain a fired product, the molar ratio of Li, Na, K, and Nb is adjusted in the third step and the fourth step, to obtain a fired product. Therefore, the composition of the alkali niobate compound can be precisely adjusted.

Thereby, the influence on piezoelectric properties by the difference in the precise composition, which could not have been studied conventionally, can be grasped in the present invention. The inventors have found that, when the ratio of the number of moles of K to the total number of moles of Na and K in the alkali niobate compound is 0.460 to 0.495, preferably 0.465 to 0.495, particularly preferably 0.470 to 0.490, excellent piezoelectric properties as a piezoelectric material filler are exhibited.

Next, a second invention of the present invention will be described.

<Second Invention>

A composite piezoelectric material of a first embodiment of the present invention (which will be hereinafter referred to also as the composite piezoelectric material (1) of the present invention) comprises: a polymer matrix; and a composite piezoelectric material filler dispersed in the polymer matrix, wherein the composite piezoelectric material filler comprises: a small-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms; and a large-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, the total content of the small-particle size filler and the large-particle size filler is 20 to 80 vol % based on the entire composite piezoelectric material, the small-particle size filler has an average particle size (D50) of 0.1 to 1.2 μm, the large-particle size filler has an average particle size (D50) of 1 to 15 μm, and the content ratio (large-particle size filler: small-particle size filler) of the large-particle size filler to the small-particle size filler is 10:90 to 90:10 by volume.

The composite piezoelectric material (1) of the present invention comprises a polymer matrix that serves as a base material in which a filler is contained and dispersed, and a composite piezoelectric material filler dispersed in the polymer matrix.

The polymer matrix according to the composite piezoelectric material (1) of the present invention is a synthetic resin or rubber. Examples of the synthetic resin include thermosetting resins and thermoplastic resins. Examples of the thermosetting resins include epoxy resins such as bisphenol A and other epoxy resins, phenolic resins such as phenol formaldehyde resins, polyimide resins (PI), melamine resins, cyanate resins, bismaleimides, addition polymers of bismaleimides and diamines, polyfunctional cyanate ester resins, double-bond-added polyphenylene oxide resins, unsaturated polyester resins, polyvinyl benzyl ether resins, polybutadiene resins, and fumarate resins. Examples of the thermoplastic resins include acrylic resins such as polymethylmethacrylate, hydroxystyrene resins, phenolic resins such as novolak, polyester resins such as polyethylene terephthalate, polyimide resins (TPI), polylactic acid resins, nylon resins, polyetherimide resins, silicone resins, ABS resins, and fluororesins such as polyvinylidene fluoride. Examples of the rubber include natural rubbers, and synthetic rubbers such as isoprene rubber, butadiene rubber, styrene butadiene rubber, chloroprene rubber, nitrile rubber, ethylene propylene rubber, acrylic rubber, fluororubber, epichlorohydrin rubber, urethane rubber, and silicon rubber.

The composite piezoelectric material (1) of the present invention comprises a small-particle size filler and a large-particle size filler as a composite piezoelectric material filler.

The small-particle size filler and the large-particle size filler according to the composite piezoelectric material (1) of the present invention are both particles of alkali niobate compounds. In the small-particle size filler and the large-particle size filler according to the composite piezoelectric material (1) of the present invention, the ratio (K/(Na+K)) of the number of moles of potassium to the total number of moles of sodium and potassium is 0.40 to 0.60, preferably 0.45 to 0.55, in terms of atoms. The ratio (K/(Na+K)) of the number of moles of potassium to the total number of moles of sodium and potassium falling within the aforementioned ranges enhances the piezoelectric properties of the composite piezoelectric body. Further, in the small-particle size filler and the large-particle size filler according to the composite piezoelectric material (1) of the present invention, the ratio ((Li+Na+K)/Nb) of the total number of moles of alkali metal elements to the number of moles of niobium is 0.995 to 1.005, preferably 0.997 to 1.003, in terms of atoms. The small-particle size filler and the large-particle size filler may have completely the same composition while satisfying the aforementioned compositions, or the composition of the small-particle size filler and the composition of the large-particle size filler may be different from each other within the range satisfying the aforementioned compositions.

The small-particle size filler and the large-particle size filler according to the composite piezoelectric material (1) of the present invention essentially contain sodium and potassium as alkali compounds and may contain lithium for purposes such as improving the sinterability and controlling the variation of piezoelectric properties. In the composition ratio of lithium in each of the small-particle size filler and the large-particle size filler, the ratio (Li/(Li+Na+K)) of the number of moles of lithium to the total number of moles of alkali metal elements is 0 or more and less than 0.10, preferably 0 or more and less than 0.09, in terms of atoms, in order not to impair the piezoelectric properties while achieving the aforementioned purposes.

The alkali niobate compounds constituting the small-particle size filler and the large-particle size filler according to the composite piezoelectric material (1) of the present invention are perovskite alkali niobate compounds represented by the following general formula (1):

$$ANbO_3 \qquad (1).$$

In the alkali niobate compounds represented by the general formula (1), A essentially contains sodium and potassium and may contain lithium, the ratio (K/(Na+K)) of the number of moles of potassium to the total number of moles of sodium and potassium is 0.40 to 0.60, preferably 0.45 to 0.55, in terms of atoms, and the ratio ((Li+Na+K)/Nb) of the total number of moles of alkali metal elements to the number of moles of niobium is 0.995 to 1.005, preferably 0.997 to 1.003, in terms of atoms.

The average particle size (D50) of the small-particle size filler is 0.1 to 1.2 μm, preferably 0.2 to 1.1 μm. Further, the average particle size (D50) of the large-particle size filler is 1 to 15 μm, preferably 2 to 12 μm. The average particle sizes of the small-particle size filler and the large-particle size filler falling within the aforementioned ranges enhances the piezoelectric properties of the composite piezoelectric material. In the present invention, the average particle size is a cumulative particle size at 50% (D50) determined in a volume frequency particle size distribution measurement measured by laser light scattering using MT-3300EXII, manufactured by MicrotracBEL Corp.

The SPAN ((D90−D10)/D50) of the small-particle size filler is preferably 0.2 to 2, particularly preferably 0.3 to 1.5. Further, the SPAN ((D90−D10)/D50) of the large-particle size filler is preferably 0.3 to 3, particularly preferably 0.4 to 2. The SPAN of the small-particle size filler and the SPAN of the large-particle size filler falling within the aforementioned ranges enhances the piezoelectric properties of the composite piezoelectric material. In the present invention, D10, D50, and D90 are cumulative particle sizes at 10%, 50%, and 90% determined in a volume frequency particle size distribution measurement measured by laser light scattering using MT-3300EXII, manufactured by MicrotracBEL Corp.

The average particle size (D50) of the small-particle size filler is smaller than the average particle size (D50) of the large-particle size filler, and the ratio (large-particle size filler/small-particle size filler) of the average particle size (D50) of the large-particle size filler to the average particle size (D50) of the small-particle size filler is preferably 2 to 150, particularly preferably 3 to 30. The ratio of the average particle size (D50) of the large-particle size filler to the average particle size (D50) of the small-particle size filler falling within the aforementioned ranges enhances the piezoelectric properties of the composite piezoelectric material.

The BET specific surface area of the small-particle size filler is preferably 2 to 15 $m^2/g$, particularly preferably 2.5 to 10 $m^2/g$. Further, the BET specific surface area of the large-particle size filler is preferably 0.1 to 3 $m^2/g$, particularly preferably 0.2 to 2 $m^2/g$.

In the composite piezoelectric material (1) of the present invention, the total content of the small-particle size filler comprising alkali niobate compound particles and the large-particle size filler comprising an alkali niobate compound is 20 to 80 vol %, preferably 40 to 60 vol %, based on the entire composite piezoelectric material.

In the composite piezoelectric material (1) of the present invention, the content ratio (large-particle size filler:small-particle size filler) of the large-particle size filler to the small-particle size filler is 10:90 to 90:10, preferably 20:80 to 80:20, by volume.

The composite piezoelectric material (1) of the present invention has improved compositeness with resins and, furthermore enhanced piezoelectric properties, as compared with fillers not combining a small-particle size filler and a large-particle size filler, by containing a small-particle size filler having a predetermined average particle size and a large-particle size filler having a predetermined average particle size at predetermined volume fractions to combine the small-particle size filler and the large-particle size filler.

The small-particle size filler and the large-particle size filler according to the composite piezoelectric material of the present invention are suitably produced by the method for producing an alkali niobate compound according to the present invention shown below.

The method for producing an alkali niobate compound according to the present invention is a method for producing an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, the method comprising: a first step of dry-mixing alkali compounds and a niobium compound in an amount giving a ratio ((Li+Na+K)/Nb) of the number of moles of alkali metal elements to the number of moles of Nb of 0.900 to 1.000 in terms of atoms and a difference of a ratio (K/(Na+K)) of the number of moles of K to the total number of moles of Na and K from the ratio of the number of moles of K to the total number of moles of Na and K in the alkali niobate compound as a production object falling within ±0.015, to prepare a first firing raw material; a second step of firing the first firing raw material at 500 to 750° C., to obtain a first fired product; a third step of dry-mixing alkali compounds with the first fired product in an amount giving a ratio ((Li+Na+K)/Nb) of the total number of moles of alkali metal elements to the number of moles of Nb of 0.995 to 1.005 in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.010, to prepare a second firing raw material; and a fourth step of firing the second firing raw material at 500 to 1000° C., to obtain the alkali niobate compound.

The first step is a step of dry-mixing alkali compounds and a niobium compound, to prepare a first firing raw material. The alkali compounds according to the first step essentially contain both a sodium compound and a potassium compound and may contain a lithium compound.

The sodium compound according to the first step is a compound having a sodium atom, and examples thereof include sodium carbonate, sodium hydrogencarbonate, sodium hydroxide, sodium oxalate, and sodium tartrate. The sodium compound may be of one type or a combination of two or more types. As the sodium compound, sodium carbonate ($Na_2CO_3$) is preferable for good handleability and good reactivity. Further, a higher purity of the sodium compound is preferable.

The average particle size (D50) of the sodium compound according to the first step is not particularly limited, and is preferably 1000 μm or less, particularly preferably 10 to 100 μm. The average particle size (D50) of the sodium compound falling within the aforementioned ranges increases the mixability with other raw materials and facilitates the adjustment of the composition, thereby enabling effective reaction in firing, which will be described below. Further, the BET specific surface area of the sodium compound according to the first step is not particularly limited, and is preferably 0.01 to 5 $m^2/g$, particularly preferably 0.1 to 3 $m^2/g$. The BET specific surface area of the sodium compound falling within the aforementioned ranges increases the mixability with other raw materials and facilitates the adjustment of the composition, thereby enabling effective reaction in firing, which will be described below.

The potassium compound according to the first step is a compound having a potassium atom, and examples thereof include potassium carbonate, potassium hydrogencarbonate, potassium hydroxide, potassium oxalate, and potassium tartrate. The potassium compound may be of one type or a combination of two or more types. As the potassium compound, potassium carbonate ($K_2CO_3$) is preferable for good handleability and good reactivity throughout blending to firing. Further, a higher purity of the potassium compound is preferable.

The average particle size (D50) of the potassium compound according to the first step is not particularly limited, and is preferably 1000 μm or less, particularly preferably 10 to 100 μm. The average particle size (D50) of the potassium compound falling within the aforementioned ranges increases the mixability with other raw materials and facilitates the adjustment of the composition, thereby enabling effective reaction in firing, which will be described below. Further, the BET specific surface area of the potassium compound according to the first step is not particularly limited, and is preferably 0.01 to 5 $m^2/g$, particularly preferably 0.1 to 3 $m^2/g$. The BET specific surface area of the potassium compound falling within the aforementioned ranges increases the mixability with other raw materials and facilitates the adjustment of the composition, thereby enabling effective reaction in firing, which will be described below.

The lithium compound according to the first step is a compound having a lithium atom, and examples thereof include lithium carbonate, sodium hydrogencarbonate, lithium hydroxide, lithium oxalate, and lithium tartrate. The lithium compound may be of one type or a combination of two or more types. As the lithium compound, lithium carbonate ($Li_2CO_3$) is preferable for good handleability and good reactivity. Further, a higher purity of the lithium compound is preferable.

The average particle size (D50) of the lithium compound according to the first step is not particularly limited, and is preferably 1000 μm or less, particularly preferably 10 to 100 μm. The average particle size (D50) of the lithium compound falling within the aforementioned ranges increases the mixability with other raw materials and facilitates the adjustment of the composition, thereby enabling effective reaction in firing, which will be described below. Further, the BET specific surface area of the lithium compound according to the first step is not particularly limited, and is preferably 0.01 to 5 $m^2/g$, particularly preferably 0.1 to 3 $m^2/g$. The BET specific surface area of the lithium compound falling within the aforementioned ranges increases the mixability with other raw materials and facilitates the adjustment of the composition, thereby enabling effective reaction in firing, which will be described below.

The niobium compound according to the first step is a compound having a niobium atom, and examples thereof include niobium pentoxide, niobium hydroxide, and ammonium niobium oxalate. The niobium compound may be of one type or a combination of two or more types. As the niobium compound, niobium pentoxide ($Nb_2O_5$) is preferable for easy handleability and good precision composition control. Further, a higher purity of the niobium compound is preferable.

The average particle size (D50) of the niobium compound according to the first step is not particularly limited, and is preferably 0.1 to 15 μm, particularly preferably 0.2 to 12 μm. The average particle size (D50) of the niobium compound falling within the aforementioned ranges increases the mixability with other raw materials and facilitates the adjustment of the composition, thereby enabling effective reaction in firing, which will be described below. Further, the BET specific surface area of the niobium compound according to the first step is not particularly limited, and is preferably 0.1 to 15 m²/g, particularly preferably 0.2 to 10 m²/g. The BET specific surface area of the niobium compound falling within the aforementioned ranges enables production of an alkali niobate compound having excellent dispersibility and good crystallinity even in the dry method. The average particle size in the present invention is a cumulative particle size at 50% (D50) determined in a volume frequency particle size distribution measurement measured by laser light scattering using MT3300EXII, manufactured by MicrotracBEL Corp.

In the first step, the first firing raw material is obtained by dry-mixing the alkali compounds and the niobium compound in an amount giving a ratio ((Li+Na+K)/Nb) of the total number of moles of alkali metal elements to the number of moles of Nb of 0.900 to 1.000, preferably 0.920 to 0.995, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.015. That is, in the first step, the amount of the alkali metal elements in the first firing raw material is made equimolar to Nb or slightly less than the equimolar amount to Nb. Further, in the first step, the ratio of the amounts of Na and K in the first firing raw material is made equivalent to the molar ratio of Na and K in the alkali niobate compound as a production object. The alkali niobate compound as a production object is an alkali niobate compound that is intended to be obtained by performing the method for producing an alkali niobate compound according to the present invention. When the alkali niobate compound as a production object is an alkali niobate compound containing lithium, a lithium compound as an alkali compound may be mixed or not mixed to the first firing raw material in the first step, as long as the ratio ((Li+Na+K)/Nb) of the total number of moles of alkali metal elements to the number of moles of Nb is 0.900 to 1.000, preferably 0.920 to 0.995, in terms of atoms. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms.

Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the present invention, the phrase, the difference of the ratio (K/(Na+K)) of the number of moles of K to the total number of moles of Na and K in the first firing raw material from the ratio (K/(Na+K)) of the number of moles of K to the total number of moles of Na and K in the alkali niobate compound as a production object falls within ±0.015, means that, when the ratio (K/(Na+K)) of the number of moles of K to the total number of moles of Na and K in the first firing raw material in terms of atoms is referred to as Y, and the ratio (K/(Na+K)) of the number of moles of K to the total number of moles of Na and K in the alkali niobate compound as a production object is referred to as Z, the value "Y−Z" falls within ±0.015. For example, when producing an alkali niobate compound having a ratio (K/(Na+K)) of the number of moles of K to the total number of moles of Na and K of 0.45, the ratio (K/(Na+K)) of the number of moles of K to the total number of moles of Na and K in the first firing raw material is set to a molar ratio of 0.435 to 0.465 in terms of atoms. Further, the same applies to the ratio (K/(Na+K)) of the number of moles of K to the total number of moles of Na and K in the second firing raw material, which will be described below.

In the first step, alkali compounds and a niobium compound are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The second step is a step of firing the first firing raw material obtained by performing the first step, to obtain a first fired product.

In the second step, the firing temperature when firing the first firing raw material is 500 to 750° C., preferably 550 to 700° C. Further, in the second step, the firing time when firing the first firing raw material is appropriately selected, and is preferably 3 to 20 hours, particularly preferably 5 to 15 hours, and the firing atmosphere is an oxidizing atmosphere such as oxygen gas and air.

After the second step is performed to obtain the first fired product, the obtained first fired product may be ground, as required. For grinding the first fired product, grinding devices such as a jet mill, a ball mill, a bead mill, an ultimizer, an atomizer, a nanomizer, a pulverizer, and a pin mill can be used.

The third step is a step of dry-mixing alkali compounds with the first fired product obtained by performing the second step, to prepare a second firing raw material.

The alkali compounds according to the third step are the same as the alkali compounds according to the first step. The sodium compound used in the third step may be the same as the sodium compound used in the first step or may be different from the sodium compound used in the first step. Further, the potassium compound used in the third step may be the same as the potassium compound used in the first step or may be different from the potassium compound used in the first step. Further, the lithium compound used in the third step may be the same as the lithium compound used in the first step or may be different from the lithium compound used in the first step.

In the third step, the composition of the first fired product is analyzed to grasp the mol % of Nb, Li, Na, and K in the first fired product, and then the alkali compounds are mixed with the first fired product based on the obtained results of the compositional analysis, to obtain the second firing raw material having a ratio ((Li+Na+K)/Nb) of the total number of moles of alkali metal elements to the number of moles of Nb of 0.995 to 1.005, preferably 0.997 to 1.003, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.010. That is, in the third step, the amount of alkali metal elements in the second firing raw material is set to a molar ratio thereof to Nb of 1.000±0.005, so as to be almost equimolar to Nb. Further, in the third step, the ratio of the amounts of Na and K in the second firing raw material is made equivalent to the molar ratio of Na and K in the alkali niobate compound as a production object. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms. Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the third step, the sodium compound, the potassium compound, and the first fired product, and further the lithium compound, if desired, are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The fourth step is a step of firing the second firing raw material obtained by performing the third step, to obtain an alkali niobate compound having a ratio (K/(Na+K)) of the number of moles of potassium to the total number of moles of sodium and potassium of 0.40 to 0.60, preferably 0.45 to 0.55, in terms of atoms and a ratio ((Li+Na+K)/Nb) of the total number of moles of alkali metal elements to the number of moles of niobium of 0.995 to 1.005, preferably 0.997 to 1.003, in terms of atoms.

In the alkali niobate compound obtained by performing the fourth step, the ratio (Li/(Li+Na+K)) of the number of moles of lithium to the total number of moles of alkali metal elements is preferably 0 or more and less than 0.10 in terms of atoms. When the molar ratio (Li/(Li+Na+K)) is 0, that is, when a sodium compound and a potassium compound are used as alkali compounds, the alkali niobate compound to be obtained is potassium sodium niobate. When the molar ratio (Li/(Li+Na+K)) is more than 0, that is, when a lithium compound, a sodium compound, and a potassium compound are used in combination as alkali compounds, the alkali niobate compound to be obtained is lithium potassium sodium niobate.

In the fourth step, the firing temperature when firing the second firing raw material is 500 to 1000° C., preferably 550 to 900° C. Further, in the fourth step, the firing time when firing the second firing raw material is appropriately selected, and is preferably 3 to 20 hours, particularly preferably 5 to 15 hours, and the firing atmosphere is an oxidizing atmosphere such as oxygen gas and air.

After the fourth step is performed to obtain the fired product, the obtained fired product may be ground, as required. For grinding the fired product, grinding devices such as a jet mill, a ball mill, a bead mill, an ultimizer, an atomizer, a nanomizer, a pulverizer, and a pin mill can be used.

The alkali niobate compound obtained by performing the fourth step may be further fired at preferably 500 to 1000° C., particularly preferably 700 to 900° C., for the purpose of enhancing the crystallinity. Further, the firing temperature at this time is appropriately selected, and is preferably 3 to 20 hours, particularly preferably 5 to 15 hours. The firing atmosphere is an oxidizing atmosphere such as oxygen gas and air.

The alkali niobate compound obtained after firing may be ground, as required. For grinding the alkali niobate compound, grinding devices such as a jet mill, a ball mill, a bead mill, an ultimizer, an atomizer, a nanomizer, a pulverizer, and a pin mill can be used.

Thus, alkali niobate compound particles having a ratio (K/(Na+K)) of the number of moles of potassium to the total number of moles of sodium and potassium of 0.40 to 0.60, preferably 0.45 to 0.55, in terms of atoms and a ratio ((Li+Na+K)/Nb) of the total number of moles of alkali metal elements to the number of moles of niobium of 0.995 to 1.005, preferably 0.997 to 1.003, in terms of atoms can be obtained by the method for producing an alkali niobate compound according to the present invention. The particle sizes of niobium compounds serving as raw materials are appropriately managed by preliminary adjustment such as grinding and classification, so that alkali niobate compound particles for the small-particle size filler and alkali niobate compound particles for the large-particle size filler are produced separately. That is, in the method for producing alkali niobate compound particles according to the present invention, alkali niobate compound particles for the small-particle size filler and alkali niobate compound particles for the large-particle size filler can be produced separately, for example, by performing an operation such as grinding or classification after the second step is performed, so that the particle sizes of the fired product are adjusted to the particle size range of the small-particle size filler or the particle size range of the large-particle size filler, performing an operation such as grinding or classification after the fourth step is performed, so that the particle sizes of the fired product are adjusted to the particle size range of the small-particle size filler or the particle size range of the large-particle size filler, or adjusting the firing time in the second step or the firing time in the fourth step.

The alkali niobate compound particles according to the present invention thus obtained may be subjected to surface treatment in order to improve various properties such as water resistance, stability, and dispersibility, as long as their properties are not impaired. For the surface treatment, surface-treating agents such as silane, titanate, aluminate, and zirconate coupling agents, fatty acids, fatty acid esters, higher alcohols, and hardened oils can be used.

The surface treatment method is not particularly limited, and the surface treatment can be carried out using known methods. Examples of the surface treatment method include a wet method in which surface treatment is performed by dispersing the alkali niobate compound particles according to the present invention and a surface-treating agent in water or an organic solvent, followed by filtration and drying.

Further, examples of the surface treatment method include a dry method in which surface treatment is performed by adding a surface-treating agent to the alkali niobate compound particles according to the present invention by spraying or dripping, while the alkali niobate compound particles are being processed with mixing/grinding devices such as a Henschel mixer, a ball mill, and a jet mill, followed by drying, heating, or the like.

The composite piezoelectric material (1) of the present invention may contain electrically conductive materials such as nickel particles, carbon black particles, and resin particles with their surfaces plated with nickel or gold, other than the small-particle size filler and the large-particle size filler according to the composite piezoelectric material (1) of the present invention, within a range in which sufficient insulating properties as a composite piezoelectric body are maintained. Further, curing agents, glass powder, coupling agents, polymer additives, reactivity diluents, polymerization inhibitors, leveling agents, wettability improvers, surfactants, plasticizers, ultraviolet absorbers, antioxidants, inorganic fillers, antifungal agents, moisture control agents, dye dissolving agents, buffers, chelating agents, flame retardants, silane coupling agents, and the like may be contained in a range that does not affect main electrical properties. Further, common solvents and the like may be used for adjusting the process suitability, as required. Examples of the solvents include alcohols such as toluene and ethanol, ketones such as methyl ethyl ketone, and cycloalkanes such as cyclohexane.

A composite piezoelectric material of a second embodiment of the present invention (which will be hereinafter referred to also as the composite piezoelectric material (2) of the present invention) comprises: a polymer matrix; and a composite piezoelectric material filler dispersed in the polymer matrix, wherein the composite piezoelectric material filler comprises an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, the content of the alkali niobate compound is 20 to 80 vol % based on the entire composite piezoelectric material, and the alkali niobate compound exhibits a bimodal particle size distribution including a first peak having a peak top in a particle size range of 0.1 to 1.0 μm and a second peak having a peak top in a particle size range of 1 to 15 μm in a particle size distribution measurement, wherein a ratio (B/A) of a value (B) of a frequency (%) of the particle size at the peak top of the second peak to a value (A) of a frequency (%) of the particle size at the peak top of the first peak is 0.1 to 20.

The composite piezoelectric material (2) of the present invention comprises a polymer matrix that serves as a base material in which a filler is contained and dispersed, and a composite piezoelectric material filler dispersed in the polymer matrix.

The polymer matrix according to the composite piezoelectric material (2) of the present invention is a synthetic resin or rubber. The polymer matrix according to the composite piezoelectric material (2) of the present invention is the same as the polymer matrix according to the composite piezoelectric material (1) of the present invention.

The composite piezoelectric material filler according to the composite piezoelectric material (2) of the present invention is particles of an alkali niobate compound. The composite piezoelectric material filler according to the composite piezoelectric material (2) of the present invention is the same as in the method for producing the small-particle size filler and the large-particle size filler according to the composite piezoelectric material (1) of the present invention. That is, the composite piezoelectric material filler according to the composite piezoelectric material (2) of the present invention is suitably produced by the method for producing an alkali niobate compound according to the present invention.

In the composite piezoelectric material filler according to the composite piezoelectric material (2) of the present invention, the ratio (K/(Na+K)) of the number of moles of potassium to the total number of moles of sodium and potassium is 0.40 to 0.60, preferably 0.45 to 0.55, in terms of atoms. The ratio (K/(Na+K)) of the number of moles of potassium to the number of moles of sodium and potassium falling within the aforementioned ranges enhances the piezoelectric properties of the composite piezoelectric material. Further, in the composite piezoelectric material filler according to the composite piezoelectric material (2) of the present invention, the ratio ((Li+Na+K)/Nb) of the total number of moles of alkali metal elements to the number of moles of niobium is 0.995 to 1.005, preferably 0.997 to 1.003, in terms of atoms.

The composite piezoelectric material filler according to the composite piezoelectric material (2) of the present invention essentially contains sodium and potassium as alkali compounds, and the composite piezoelectric material filler according to the composite piezoelectric material (2) of the present invention may contain lithium for purposes such as improving the sinterability and controlling the variation of piezoelectric properties. In the composition ratio of lithium in the alkali niobate compound particles, the ratio (Li/(Li+Na+K)) of the number of moles of lithium to the total number of moles of alkali metal elements is 0 or more and less than 0.10, preferably 0 or more and less than 0.09, in terms of atoms, in order not to impair the piezoelectric properties while achieving the aforementioned purposes.

The alkali niobate compound constituting the composite piezoelectric material filler according to the composite piezoelectric material (2) of the present invention is a perovskite alkali niobate compound represented by the following general formula (1):

$$ANbO_3 \qquad (1).$$

In the alkali niobate compound represented by the general formula (1), A essentially contains sodium and potassium and may contain lithium, the ratio (K/(Na+K)) of the number of moles of potassium to the total number of moles of sodium and potassium is 0.40 to 0.60, preferably 0.45 to 0.55, in terms of atoms, and the ratio ((Li+Na+K)/Nb) of the total number of moles of alkali metal elements to the number of moles of niobium is 0.995 to 1.005, preferably 0.997 to 1.003, in terms of atoms.

The alkali niobate compound in the composite piezoelectric material (2) of the present invention exhibits a bimodal particle size distribution including a first peak having a peak top in a particle size range of 0.1 to 1.2 μm, preferably 0.2 to 1.1 μm and a second peak having a peak top in a particle size range of 1 to 15 μm, preferably 2 to 12 μm, in a particle size distribution measurement. In the present invention, the particle size distribution measurement is a volume frequency particle size distribution measurement measured by laser light scattering using MT-3300EXII, manufactured by MicrotracBEL Corp., and the first peak and the second peak indicate peaks in a particle size distribution chart obtained by such a volume particle size distribution measurement.

The ratio (B/A) of the value (B) of the frequency (%) of the particle size at the peak top of the second peak to the value (A) of the frequency (%) of the particle size at the peak top of the first peak is 0.1 to 20, preferably 0.2 to 18, particularly preferably 0.3 to 15, in the particle size distribution measurement of the alkali niobate compound in the composite piezoelectric material (2) of the present invention. The value B/A in the particle size distribution measurement of the alkali niobate compound in the composite piezoelectric material (2) of the present invention falling within the aforementioned ranges improves the dispersibility of the alkali niobate compound in the polymer matrix and, further enhances the piezoelectric properties of the composite piezoelectric material to be obtained.

In the particle size distribution measurement of the alkali niobate compound in the composite piezoelectric material (2) of the present invention, the particle size at the peak top of the first peak is smaller than the particle size at the peak top of the second peak, and a ratio (the particle size at the peak top of the second peak/the particle size at the peak top of the first peak) of the particle size at the peak top of the second peak to the particle size at the peak top of the first peak is preferably 2 to 150, particularly preferably 3 to 30. The ratio (the particle size at the peak top of the second peak/the particle size at the peak top of the first peak) of the particle size at the peak top of the second peak to the particle size at the peak top of the first peak falling within the aforementioned ranges enhances the piezoelectric properties of the composite piezoelectric material.

In the composite piezoelectric material (2) of the present invention, the content of the alkali niobate compound is 20 to 80 vol %, preferably 40 to 60 vol %, based on the entire composite piezoelectric material.

The composite piezoelectric material (2) of the present invention has enhanced piezoelectric properties by containing particles of the bimodal alkali niobate compound having a predetermined size distribution.

The forms of the composite piezoelectric material (1) of the present invention and the composite piezoelectric material (2) of the present invention are not particularly limited, and examples thereof include various forms such as sheet, film, plate, porous, membrane, and fibrous forms, and laminated layers having an internal electrode structure. The forms are appropriately selected therefrom corresponding to the usage of the composite piezoelectric material.

The method for producing the composite piezoelectric material (1) of the present invention or the composite piezoelectric material (2) of the present invention is not particularly limited. For example, in the case of producing the composite piezoelectric material (1) of the present invention or the composite piezoelectric material (2) of the present invention in the form of a sheet, a method for producing the composite piezoelectric material (1) of the present invention or the composite piezoelectric material (2) of the present invention in the form of a sheet by first mixing the composite piezoelectric material filler according to the composite piezoelectric material of the present invention and a curing accelerator into a thermosetting resin, followed by kneading and dispersion, to obtain a resin paste, then forming the obtained resin paste into a sheet on a substrate by printing or the like, and then heating the resin paste formed into a sheet together with the substrate for thermosetting can be mentioned. In addition, examples thereof include a method for producing the composite piezoelectric material (1) of the present invention or the composite piezoelectric material (2) of the present invention in a desired shape by mixing the composite piezoelectric material filler according to the composite piezoelectric material of the present invention into a thermoplastic resin for mixing and dispersion by heating and melting, followed by injection molding using a mold. In addition, examples thereof include a method for producing the composite piezoelectric material (1) of the present invention or the composite piezoelectric material (2) of the present invention in the form of a sheet by mixing the composite piezoelectric material filler according to the composite piezoelectric material of the present invention and a vulcanization accelerator into a rubber substrate, followed by kneading and dispersion, to obtain a rubber raw material mixture, then forming the obtained rubber raw material mixture into a sheet on a substrate, and then heating the rubber raw material mixture formed into a sheet together with the substrate for vulcanization. Electrodes are formed using an existing suitable technique such as printing, vapor deposition, or the like, in the sheet composite material obtained by such a method and, further appropriately polarization is performed using a corona discharge system or the like, and thereby a composite piezoelectric device can be obtained exceptionally conveniently.

The composite piezoelectric device of the present invention is the composite piezoelectric material (1) of the present invention formed into a shape corresponding to the form of use, that is, a composite piezoelectric material comprising the composite piezoelectric material filler of the first embodiment of the present invention described below and a polymer matrix, or the composite piezoelectric material (2) of the present invention formed into a shape corresponding to the form of use, that is, a composite piezoelectric material comprising the composite piezoelectric material filler of the second embodiment of the present invention described below and a polymer matrix, in which electrode formation and polarization are performed by suitable methods. That is, the composite piezoelectric device of the present invention is a composite piezoelectric device having the composite piezoelectric material (1) of the present invention subjected to polarization operation or the composite piezoelectric material (2) of the present invention subjected to polarization operation.

The composite piezoelectric device of the present invention can be suitably used for various sensors such as pressure sensors, pressure distribution sensors, gyro sensors, shock sensors, seat sensors, and wearable sensors; damping materials used in precision electronics, automobiles, and buildings; power generating devices using environmental vibration generated by human walking, driving of automobiles, or the like; ignition devices such as lighters and gas appliances; oscillation circuits used in receiving machines such as radios and televisions; various actuators used in driving devices of scanning probe microscopes or ultrasonic motors, and droplet discharge heads of inkjet printers; and medical materials relating to tissue reproduction.

The composite piezoelectric material filler of the first embodiment of the present invention (which will be hereinafter referred to also as the composite piezoelectric material filler (1) of the present invention) is a mixture of a small-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms and a large-particle size filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein the small-particle size filler has an average particle size (D50) of 0.1 to 1.2 μm, the large-particle size filler has an average particle size (D50) of 1 to 15 μm, and a mixing ratio (large-particle size filler:small-particle size filler) of the large-particle size filler to the small-particle size filler is 10:90 to 90:10 by volume.

The composite piezoelectric material filler (1) of the present invention is a filler for a composite piezoelectric material used for producing a composite piezoelectric material comprising a polymer matrix and a filler by being contained and dispersed in the polymer matrix.

The composite piezoelectric material filler (1) of the present invention is a mixture of a small-particle size filler and a large-particle size filler.

The small-particle size filler and the large-particle size filler according to the composite piezoelectric material filler (1) of the present invention are the same as the small-particle size filler and the large-particle size filler according to the composite piezoelectric material (1) of the present invention. That is, the small-particle size filler and the large-particle size filler according to the composite piezoelectric material filler (1) of the present invention are both particles of alkali niobate compounds. In the small-particle size filler and the large-particle size filler according to the composite piezoelectric material filler (1) of the present invention, the ratio (K/(Na+K)) of the number of moles of potassium to the total number of moles of sodium and potassium is 0.40 to 0.60, preferably 0.45 to 0.55, in terms of atoms. The ratio (K/(Na+K)) of the number of moles of potassium to the number of moles of sodium and potassium falling within the aforementioned ranges enhances the piezoelectric properties of the composite piezoelectric material. Further, in the small-particle size filler and the large-particle size filler according to the composite piezoelectric material filler (1) of the present invention, the ratio ((Li+Na+K)/Nb) of the total number of moles of alkali metal elements to the number of moles of niobium is 0.995 to 1.005, preferably 0.997 to 1.003, in terms of atoms. The small-particle size filler and the large-particle size filler may have completely the same composition while satisfying the aforementioned compositions, or the composition of the small-particle size filler and the composition of the large-particle size filler may be different from each other within the range satisfying the aforementioned compositions.

The small-particle size filler and the large-particle size filler according to the composite piezoelectric material filler (1) of the present invention essentially contain sodium and potassium as alkali compounds, but the small-particle size filler and the large-particle size filler according to the composite piezoelectric material filler (1) of the present invention may contain lithium, for purposes such as improving the sinterability and controlling the variation of piezoelectric properties. In the composition ratio of lithium in the small-particle size filler and the large-particle size filler, the ratio (Li/(Li+Na+K)) of the number of moles of lithium to the total number of moles of alkali metal elements is 0 or more and less than 0.10, preferably 0 or more and less than 0.09, in terms of atoms, in order not to impair the piezoelectric properties while achieving the aforementioned purposes.

The alkali niobate compounds constituting the small-particle size filler and the large-particle size filler according to the composite piezoelectric material filler (1) of the present invention are perovskite alkali niobate compounds represented by the following general formula (1):

$$ANbO_3 \qquad (1).$$

In the alkali niobate compounds represented by the general formula (1), A essentially contains sodium and potassium and may contain lithium, the ratio (K/(Na+K)) of the number of moles of potassium to the total number of moles of sodium and potassium is 0.40 to 0.60, preferably 0.45 to 0.55, in terms of atoms, and the ratio ((Li+Na+K)/Nb) of the total number of moles of alkali metal elements to the number of moles of niobium is 0.995 to 1.005, preferably 0.997 to 1.003, in terms of atoms.

The average particle size (D50) of the small-particle size filler according to the composite piezoelectric material filler (1) of the present invention is 0.1 to 1.2 μm, preferably 0.2 to 1.1 μm. Further, the average particle size (D50) of the large-particle size filler according to the composite piezoelectric material filler (1) of the present invention is 1 to 15 μm, preferably 2 to 12 μm. The average particle sizes of the small-particle size filler and the large-particle size filler falling within the aforementioned ranges enhances the piezoelectric properties of the composite piezoelectric material. In the present invention, the average particle size is a cumulative particle size at 50% (D50) determined in a volume frequency particle size distribution measurement measured by laser light scattering using MT-3300EXII, manufactured by MicrotracBEL Corp.

The SPAN ((D90−D10)/D50) of the small-particle size filler according to the composite piezoelectric material filler (1) of the present invention is preferably 0.2 to 2, particularly preferably 0.3 to 1.5. Further, the SPAN ((D90−D10)/D50) of the large-particle size filler is preferably 0.3 to 3, particularly preferably 0.4 to 2. The SPAN of the small-particle size filler and the SPAN of the large-particle size filler falling within the aforementioned ranges enhances the piezoelectric properties of the composite piezoelectric material. In the present invention, D10, D50, and D90 are cumulative particle sizes at 10%, 50%, and 90% determined in a volume frequency particle size distribution measurement measured by laser light scattering using MT-3300EXII, manufactured by MicrotracBEL Corp.

The average particle size (D50) of the small-particle size filler according to the composite piezoelectric material filler (1) of the present invention is smaller than the average particle size (D50) of the large-particle size filler, and the ratio (large-particle size filler/small-particle size filler) of the average particle size (D50) of the large-particle size filler to the average particle size (D50) of the small-particle size filler is preferably 2 to 150, particularly preferably 3 to 30. The ratio of the average particle size (D50) of the large-particle size filler to the average particle size (D50) of the small-particle size filler falling within the aforementioned ranges enhances the piezoelectric properties of the composite piezoelectric material.

The BET specific surface area of the small-particle size filler according to the composite piezoelectric material filler (1) of the present invention is preferably 2 to 15 $m^2/g$, particularly preferably 2.5 to 10 $m^2/g$. Further, the BET specific surface area of the large-particle size filler according to the composite piezoelectric material filler (1) of the present invention is preferably 0.1 to 3 $m^2/g$, particularly preferably 0.2 to 2 $m^2/g$.

In the composite piezoelectric material filler (1) of the present invention, the content ratio (large-particle size filler:

small-particle size filler) of the large-particle size filler to the small-particle size filler is 10:90 to 90:10, preferably 20:80 to 80:20, by volume.

The composite piezoelectric material filler (1) of the present invention has enhanced piezoelectric properties, as compared with fillers not combining a small-particle size filler and a large-particle size filler, by containing a small-particle size filler having a predetermined average particle size and a large-particle size filler having a predetermined average particle size at predetermined volume fractions to combine the small-particle size filler and the large-particle size filler.

The small-particle size filler and the large-particle size filler according to the composite piezoelectric material filler (1) of the present invention are suitably produced by the method for producing alkali niobate compound particles according to the present invention described above. The small-particle size filler and the large-particle size filler obtained by the method for producing alkali niobate compound particles of the present invention are mixed at predetermined volume fractions, and thereby a mixture in which the small-particle size filler and the large-particle size filler are mixed at predetermined fractions, that is, the composite piezoelectric material filler (1) of the present invention can be obtained.

The composite piezoelectric material filler of the second embodiment of the present invention (which will be hereinafter referred to also as the composite piezoelectric material filler (2) of the present invention) comprises an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, the composite piezoelectric material filler exhibiting a bimodal particle size distribution including a first peak having a peak top in a particle size range of 0.1 to 1.2 μm and a second peak having a peak top in a particle size range of 1 to 15 μm in a particle size distribution measurement, wherein a ratio (B/A) of a value (B) of a frequency (%) of the particle size at the peak top of the second peak to a value (A) of a frequency (%) of the particle size at the peak top of the first peak is 0.1 to 20.

The composite piezoelectric material filler (2) of the present invention is a filler for a composite piezoelectric material used for producing a composite piezoelectric material comprising a polymer matrix and a filler by being contained and dispersed in the polymer matrix.

The composite piezoelectric material filler (2) of the present invention is the same as the composite piezoelectric material filler according to the composite piezoelectric material (2) of the present invention. That is, the composite piezoelectric material filler (2) of the present invention is particles of an alkali niobate compound. In the composite piezoelectric material filler (2) of the present invention, the ratio (K/(Na+K)) of the number of moles of potassium to the total number of moles of sodium and potassium is 0.40 to 0.60, preferably 0.45 to 0.55, in terms of atoms. The ratio (K/(Na+K)) of the number of moles of potassium to the total number of moles of sodium and potassium falling within the aforementioned ranges enhances the piezoelectric properties of the composite piezoelectric material. Further, in the composite piezoelectric material filler (2) of the present invention, the ratio ((Li+Na+K)/Nb) of the total number of moles of alkali metal elements to the number of moles of niobium is 0.995 to 1.005, preferably 0.997 to 1.003, in terms of atoms.

The potassium sodium niobate constituting the composite piezoelectric material filler (2) of the present invention is a perovskite alkali niobate compound represented by the following general formula (1):

$$ANbO_3. \tag{1}$$

In the alkali niobate compound represented by the general formula (1), A essentially contains sodium and potassium and may contain lithium, the ratio (K/(Na+K)) of the number of moles of potassium to the total number of moles of sodium and potassium is 0.40 to 0.60, preferably 0.45 to 0.55, in terms of atoms, and the ratio ((Li+Na+K)/Nb) of the total number of moles of alkali metal elements to the number of moles of niobium is 0.995 to 1.005, preferably 0.997 to 1.003, in terms of atoms.

The composite piezoelectric material filler (2) of the present invention exhibits a bimodal particle size distribution including a first peak having a peak top in a particle size range of 0.1 to 1.2 μm, preferably 0.2 to 1.1 μm, and a second peak having a peak top in a particle size range of 1 to 15 μm, preferably 2 to 12 μm, in a particle size distribution measurement. In the present invention, the particle size distribution measurement is a volume frequency particle size distribution measurement measured by laser light scattering using MT-3300EXII, manufactured by MicrotracBEL Corp., and the first peak and the second peak indicate peaks in a particle size distribution chart obtained by such a volume particle size distribution measurement.

The ratio (B/A) of the value (B) of the frequency (%) of the particle size at the peak top of the second peak to the value (A) of the frequency (%) of the particle size at the peak top of the first peak is 0.1 to 20, preferably 0.2 to 18, particularly preferably 0.3 to 15, in the particle size distribution measurement of the composite piezoelectric material filler (2) of the present invention. The value B/A in the particle size distribution measurement of the alkali niobate compound in the composite piezoelectric material (2) of the present invention falling within the aforementioned ranges improves the dispersibility of the alkali niobate compound in the polymer matrix and, further enhances the piezoelectric properties of the composite piezoelectric material to be obtained.

In the particle size distribution measurement of the composite piezoelectric material filler (2) of the present invention, the particle size at the peak top of the first peak is smaller than the particle size at the peak top of the second peak, and a ratio (the particle size at the peak top of the second peak/the particle size at the peak top of the first peak) of the particle size at the peak top of the second peak to the particle size at the peak top of the first peak is preferably 2 to 150, particularly preferably 3 to 30. The ratio (the particle size at the peak top of the second peak/the particle size at the peak top of the first peak) of the particle size at the peak top of the second peak to the particle size at the peak top of the first peak falling within the aforementioned ranges enhances the piezoelectric properties of the composite piezoelectric material.

The composite piezoelectric material filler (2) of the present invention is bimodal particles having a predetermined particle size distribution, thereby having enhanced piezoelectric properties of the composite piezoelectric material.

As the method for producing the composite piezoelectric material filler (2) of the present invention, the composite piezoelectric material filler (2) of the present invention can be obtained, for example, by producing a small-particle size filler having a particle size distribution of the first peak and a large-particle size filler having a particle size distribution of the second peak by the aforementioned method for producing an alkali niobate compound of the present invention, and mixing them in such a way as to give a predetermined particle size distribution.

A composite piezoelectric material filler of a third embodiment of the present invention is a composite piezoelectric material filler used for the composite piezoelectric material (1) of the present invention, the composite piezoelectric material filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, and the composite piezoelectric material filler having an average particle size (D50) of 0.1 to 1.2 μm. That is, the composite piezoelectric material filler of the third embodiment of the present invention is a composite piezoelectric material filler used as the small-particle size filler in the composite piezoelectric material (1) of the present invention.

The composite piezoelectric material filler of the third embodiment of the present invention is the same as the small-particle size filler according to the composite piezoelectric material (1) of the present invention.

A composite piezoelectric material filler of a fourth embodiment of the present invention is a composite piezoelectric material filler used for the composite piezoelectric material (1) of the present invention, the composite piezoelectric material filler comprising an alkali niobate compound having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, and the composite piezoelectric material filler having an average particle size (D50) of 1 to 15 μm. That is, the composite piezoelectric material filler of the fourth embodiment of the present invention is a composite piezoelectric material filler used as the large-particle size filler in the composite piezoelectric material (1) of the present invention.

The composite piezoelectric material filler of the fourth embodiment of the present invention is the same as the large-particle size filler according to the composite piezoelectric material (1) of the present invention.

Composite piezoelectric materials can be obtained by separately dispersing the composite piezoelectric material filler of the third embodiment of the present invention and the composite piezoelectric material filler of the fourth embodiment of the present invention respectively in polymer matrices, and examples of the form of use include various forms such as sheet, film, plate, porous, membrane, and fibrous forms, and laminated layers having an internal electrode structure. The form is appropriately selected therefrom corresponding to the usage of the composite piezoelectric material. For example, in the case of producing a composite piezoelectric material in the form of a sheet, a method for producing the composite piezoelectric material in the form of a sheet by first simultaneously or separately kneading a thermosetting resin with the composite piezoelectric material filler of the third embodiment of the present invention and the composite piezoelectric material filler of the fourth embodiment of the present invention, further mixing a curing accelerator therewith, followed by kneading and dispersion, to obtain a resin paste, then forming the obtained resin paste into a sheet on a substrate by printing or the like, and then heating the resin paste formed into a sheet together with the substrate for thermosetting can be mentioned. In addition, examples thereof include a method for producing a composite piezoelectric material in a desired shape by simultaneously or separately kneading a thermoplastic resin with the composite piezoelectric material filler of the third embodiment of the present invention and the composite piezoelectric material filler of the fourth embodiment of the present invention for mixing and dispersion by heating and melting, followed by injection molding using a mold. In addition, examples thereof include a method for producing a composite piezoelectric material in the form of a sheet by simultaneously or separately kneading a rubber substrate with the composite piezoelectric material filler of the third embodiment of the present invention and the composite piezoelectric material filler of the fourth embodiment of the present invention, further mixing a vulcanization accelerator therewith, followed by kneading and dispersion, to obtain a rubber raw material mixture, then forming the obtained rubber raw material mixture into a sheet on a substrate, and then heating the rubber raw material mixture formed into a sheet together with the substrate for vulcanization. Electrodes are formed using an existing suitable technique such as printing, vapor deposition, or the like, in the sheet composite material obtained by such a method and, further appropriately polarization is performed using a corona discharge system or the like, and thereby a composite piezoelectric device can be obtained exceptionally conveniently.

Next, a third invention of the present invention will be described.

<Third Invention>

The method for producing an alkali niobate compound according to the present invention is a method for producing an alkali niobate compound having a ratio ((Li+Na+K)/Nb) of the total number of moles of alkali metal elements to the number of moles of Nb of 0.995 to 1.005 in terms of atoms, the method comprising: a first step of dry-mixing alkali compounds and a niobium compound in an amount giving a ratio ((Li+Na+K)/Nb) of the total number of moles of alkali metal elements to the number of moles of Nb of 0.900 to 1.000 in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.015, to prepare a first firing raw material; a second step of firing the first firing raw material at 500 to 750° C., to obtain a first fired product; a third step of dry-mixing alkali compounds with the first fired product in an amount giving a ratio ((Li+Na+K)/Nb) of the total number of moles of alkali metal elements to the number of moles of Nb of 0.995 to 1.005 in terms of atoms and a difference of a ratio (K/(Na+K)) of the number of moles of K to the total number of moles of Na and K from a ratio (K/(Na+K)) of the number of moles of K to the total number of moles of Na and K in the alkali niobate compound as a production object falling within ±0.010, to prepare a second firing raw material; and a fourth step of firing the second firing raw material at 500 to 1000° C., to obtain the alkali niobate compound.

The first step is a step of dry-mixing alkali compounds and a niobium compound, to prepare a first firing raw material. The alkali compounds according to the first step are any of a lithium compound, a sodium compound, and a potassium compound, or a combination of any two or more of a lithium compound, a sodium compound, and a potassium compound. That is, only a lithium compound, only a sodium compound, or only a potassium compound may be used as an alkali compound, or any two or more of a lithium compound, a sodium compound, and a potassium compound may be used in combination as alkali compounds.

The lithium compound according to the first step is a compound having a lithium atom, and examples thereof include lithium carbonate, sodium hydrogencarbonate, lithium hydroxide, lithium oxalate, and lithium tartrate. The lithium compound may be of one type or a combination of two or more types. As the lithium compound, lithium carbonate ($Li_2CO_3$) is preferable for good handleability and good reactivity. Further, a higher purity of the lithium compound is preferable.

The average particle size (D50) of the lithium compound according to the first step is not particularly limited, and is preferably 1000 µm or less, particularly preferably 10 to 100 µm. The average particle size (D50) of the lithium compound falling within the aforementioned ranges increases the mixability with other raw materials and facilitates the adjustment of the composition, thereby enabling effective reaction in firing, which will be described below. Further, the BET specific surface area of the lithium compound according to the first step is not particularly limited, and is preferably 0.01 to 5 $m^2/g$, particularly preferably 0.1 to 3 $m^2/g$. The BET specific surface area of the lithium compound falling within the aforementioned ranges increases the mixability with other raw materials and facilitates the adjustment of the composition, thereby enabling effective reaction in firing, which will be described below.

The sodium compound according to the first step is a compound having a sodium atom, and examples thereof include sodium carbonate, sodium hydrogencarbonate, sodium hydroxide, sodium oxalate, and sodium tartrate. The sodium compound may be of one type or a combination of two or more types. As the sodium compound, sodium carbonate ($Na_2CO_3$) is preferable for good handleability and good reactivity. Further, a higher purity of the sodium compound is preferable.

The average particle size (D50) of the sodium compound according to the first step is not particularly limited, and is preferably 1000 µm or less, particularly preferably 10 to 100 µm. The average particle size (D50) of the sodium compound falling within the aforementioned ranges increases the mixability with other raw materials and facilitates the adjustment of the composition, thereby enabling effective reaction in firing, which will be described below. Further, the BET specific surface area of the sodium compound according to the first step is not particularly limited, and is preferably 0.01 to 5 $m^2/g$, particularly preferably 0.1 to 3 $m^2/g$. The BET specific surface area of the sodium compound falling within the aforementioned ranges increases the mixability with other raw materials and facilitates the adjustment of the composition, thereby enabling effective reaction in firing, which will be described below.

The potassium compound according to the first step is a compound having a potassium atom, and examples thereof include potassium carbonate, potassium hydrogencarbonate, potassium hydroxide, potassium oxalate, and potassium tartrate. The potassium compound may be of one type or a combination of two or more types. As the potassium compound, potassium carbonate ($K_2CO_3$) is preferable for good handleability and good reactivity throughout blending to firing. Further, a higher purity of the potassium compound is preferable.

The average particle size (D50) of the potassium compound according to the first step is not particularly limited, and is preferably 1000 µm or less, particularly preferably 10 to 100 µm. The average particle size (D50) of the potassium compound falling within the aforementioned ranges increases the mixability with other raw materials and facilitates the adjustment of the composition, thereby enabling effective reaction in firing, which will be described below. Further, the BET specific surface area of the potassium compound according to the first step is not particularly limited, and is preferably 0.01 to 5 $m^2/g$, particularly preferably 0.1 to 3 $m^2/g$. The BET specific surface area of the potassium compound falling within the aforementioned ranges increases the mixability with other raw materials and facilitates the adjustment of the composition, thereby enabling effective reaction in firing, which will be described below.

The niobium compound according to the first step is a compound having a niobium atom, and examples thereof include niobium pentoxide, niobium hydroxide, and ammonium niobium oxalate. The niobium compound may be of one type or a combination of two or more types. As the niobium compound, niobium pentoxide ($Nb_2O_5$) is preferable for easy handleability and good precision composition control. Further, a higher purity of the niobium compound is preferable.

The average particle size (D50) of the niobium compound according to the first step is not particularly limited, and is preferably 0.1 to 15 µm, particularly preferably 0.2 to 12 µm. The average particle size (D50) of the niobium compound falling within the aforementioned ranges increases the mixability with other raw materials and facilitates the adjustment of the composition, thereby enabling effective reaction in firing, which will be described below. Further, the BET specific surface area of the niobium compound according to the first step is not particularly limited, and is preferably 0.1 to 15 $m^2/g$, particularly preferably 0.2 to 10 $m^2/g$. The BET specific surface area of the niobium compound falling within the aforementioned ranges enables production of an alkali niobate compound having excellent dispersibility and good crystallinity even in the dry method. The average particle size in the present invention is a cumulative particle size at 50% (D50) determined in a volume frequency particle size distribution measurement measured by laser light scattering using MT3300EXII, manufactured by MicrotracBEL Corp.

In the first step, alkali compounds and a niobium compound are mixed in an amount giving a ratio ((Li+Na+K)/Nb) of the total number of moles of alkali metal elements to the number of moles of Nb of 0.900 to 1.000, preferably 0.920 to 0.995, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.015, to obtain a first firing raw material. That is, in the first step, the amount of the alkali metal elements in the first firing raw material is made equimolar to Nb or slightly less than the equimolar amount to Nb. Further, in the first step, the ratio of the amounts of Na and K in the first firing raw material is made equivalent to the molar ratio of Na and K in the alkali niobate compound as a production object. The alkali niobate compound as a production object is an alkali niobate compound that is intended to be obtained by performing the method for producing an alkali niobate compound of the present invention. When the alkali niobate compound as a production object is an alkali niobate compound containing lithium, a lithium compound as an alkali compound may be mixed or not mixed to the first firing raw material in the first step, as long as the ratio ((Li+Na+K)/Nb) of the total number of moles of alkali metal elements to the number of moles of Nb is 0.900 to 1.000, preferably 0.920 to 0.995, in terms of atoms. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms. Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the present invention, the phrase, the difference of the ratio (K/(Na+K)) of the number of moles of K to the total number of moles of Na and K in the first firing raw material from the ratio (K/(Na+K)) of the number of moles of K to the total number of moles of Na and K in the alkali niobate compound as a production object falls within ±0.015, means that, when the ratio (K/(Na+K)) of the number of moles of K to the total number of moles of Na and K in the first firing raw material in terms of atoms is referred to as Y, and the ratio (K/(Na+K)) of the number of moles of K to the total number of moles of Na and K in the alkali niobate compound as a production object is referred to as Z, the value "Y−Z" falls within ±0.015. For example, when producing an alkali niobate compound having a ratio (K/(Na+K)) of the number of moles of K to the total number of moles of Na and K of 0.45, the ratio (K/(Na+K)) of the number of moles of K to the total number of moles of Na and K in the first firing raw material is set to a molar ratio of 0.435 to 0.465 in terms of atoms. Further, the same applies to the ratio (K/(Na+K)) of the number of moles of K to the total number of moles of Na and K in the second firing raw material, which will be described below.

In the first step, alkali compounds and a niobium compound are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The second step is a step of firing the first firing raw material obtained by performing the first step, to obtain a first fired product.

In the second step, the firing temperature when firing the first firing raw material is 500 to 750° C., preferably 550 to 700° C. Further, in the second step, the firing time when firing the first firing raw material is appropriately selected, and is preferably 3 to 20 hours, particularly preferably 5 to 15 hours, and the firing atmosphere is an oxidizing atmosphere such as oxygen gas and air.

After the second step is performed to obtain the first fired product, the obtained first fired product may be ground, as required. For grinding the first fired product, grinding devices such as a jet mill, a ball mill, a bead mill, an ultimizer, an atomizer, a nanomizer, a pulverizer, and a pin mill can be used.

The third step is a step of dry-mixing alkali compounds with the first fired product obtained by performing the second step, to prepare a second firing raw material.

The alkali compounds according to the third step are the same as the alkali compounds according to the first step. The lithium compound used in the third step may be the same as the lithium compound used in the first step or may be a lithium compound that is different from the lithium compound used in the first step. The sodium compound used in the third step may be the same as the sodium compound used in the first step or may be a sodium compound that is different from the sodium compound used in the first step. Further, the potassium compound used in the third step may be the same as the potassium compound used in the first step or may be a potassium compound that is different from the potassium compound used in the first step.

In the third step, the composition of the first fired product is analyzed to grasp the mol % of Nb, Li, Na, and K in the first fired product, and then the alkali compounds are mixed with the first fired product based on the obtained results of the compositional analysis, to obtain the second firing raw material having a ratio ((Li+Na+K)/Nb) of the total number of moles of alkali metal elements to the number of moles of Nb of 0.995 to 1.005, preferably 0.997 to 1.003, in terms of atoms and a difference of a ratio (K/(Na+K)) of the number of moles of K to the total number of moles of Na and K from the ratio (K/(Na+K)) of the number of moles of K to the total number of moles of Na and K in the alkali niobate compound as a production object falling within ±0.010. That is, in the third step, the amount of alkali metal elements in the second firing raw material is set to a molar ratio thereof to Nb of 1.000±0.005, so as to be almost equimolar to Nb. Further, in the third step, the ratio of the amounts of Na and K in the second firing raw material is made equivalent to the molar ratio of Na and K in the alkali niobate compound as a production object. When the alkali niobate compound as a production object is an alkali niobate compound containing lithium, a lithium compound as an alkali compound is mixed with the first firing raw material in the first step, and lithium atoms are short as compared with those in the alkali niobate compound as a production object, a lithium compound is mixed with the second firing raw material in the third step in an amount corresponding to the shortage of lithium atoms. Meanwhile, when the alkali niobate compound as a production object is an alkali niobate compound containing lithium, and a lithium compound as an alkali compound is not mixed with the first firing raw material in the first step, a lithium compound is mixed with the second firing raw material in the third step in such a way as to give the content of lithium atoms in the alkali niobate compound as a production object.

In the third step, a sodium compound, a potassium compound, and the first fired product are dry-mixed. The dry-mixing method is not particularly limited, and examples thereof include mixing methods using a blender, a ribbon mixer, a Henschel mixer, a food mixer, a super mixer, a Nauta mixer, a Julia mixer, or the like.

The fourth step is a step of firing the second firing raw material obtained by performing the third step, to obtain an alkali niobate compound.

In the alkali niobate compound obtained by performing the fourth step, the ratio (K/(Na+K)) of the number of moles of potassium to the total number of moles of Na and K is preferably 0 to 1.000 in terms of atoms. When the molar ratio (K/(Na+K)) is 0, that is, when any of a lithium compound and a sodium compound or both of them are used as alkali compounds, the alkali niobate compound to be obtained is lithium niobate, sodium niobate, or lithium sodium niobate. Further, when the molar ratio (K/(Na+K)) is 1.000, that is, when any of a lithium compound and a potassium compound or both of them are used as alkali compounds, the alkali niobate compound to be obtained is lithium niobate, potassium niobate, or lithium potassium niobate. When the molar ratio (K/(Na+K)) is more than 0 and less than 1.000, that is, when any two or more of a lithium compound, a sodium compound, and a potassium compound are used in combination as alkali compounds, the alkali niobate compound to be obtained is potassium sodium niobate or lithium potassium sodium niobate.

In the alkali niobate compound obtained by performing the fourth step, the ratio (Li/(Li+Na+K)) of the number of moles of lithium to the total number of moles of alkali metal elements is preferably 0 to 0.100 in terms of atoms. When the molar ratio (Li/(Li+Na+K)) is 0, that is, when any of a sodium compound and a potassium compound or both of them are used as alkali compounds, the alkali niobate compound to be obtained is sodium niobate, potassium niobate, or potassium sodium niobate. Further, when the molar ratio (Li/(Li+Na+K)) is more than 0, that is, when any two or more of a lithium compound, a sodium compound, and a potassium compound are used in combination as alkali compounds, the alkali niobate compound to be obtained is lithium sodium niobate, lithium potassium niobate, or lithium potassium sodium niobate.

In the alkali niobate compound obtained by performing the fourth step, the ratio ((Li+Na+K)/Nb) of the total number of moles of alkali metal elements to the number of moles of niobium is preferably 0.995 to 1.005, further preferably 0.997 to 1.003, in terms of atoms.

The alkali niobate compound obtained by performing the fourth step is a perovskite or ilmenite alkali niobate compound represented by the following general formula (1):

$$ANbO_3. \tag{1}$$

In the alkali niobate compound represented by the general formula (1), A is at least one selected from lithium, sodium, and potassium, the ratio (K/(Na+K)) of the number of moles of K to the total number of moles of Na and K is 0 to 1.000 in terms of atoms, the ratio (Li/(Li+Na+K)) of the number of moles of Li to the total number of moles of alkali metal elements is 0 to 0.100 in terms of atoms, and the ratio ((Li+Na+K)/Nb) of the total number of moles of alkali metal elements to the number of moles of Nb is 0.995 to 1.005, further preferably 0.997 to 1.003, in terms of atoms.

In the fourth step, the firing temperature when firing the second firing raw material is 500 to 1000° C., preferably 550 to 900° C. Further, in the fourth step, the firing time when firing the second firing raw material is appropriately selected, and is preferably 3 to 20 hours, particularly preferably 5 to 15 hours, and the firing atmosphere is an oxidizing atmosphere such as oxygen gas and air.

After the fourth step is performed to obtain the fired product, the obtained fired product may be ground, as required. For grinding the fired product, grinding devices such as a jet mill, a ball mill, a bead mill, an ultimizer, an atomizer, a nanomizer, a pulverizer, and a pin mill can be used.

The alkali niobate compound obtained by performing the fourth step is further fired at preferably 500 to 1000° C., particularly preferably 700 to 900° C., so that the crystallinity can be enhanced, or sintering can proceed, as desired. Further, the firing temperature at this time is appropriately selected, and is preferably 3 to 20 hours, particularly preferably 5 to 15 hours. The firing atmosphere is an oxidizing atmosphere such as oxygen gas and air.

The alkali niobate compound obtained after firing may be ground, as required. For grinding the alkali niobate compound, grinding devices such as a jet mill, a ball mill, a bead mill, an ultimizer, an atomizer, a nanomizer, a pulverizer, and a pin mill can be used.

The average particle size (D50) of the alkali niobate compound thus obtained by performing the method for producing an alkali niobate compound of the present invention is not particularly limited, and is preferably 0.1 to 15 μm, particularly preferably 0.2 to 12 μm. Further, the BET specific surface area of the alkali niobate compound obtained by performing the method for producing an alkali niobate compound of the present invention is not particularly limited, and is preferably 0.1 to 15 m²/g, particularly preferably 0.2 to 10 m²/g.

The alkali niobate compound particles according to the present invention obtained may be subjected to surface treatment in order to improve various properties such as water resistance, stability, and dispersibility as long as their properties are not impaired. For the surface treatment, surface-treating agents such as silane, titanate, aluminate, and zirconate coupling agents, fatty acids, fatty acid esters, higher alcohols, and hardened oils can be used.

The surface treatment method is not particularly limited, and the surface treatment can be carried out using known methods. Examples of the surface treatment method include a wet method in which surface treatment is performed by dispersing the alkali niobate compound particles according to the present invention and a surface-treating agent in water or an organic solvent, followed by filtration and drying. Further, examples of the surface treatment method include a dry method in which surface treatment is performed by adding a surface-treating agent to the alkali niobate compound particles according to the present invention by spraying or dripping, while the alkali niobate compound particles are being processed with mixing/grinding devices such as a Henschel mixer, a ball mill, and a jet mill, followed by drying, heating, or the like.

The alkali niobate compound particles according to the present invention thus obtained may be used in the form of paints such as pastes, slurries, and varnishes by being mixed with solvents. As the solvents used when the alkali niobate compound particles are used in the form of paints, common solvents in such a technical field are used, and examples thereof include alcohols such as toluene and ethanol, ketones such as methyl ethyl ketone, and cycloalkanes such as cyclohexane. Further, corresponding to the form of use, organic additives such as binders, various resin and rubber polymer materials that serve as base materials for forming composites, inorganic additives such as flux materials, dispersants or the like may be contained in the paints, as required.

The obtained paints are formed into products of fibrous, sheet, film, plate, and other shapes by existing forming techniques, so as to be suitably used for fabrication in various applications, which will be described below.

The alkali niobate compound obtained by performing the method for producing an alkali niobate compound of the present invention is suitably used as a production raw material for piezoelectric ceramics produced by sintering ceramic raw materials, a filler of a composite piezoelectric material in which a composite piezoelectric material filler is dispersed in a polymer matrix, a filler for electret materials whose use as electrostatic induction conversion devices is proposed, using the alkali niobate compound according to the present invention itself as a raw material, other than the use in the form of paints. Further, it is suitably used as these applications as various sensors such as pressure sensors, pressure distribution sensors, gyro sensors, shock sensors, seat sensors, and wearable sensors; damping materials used in precision electronics, automobiles, and buildings; power generating devices using environmental vibration generated by human walking, driving of automobiles, or the like; ignition devices such as lighters and gas appliances; oscillation circuits used in receiving machines such as radios and televisions; various actuators used in driving devices of scanning probe microscopes or ultrasonic motors, and droplet discharge heads of inkjet printers; and medical materials relating to tissue reproduction.

In conventional methods for producing an alkali niobate compound, when alkali compounds and a niobium compound are mixed and fired, the alkali compounds deliquesce, thereby making uniform mixing difficult, and therefore the molar ratio of alkali metals in the composite metal oxide obtained by firing deviates from a desired molar ratio, and precise adjustment of the molar ratio of alkali metals has been difficult.

In contrast, in the method for producing an alkali niobate compound of the present invention, after the molar ratio of Na and K is first adjusted to a desired molar ratio in the first step and the second step, and the ratio of the total number of moles of alkali metal elements to the number of moles of Nb is set to 0.900 to 1.000, so that the total amount of alkali metal elements is equivalent to or slightly smaller than Nb, followed by firing, to obtain a fired product, the molar ratio of alkali metal elements and Nb is adjusted in the third step and the fourth step, to obtain a fired product. Therefore, the composition of the alkali niobate compound can be precisely adjusted.

EXAMPLES

Hereinafter, the present invention will be described by way of examples, but the present invention is not limited to these examples.

Example 1

<Production of Potassium Sodium Niobate>

With the target composition of each element being set so that sodium was 26.25 mol %, potassium was 23.75 mol %, niobium was 50.00 mol %, the ratio ((Na+K)/Nb) of alkali metals to niobium was 1.000, and the ratio (K/(Na+K)) of potassium to the total alkali metals was 0.475, 4485 g of niobium pentoxide ($Nb_2O_5$, manufactured by Jiujiang Tanbre Co., Ltd.), 937 g of sodium carbonate ($Na_2CO_3$, manufactured by Tokuyama Corporation), and 1108 g of potassium carbonate (fine powder for food additives, $K_2CO_3$, manufactured by Nippon Soda Co., Ltd.) were dry-mixed using a Henschel mixer (FM-20B, manufactured by NIPPON COKE & ENGINEERING CO., LTD.) under conditions of 2000 rpm and 2.5 minutes, to obtain a first firing raw material.

The first firing raw material thus obtained was fired at 650° C. for 7 hours using an elevating electric furnace (SLV-6060L-SP, manufactured by Motoyama Co., Ltd). After cooling to room temperature, it was ground using a jet mill (STJ-200, manufactured by Seishin Enterprise Co., Ltd.) under conditions of a processing speed of 6 kg/h, an introduction pressure of 0.6 MPa, and a grinding pressure of 0.5 MPa, to obtain a first ground product.

As a result of analyzing the composition of the first ground product by fluorescent X-ray, sodium was 26.47 mol %, potassium was 23.28 mol %, niobium was 50.25 mol %, the ratio ((Na+K)/Nb) of alkali metals to niobium was 0.990, and the ratio (K/(Na+K)) of potassium to the total alkali metals was 0.468.

In order to finely adjust the ratio ((Na+K)/Nb) of alkali metals to niobium to 1.000 and the ratio (K/(Na+K)) of potassium to the total alkali metals to 0.475, 29 g of potassium carbonate was added to 5500 g of the first ground product, followed by dry-mixing using a Henschel mixer under conditions of 2000 rpm and 3 minutes, to obtain a second firing raw material.

The second firing raw material thus obtained was fired at 650° C. for 7 hours using an elevating electric furnace. After cooling to room temperature, it was ground using a jet mill under conditions of a processing speed of 10 kg/h, an introduction pressure of 0.6 MPa, and a grinding pressure of 0.5 MPa, to obtain a second ground product.

As a result of analyzing the composition of the second ground product by fluorescent X-ray, sodium was 26.36 mol %, potassium was 23.68 mol %, niobium was 49.96 mol %, the ratio ((Na+K)/Nb) of alkali metals to niobium was 1.002, and the ratio (K/(Na+K)) of potassium to the total alkali metals was 0.473.

In order to further enhance the crystallization, the second ground product was fired at 900° C. for 15 hours using an elevating electric furnace. After cooling to room temperature, it was ground using a jet mill under conditions of a processing speed of 5 kg/h, an introduction pressure of 0.30 MPa, and a grinding pressure of 0.15 MPa, to obtain potassium sodium niobate particles.

<Analysis>

As a result of analyzing the composition of the obtained potassium sodium niobate by fluorescent X-ray using ZSX100e, manufactured by Rigaku Corporation, the ratio ((Na+K)/Nb) of alkali metals to niobium was 1.001, and the ratio (K/(Na+K)) of potassium to the total alkali metals was 0.473.

Further, the obtained potassium sodium niobate was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 1 and FIG. 2.

Figure 2:
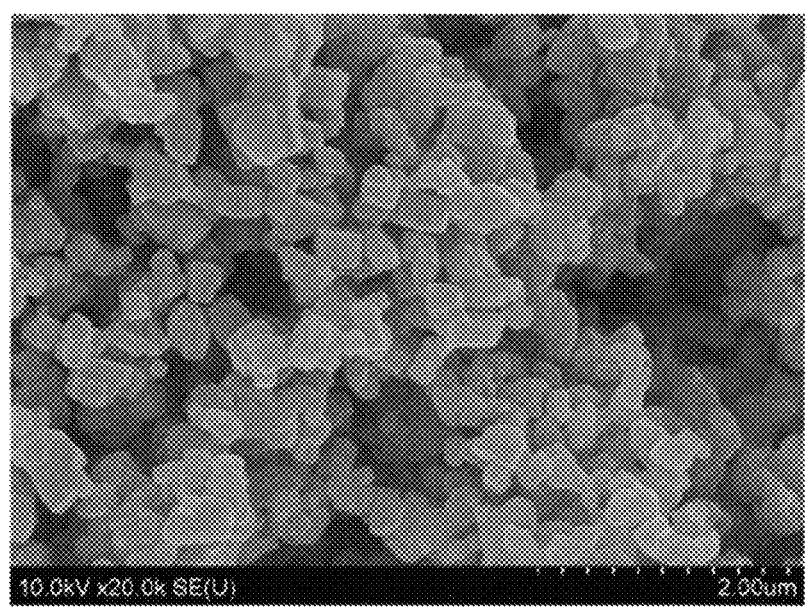
FIG. 2 is a SEM photograph of the potassium sodium niobate obtained in Example 1.

From the XRD chart of FIG. 1, it was confirmed that the obtained potassium sodium niobate was in a single phase.

Further, the particle size distribution of the obtained potassium sodium niobate was measured using MT-3300EXII, manufactured by MicrotracBEL Corp. As a result, the average particle size D50 was 0.68 μm.

Further, the BET specific surface area of the obtained potassium sodium niobate was measured using Macsorb HM model-1208, manufactured by Mountech Co., Ltd. As a result, the BET specific surface area was 4.61 $m^2$/g.

<Fabrication of Composite Piezoelectric Material and Composite Piezoelectric Device>

The potassium sodium niobate particles obtained in Example 1 were kneaded with an epoxy resin at a fraction of 40 vol %, to obtain an epoxy resin composition. The epoxy resin used herein was composed of 99 mass % of a thermosetting epoxy resin (product name: JER® 828EL, manufactured by Mitsubishi Chemical Corporation, with a molecular weight of about 370, a specific gravity of 1.17, and a nominal viscosity at 25° C. of 120 to 150 P), and 1 mass % of an imidazole curing accelerator (product name: 2E4MZ, manufactured by SHIKOKU CHEMICALS COR- PORATION). The obtained epoxy resin composition was cured at 140° C. for 5 hours to fabricate a plate composite piezoelectric material with a thickness of 0.6 mm. Subsequently, 30-nm thick platinum films were formed as electrodes on both surfaces of the obtained composite piezoelectric material by vapor deposition, and thereafter −8.0 kV was applied thereto using a corona discharge system (ELC-01N, manufactured by ELEMENT Co., Ltd.) for 30 minutes, to obtain a composite piezoelectric device polarized in the thickness direction.

The piezoelectric constant ($d_{33}$), the relative permittivity, and the dielectric loss of the composite piezoelectric device obtained in Example 1 were measured by the following measurement methods. As a result, the piezoelectric constant ($d_{33}$) was 0.55 pC/N, the relative permittivity was 23.1, and the dielectric loss was 0.006. Further, the piezoelectric constant ($g_{33}$) determined from the piezoelectric constant ($d_{33}$) and the relative permittivity was $2.7 \times 10^{-3}$ V·m/N.

(Measurement Method)

<Piezoelectric Constant ($d_{33}$)>

The composite piezoelectric device was set in the force head of a piezometer system (PM200, manufactured by Piezo Test Ltd.) in the thickness direction, and the static force was adjusted to 5 N. The $d_{33}$ was measured with a vibration frequency of 110 Hz and a force of 0.25 N.

<Relative Permittivity and Dielectric Loss>

Using an impedance analyzer (1255B, manufactured by Solartron Analytical) and an interface (1296, manufactured by Solartron Analytical), the relative permittivity and the dielectric loss at a frequency of 100 Hz and an applied voltage of 1 V were measured.

Example 2

The same procedure as in Example 1 was performed except that the target composition of each element was changed so that sodium was 25.5 mol %, and potassium was 24.5 mol %, instead of sodium being 26.25 mol %, and potassium being 23.75 mol %.

As a result, the ratio ((Na+K)/Nb) of alkali metals to niobium was 1.000, and the ratio (K/(Na+K)) of potassium to the total alkali metals was 0.489, in the obtained potassium sodium niobate. Other various properties are shown in Table 1. Further, it was confirmed from the XRD chart that the obtained potassium sodium niobate was in a single phase.

After a composite piezoelectric device was obtained from the obtained potassium sodium niobate by the same method as in Example 1, the electrical properties were measured. As a result, the piezoelectric constant ($d_{33}$) was 0.56 pC/N, the relative permittivity was 22.4, and the dielectric loss was 0.007. Further, the piezoelectric constant ($g_{33}$) determined from the piezoelectric constant ($d_{33}$) and the relative permittivity was $2.8 \times 10^{-3}$ V·m/N.

Comparative Example 1

The same procedure as in Example 1 was performed except that the target composition of each element was changed so that sodium was 25.00 mol %, potassium was 25.00 mol %, and the ratio (K/(Na+K)) of potassium to the total alkali metals was 0.500, instead of sodium being 26.25 mol %, potassium being 23.75 mol %, and the ratio (K/(Na+K)) of potassium to the total alkali metals being 0.475.

As a result, the ratio ((Na+K)/Nb) of alkali metals to niobium was 0.999, and the ratio (K/(Na+K)) of potassium to the total alkali metals was 0.498, in the obtained potassium sodium niobate. Other various properties are shown in Table 1. Further, it was confirmed from the XRD chart that the obtained potassium sodium niobate was in a single phase.

After a composite piezoelectric device was obtained from the obtained potassium sodium niobate by the same method as in Example 1, the electrical properties were measured. As a result, the piezoelectric constant ($d_{33}$) was 0.26 pC/N, the relative permittivity was 22.0, and the dielectric loss was 0.007. Further, the piezoelectric constant ($g_{33}$) determined from the piezoelectric constant ($d_{33}$) and the relative permittivity was $1.3 \times 10^{-3}$ V·m/N.

Comparative Example 2

The same procedure as in Example 1 was performed except that the target composition of each element was changed so that sodium was 27.50 mol %, potassium was 22.50 mol %, and the ratio (K/(Na+K)) of potassium to the total alkali metals was 0.450, instead of sodium being 26.25 mol %, potassium being 23.75 mol %, and the ratio (K/(Na+K)) of potassium to the total alkali metals being 0.475.

As a result, the ratio ((Na+K)/Nb) of alkali metals to niobium was 0.999, and the ratio (K/(Na+K)) of potassium to the total alkali metals was 0.448, in the obtained potassium sodium niobate. Other various properties are shown in Table 1. Further, it was confirmed from the XRD chart that the obtained potassium sodium niobate was in a single phase.

After a composite piezoelectric device was obtained from the obtained potassium sodium niobate by the same method as in Example 1, the electrical properties were measured. As a result, the piezoelectric constant ($d_{33}$) was 0.30 pC/N, the relative permittivity was 22.3, and the dielectric loss was 0.007. Further, the piezoelectric constant ($g_{33}$) determined from the piezoelectric constant ($d_{33}$) and the relative permittivity was $1.5 \times 10^{-3}$ V·m/N.

Comparative Example 3

The same procedure as in Example 1 was performed except that the target composition of each element was changed so that sodium was 28.75 mol %, potassium was 21.25 mol %, and the ratio (K/(Na+K)) of potassium to the total alkali metals was 0.425, instead of sodium being 26.25 mol %, potassium being 23.75 mol %, and the ratio (K/(Na+K)) of potassium to the total alkali metals being 0.475.

As a result, the ratio ((Na+K)/Nb) of alkali metals to niobium was 1.001, and the ratio (K/(Na+K)) of potassium to the total alkali metals was 0.424, in the obtained potassium sodium niobate. Other various properties are shown in Table 1. Further, it was confirmed from the XRD chart that the obtained potassium sodium niobate was in a single phase.

After a composite piezoelectric device was obtained from the obtained potassium sodium niobate by the same method as in Example 1, the electrical properties were measured. As a result, the piezoelectric constant ($d_{33}$) was 0.12 pC/N, the relative permittivity was 22.8, and the dielectric loss was 0.007. Further, the piezoelectric constant ($g_{33}$) determined from the piezoelectric constant ($d_{33}$) and the relative permittivity was $0.6 \times 10^{-3}$ V·m/N.

TABLE 1

|  | Example 1 | Example 2 | Comparative Example 1 | Comparative Example 2 | Comparative Example 3 |
|---|---|---|---|---|---|
| Composite piezoelectric material filler | | | | | |
| (K + Na)/Nb Molar ratio | 1.001 | 1.000 | 0.999 | 0.999 | 1.001 |
| K/(K + Na) Molar ratio | 0.473 | 0.489 | 0.498 | 0.448 | 0.423 |
| Average particle size (D50) μm | 0.68 | 0.67 | 0.67 | 0.67 | 0.68 |
| BET specific surface area m$^2$/g | 4.61 | 4.66 | 4.65 | 4.76 | 4.74 |
| Composite piezoelectric device | | | | | |
| Piezoelectric constant $d_{33}$ pC/N | 0.55 | 0.56 | 0.26 | 0.30 | 0.12 |
| Piezoelectric constant $g_{33}$ × $10^{-3}$ V · m/N | 2.7 | 2.8 | 1.3 | 1.5 | 0.6 |
| Relative permittivity | 23.1 | 22.4 | 22.0 | 22.3 | 22.8 |
| Dielectric loss | 0.006 | 0.007 | 0.007 | 0.007 | 0.007 |

Production Example 1-1

<Production of Small-Particle Size Filler>

With the target composition of each element being set so that sodium was 25.00 mol %, potassium was 25.00 mol %, niobium was 50.00 mol %, the ratio ((Li+Na+K)/Nb) of alkali metals to niobium was 1.000, and the ratio (K/(Na+K)) of potassium to the total amount of sodium and potassium was 0.500, 4485 g of niobium pentoxide ($Nb_2O_5$, manufactured by Jiujiang Tanbre Co., Ltd.), 893 g of sodium carbonate ($Na_2CO_3$, manufactured by Tokuyama Corporation), and 1160 g of potassium carbonate (fine powder for food additives $K_2CO_3$, manufactured by Nippon Soda Co., Ltd.) were dry-mixed using a Henschel mixer (FM-20B, manufactured by NIPPON COKE & ENGINEERING CO., LTD.) under conditions of 2000 rpm and 2.5 minutes, to obtain a first firing raw material.

The first firing raw material thus obtained was fired at 650° C. for 7 hours using an elevating electric furnace (SLV-6060L-SP, manufactured by Motoyama Co., Ltd.). After cooling to room temperature, it was ground using a jet mill (STJ-200, manufactured by Seishin Enterprise Co., Ltd.) under conditions of a processing speed of 6 kg/h, an introduction pressure of 0.6 MPa, and a grinding pressure of 0.5 MPa, to obtain a first ground product.

As a result of analyzing the composition of each element of the first ground product by fluorescent X-ray, sodium was 25.18 mol %, potassium was 24.57 mol %, niobium was 50.25 mol %, the ratio ((Na+K)/Nb) of alkali metals to niobium was 0.990, and the ratio (K/(Na+K)) of potassium to the total alkali metals was 0.494.

In order to finely adjust the ratio ((Na+K)/Nb) of alkali metals to niobium to 1.000 and the ratio (K/(Na+K)) of potassium to the total alkali metals to 0.500, 27 g of potassium carbonate was added to 5500 g of the first ground product, followed by dry-mixing using a Henschel mixer under conditions of 2000 rpm and 3 minutes, to obtain a second firing raw material.

The second firing raw material thus obtained was fired at 650° C. for 7 hours using an elevating electric furnace. After cooling to room temperature, it was ground using a jet mill under conditions of a processing speed of 10 kg/h, an introduction pressure of 0.6 MPa, and a grinding pressure of 0.5 MPa, to obtain a second ground product.

As a result of analyzing the composition of the second ground product by fluorescent X-ray, sodium was 25.10%, potassium was 24.95 mol %, niobium was 49.96 mol %, the ratio ((Na+K)/Nb) of alkali metals to niobium was 1.002, and the ratio (K/(Na+K)) of potassium to the total alkali metals was 0.498.

In order to further enhance the crystallization, the second ground product was fired at 900° C. for 15 hours using an elevating electric furnace. After cooling to room temperature, it was ground using a jet mill under conditions of a processing speed of 5 kg/h, an introduction pressure of 0.30 MPa, and a grinding pressure of 0.15 MPa, to obtain potassium sodium niobate particles.

<Analysis>

As a result of analyzing the composition of the obtained potassium sodium niobate (small-particle size) using ZSX100e, manufactured by Rigaku Corporation, the ratio ((Na+K)/Nb) of alkali metals to niobium was 0.999, and the ratio (K/(Na+K)) of potassium to the total alkali metals was 0.498.

Further, the obtained potassium sodium niobate (small-particle size) was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 3 and FIG. 4.

Figure 3:
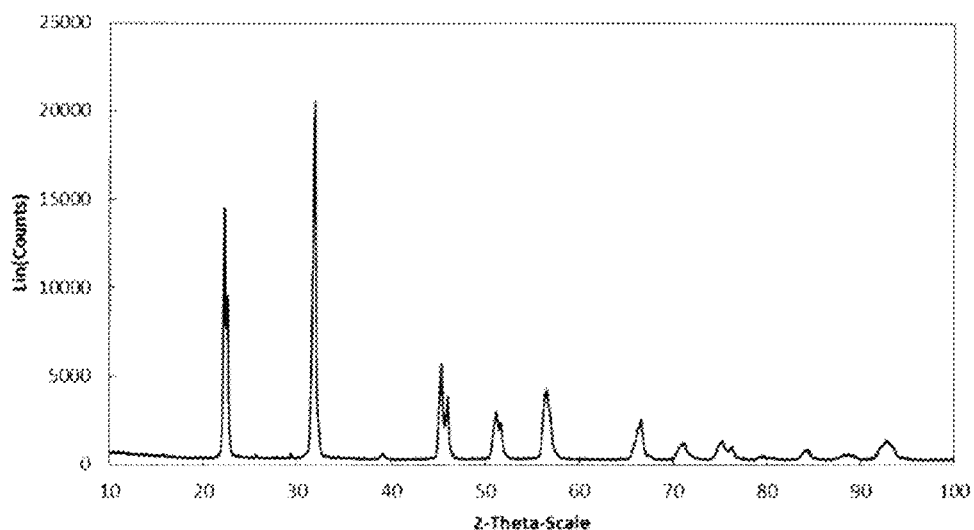
FIG. 3 is an XRD chart of a small-particle size filler produced in Production Example 1-1.
Figure 4:
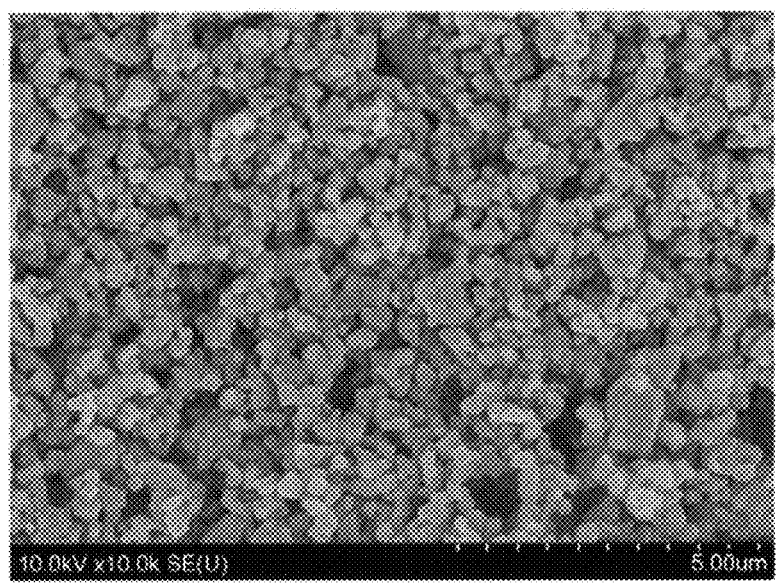
FIG. 4 is a SEM of the small-particle size filler produced in Production Example 1-1.

From the XRD chart of FIG. 3, it was confirmed that the obtained potassium sodium niobate (small-particle size) was in a single phase.

Figure 5:
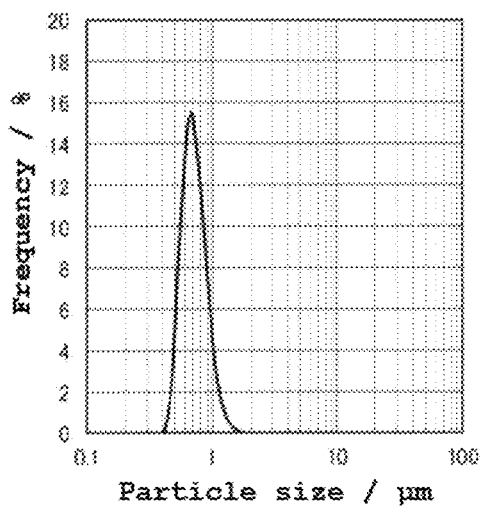
FIG. 5 is a particle size distribution curve of the small-particle size filler produced in Production Example 1-1.

Further, the D10, D50 (average particle size), and D90 of the obtained potassium sodium niobate (small-particle size) were measured using MT-3300EXII, manufactured by MicrotracBEL Corp. As a result, the D10 was 0.52 μm, the D50 was 0.67 μm, the D90 was 0.92 μm, and the SPAN ((D90−D10)/D50) was 0.60. Further, the obtained particle size distribution curve is shown in FIG. 5.

Further, the BET specific surface area of the obtained potassium sodium niobate (small-particle size) was measured using Macsorb HM model-1208, manufactured by Mountech Co., Ltd. As a result, the BET specific surface area was 4.65 m$^2$/g.

Production Example 1-2

<Production of Small-Particle Size Filler>

The same procedure as in Production Example 1-1 was performed except that 4485 g of niobium pentoxide ($Nb_2O_5$, manufactured by Jiujiang Tanbre Co., Ltd.), 937 g of sodium carbonate ($Na_2CO_3$, manufactured by Tokuyama Corporation), and 1108 g of potassium carbonate (fine powder for food additives $K_2CO_3$, manufactured by Nippon Soda Co., Ltd.) were used as raw materials, in order to set the target composition of each element so that sodium was 26.25 mol %, potassium was 23.75 mol %, and the ratio (K/(Na+K)) of potassium to the total alkali metals was 0.475, instead of sodium being 25.00 mol %, potassium being 25.00 mol %, and the ratio (K/(Na+K)) of potassium to the total alkali metals being 0.500.

Various properties of the obtained potassium sodium niobate are shown in Table 2.

Preparation Example 1-3

<Production of Small-Particle Size Filler>

The same procedure as in Preparation Example 1-1 was performed except that 4485 g of niobium pentoxide ($Nb_2O_5$, manufactured by Jiujiang Tanbre Co., Ltd.), 981 g of sodium carbonate ($Na_2CO_3$, manufactured by Tokuyama Corporation), and 1050 g of potassium carbonate (fine powder for food additives $K_2CO_3$, manufactured by Nippon Soda Co., Ltd.) were used as raw materials, in order to set the target composition of each element so that sodium was 27.50 mol %, potassium was 22.50 mol %, and the ratio (K/(Na+K)) of potassium to the total alkali metals was 0.450, instead of sodium being 25.00 mol %, potassium being 25.00 mol %, and the ratio (K/(Na+K)) of potassium to the total alkali metals being 0.500.

Various properties of the obtained potassium sodium niobate are shown in Table 2.

Preparation Example 1-4

<Production of Small-Particle Size Filler>

The same procedure as in Preparation Example 1-1 was performed except that 4485 g of niobium pentoxide ($Nb_2O_5$, manufactured by Jiujiang Tanbre Co., Ltd.), 1026 g of sodium carbonate ($Na_2CO_3$, manufactured by Tokuyama Corporation), and 991 g of potassium carbonate (fine powder for food additives $K_2CO_3$, manufactured by Nippon Soda Co., Ltd.) were used as raw materials, in order to set the target composition of each element so that sodium was 28.75 mol %, potassium was 21.25 mol %, and the ratio (K/(Na+K)) of potassium to the total alkali metals was 0.425, instead of sodium being 25.00 mol %, potassium being 25.00 mol %, and the ratio (K/(Na+K)) of potassium to the total alkali metals being 0.500.

Various properties of the obtained potassium sodium niobate are shown in Table 2.

Production Example 1-5

<Production of Small-Particle Size Filler>

3512 g of niobium pentoxide ($Nb_2O_5$, manufactured by Jiujiang Tanbre Co., Ltd.), 668 g of sodium carbonate ($Na_2CO_3$, manufactured by Tokuyama Corporation), and 820 g of potassium carbonate (fine powder for food additives $K_2CO_3$, manufactured by Nippon Soda Co., Ltd.) were put into a Henschel mixer (FM-20B, manufactured by NIPPON COKE & ENGINEERING CO., LTD). At this time, in the put raw materials, sodium was 24.88 mol %, potassium was 23.44 mol %, niobium was 51.68 mol %, the ratio ((Li+Na+K)/Nb) of alkali metals to niobium was 0.935, and the ratio (K/(Na+K)) of potassium to sodium and potassium was 0.485, in terms of atoms. Subsequently, niobium pentoxide, sodium carbonate, and potassium carbonate put therein were dry-mixed using a Henschel mixer under conditions of 2000 rpm and 2.5 minutes, to obtain a first firing raw material.

The first firing raw material thus obtained was fired at 650° C. for 7 hours using an elevating electric furnace (SLV-6060L-SP, manufactured by Motoyama Co., Ltd.) (first firing). After cooling to room temperature, it was ground using a jet mill (STJ-200, manufactured by Seishin Enterprise Co., Ltd.) under conditions of a processing speed of 6 kg/h, an introduction pressure of 0.6 MPa, and a grinding pressure of 0.5 MPa, to obtain a first ground product.

As a result of analyzing the composition of the first ground product by fluorescent X-ray, sodium was 24.90 mol %, potassium was 23.32 mol %, niobium was 51.78 mol %, the ratio ((Li+Na+K)/Nb) of alkali metal elements to niobium was 0.931, and the ratio (K/(Na+K)) of potassium to sodium and potassium was 0.484.

In order to finely adjust the ratio ((Li+Na+K)/Nb) of alkali metals to niobium to 1.000 and the ratio (K/(Na+K)) of potassium to sodium and potassium to 0.485, 54.7 g of lithium carbonate ($Na_2CO_3$, manufactured by Ganfeng Lithium Co. Ltd.), 4.4 g of sodium carbonate, and 9.6 g of potassium carbonate were added to 4210 g of the first ground product, followed by dry-mixing using a Henschel mixer under conditions of 2000 rpm and 3 minutes, to obtain a second firing raw material.

The second firing raw material thus obtained was fired at 550° C. for 7 hours using an elevating electric furnace (second firing). After cooling to room temperature, it was ground using a jet mill under conditions of a processing speed of 10 kg/h, an introduction pressure of 0.6 MPa, and a grinding pressure of 0.5 MPa, to obtain a second ground product.

As a result of analyzing sodium, potassium, and niobium in the composition of the second ground product by fluorescent X-ray, sodium was 24.92 mol %, potassium was 23.51 mol %, niobium was 51.57 mol %, the molar ratio ((Na+K)/Nb) of the total amount of sodium and potassium to niobium was 0.939, and the molar ratio (K/(Na+K)) of potassium to sodium and potassium was 0.486. Further, the molar ratio of lithium to niobium, as determined by measuring the content of each of lithium and niobium by ICP-AES analysis, was 0.06. From these results, the ratio ((Li+Na+K)/Nb) of alkali metals to niobium was calculated at 0.999, and the ratio (Li/(Li+Na+K)) of the number of moles of lithium to the number of moles of the alkali metals was calculated at 0.060.

In order to further enhance the crystallinity, the second ground product was fired at 900° C. for 10 hours using an elevating electric furnace (third firing). After cooling to room temperature, it was ground using a jet mill under conditions of a processing speed of 5 kg/h, an introduction pressure of 0.30 MPa, and a grinding pressure of 0.15 MPa, to obtain lithium potassium sodium niobate particles.

<Analysis>

As a result of analyzing the components excluding lithium in the composition of the obtained lithium potassium sodium niobate by fluorescent X-ray using ZSX100e, manufactured by Rigaku Corporation, sodium was 24.92 mol %, potassium was 23.52 mol %, niobium was 51.56 mol %, the molar ratio ((Na+K)/Nb) of the total amount of sodium and potassium to niobium was 0.939, and the molar ratio (K/(Na+K)) of potassium to sodium and potassium was 0.486. Further, the molar ratio of lithium to niobium, as determined by measuring the content of each of lithium and niobium by ICP-AES analysis using ICPS-8100CL, manufactured by SHIMADZU CORPORATION, was 0.06. Therefore, the ratio ((Li+Na+K)/Nb) of alkali metals to niobium was calculated at 0.999, and the ratio (Li/(Li+Na+K)) of the number of moles of lithium to the number of moles of the alkali metals was calculated at 0.060, finally, as a result of which it was confirmed that the components reached the respective target compositions.

Further, the obtained lithium potassium sodium niobate was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 10 and FIG. 11.

Figure 10:
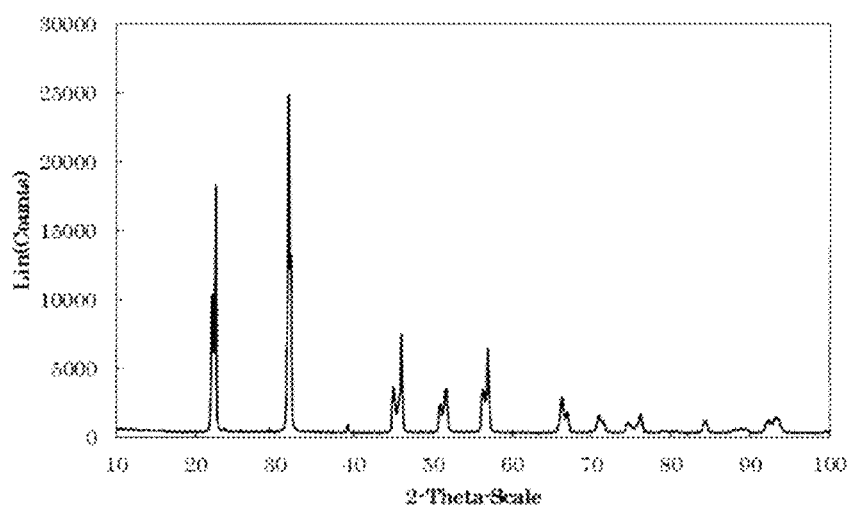
FIG. 10 is an XRD chart of a small-particle size filler produced in Production Example 1-5.
Figure 11:
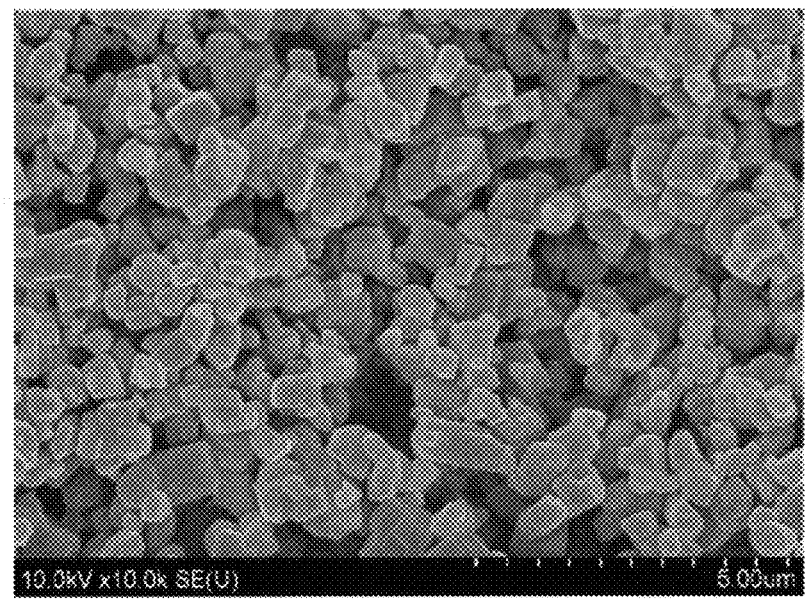
FIG. 11 is a SEM of the small-particle size filler produced in Production Example 1-5.

From the XRD chart of FIG. 10, it was confirmed that the obtained lithium potassium sodium niobate was in a single phase.

Figure 12:
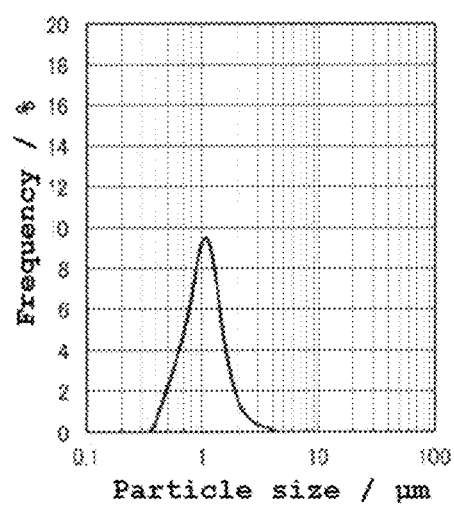
FIG. 12 is a particle size distribution curve of the small-particle size filler produced in Production Example 1-5.

Further, the D10, D50 (average particle size), and D90 of the obtained lithium potassium sodium niobate were measured using MT-3300EXII, manufactured by MicrotracBEL Corp. As a result, the D10 was 0.57 μm, the D50 was 0.98 μm, the D90 was 1.59 μm, and the SPAN ((D90−D10)/D50) was 1.05. Further, the obtained particle size distribution curve is shown in FIG. 12.

Further, the BET specific surface area of the obtained lithium potassium sodium niobate was measured using Macsorb HM model-1208, manufactured by Mountech Co., Ltd. As a result, the BET specific surface area was 2.67 m²/g.

Production Example 2-1

<Production of Large-Particle Size Filler>

With the target composition of each element as an oxide being set so that sodium was 25.00 mol %, potassium was 25.00 mol %, niobium was 50.00 mol %, the ratio ((Na+K)/Nb) of alkali metals to niobium was 1.000, and the ratio (K/(Na+K)) of potassium to the total alkali metals was 0.500, 4800 g of niobium pentoxide ($Nb_2O_5$, manufactured by SANWA KAKO CO., LTD.), 960 g of sodium carbonate ($Na_2CO_3$, manufactured by Tokuyama Corporation), and 1254 g of potassium carbonate (fine powder for food additives $K_2CO_3$, manufactured by Nippon Soda Co., Ltd.) were dry-mixed using a Henschel mixer (FM-20B, manufactured by NIPPON COKE & ENGINEERING CO., LTD.) under conditions of 2000 rpm and 2.5 minutes, to obtain a first firing raw material.

The first firing raw material thus obtained was fired at 700° C. for 7 hours using an elevating electric furnace (SLV-6060L-SP, manufactured by Motoyama Co., Ltd.). After cooling to room temperature, it was ground using a jet mill (STJ-200, manufactured by Seishin Enterprise Co., Ltd.) under conditions of a processing speed of 10 kg/h, an introduction pressure of 0.3 MPa, and a grinding pressure of 0.15 MPa, to obtain a first ground product.

As a result of analyzing the composition of each element of the first ground product as an oxide by fluorescent X-ray, sodium was 25.19 mol %, potassium was 24.75 mol %, niobium was 50.06 mol %, the ratio ((Na+K)/Nb) of alkali metals to niobium was 0.997, and the ratio (K/(Na+K)) of potassium to the total alkali metals was 0.496.

In order to finely adjust the ratio ((Na+K)/Nb) of alkali metals to niobium to 1.000 and the ratio (K/(Na+K)) of potassium to the total alkali metals to 0.500, 6 g of potassium carbonate was added to 6000 g of the first ground product, followed by dry-mixing using a Henschel mixer under conditions of 2000 rpm and 3 minutes, to obtain a second firing raw material.

The second firing raw material thus obtained was fired at 700° C. for 7 hours using an elevating electric furnace. After cooling to room temperature, it was ground using a jet mill under conditions of a processing speed of 10 kg/h, an introduction pressure of 0.3 MPa, and a grinding pressure of 0.15 MPa, to obtain a second ground product.

As a result of analyzing the composition of the second ground product by fluorescent X-ray, sodium was 25.11%, potassium was 24.86 mol %, niobium was 50.03 mol %, the ratio ((Na+K)/Nb) of alkali metals to niobium was 0.999, and the ratio (K/(Na+K)) of potassium to the total alkali metals was 0.497.

In order to further enhance the crystallization, the second ground product was fired at 900° C. for 15 hours using an elevating electric furnace. After cooling to room temperature, it was ground using a jet mill under conditions of a processing speed of 10 kg/h, an introduction pressure of 0.30 MPa, and a grinding pressure of 0.15 MPa, to obtain potassium sodium niobate particles.

<Analysis>

As a result of analyzing the composition of the obtained potassium sodium niobate (large-particle size), the ratio ((Na+K)/Nb) of alkali metals to niobium was 0.999, and the ratio (K/(Na+K)) of potassium to the total alkali metals was 0.497.

Further, the obtained potassium sodium niobate (large-particle size) was subjected to X-ray diffraction analysis (XRD) and scanning electron microscopy (SEM). The results are shown in FIG. 6 and FIG. 7.

Figure 6:
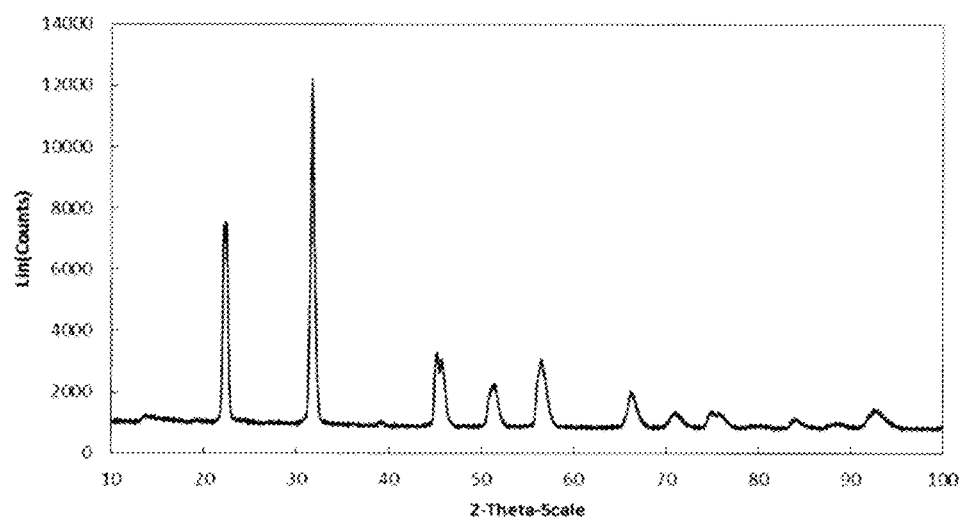
FIG. 6 is an XRD chart of a large-particle size filler produced in Production Example 2-1.
Figure 7:
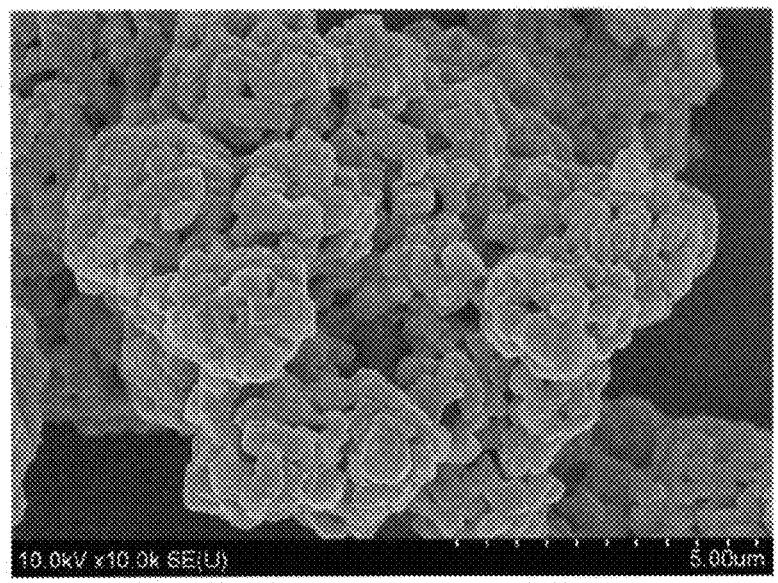
FIG. 7 is a SEM of the large-particle size filler produced in Production Example 2-1.

From the XRD chart of FIG. 6, it was confirmed that the obtained potassium sodium niobate (large-particle size) was in a single phase.

Figure 8:
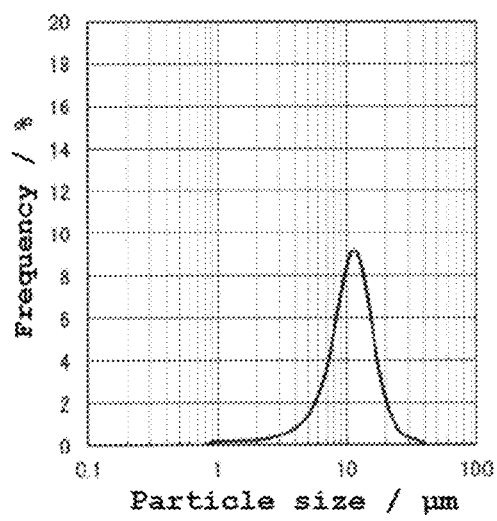
FIG. 8 is a particle size distribution curve of the large-particle size filler produced in Production Example 2-1.

Further, in the obtained potassium sodium niobate (large-particle size), the D10 was 4.97 μm, the D50 was 10.25 μm, the D90 was 16.49 μm, and the SPAN ((D90−D10)/D50) was 1.12. Further, the obtained particle size distribution curve is shown in FIG. 8.

Further, the BET specific surface area of the obtained potassium sodium niobate (large-particle size) was 1.06 m²/g.

Production Example 2-2

<Production of Large-Particle Size Filler>

The same procedure as in Production Example 2-1 was performed except that 4485 g of niobium pentoxide ($Nb_2O_5$, manufactured by SANWA KAKO CO., LTD.), 937 g of sodium carbonate ($Na_2CO_3$, manufactured by Tokuyama Corporation), and 1108 g of potassium carbonate (fine powder for food additives $K_2CO_3$, manufactured by Nippon Soda Co., Ltd.) were used as raw materials, in order to set the target composition of each element so that sodium was 26.25 mol %, potassium was 23.75 mol %, and the ratio (K/(Na+K)) of potassium to the total alkali metals was 0.475, instead of sodium being 25.00 mol %, potassium being 25.00 mol %, and the ratio (K/(Na+K)) of potassium to the total alkali metals being 0.500.

Various properties of the obtained potassium sodium niobate are shown in Table 3.

Preparation Example 2-3

<Production of Large-Particle Size Filler>

The same procedure as in Preparation Example 2-1 was performed except that 4485 g of niobium pentoxide ($Nb_2O_5$, manufactured by SANWA KAKO CO., LTD.), 981 g of sodium carbonate ($Na_2CO_3$, manufactured by Tokuyama Corporation), and 1050 g of potassium carbonate (fine powder for food additives $K_2CO_3$, manufactured by Nippon Soda Co., Ltd.) were used as raw materials, in order to set the target composition of each element so that sodium was 27.50 mol %, potassium was 22.50 mol %, and the ratio (K/(Na+K)) of potassium to the total alkali metals was 0.450, instead of sodium being 25.00 mol %, potassium being 25.00 mol %, and the ratio (K/(Na+K)) of potassium to the total alkali metals being 0.500.

Various properties of the obtained potassium sodium niobate are shown in Table 3.

Preparation Example 2-4

<Production of Large-Particle Size Filler>

The same procedure as in Preparation Example 1-1 was performed except that 4485 g of niobium pentoxide ($Nb_2O_5$, manufactured by SANWA KAKO CO., LTD.), 1026 g of sodium carbonate ($Na_2CO_3$, manufactured by Tokuyama Corporation), and 991 g of potassium carbonate (fine powder for food additives $K_2CO_3$, manufactured by Nippon Soda Co., Ltd.) were used as raw materials, in order to set the target composition of each element so that sodium was 8.75 mol %, potassium was 21.25 mol %, and the ratio (K/(Na+K)) of potassium to the total alkali metals was 0.425, instead of sodium being 25.00 mol %, potassium being 25.00 mol %, and the ratio (K/(Na+K)) of potassium to the total alkali metals being 0.500.

Various properties of the obtained potassium sodium niobate are shown in Table 3.

Preparation Example 2-5

<Production of Large-Particle Size Filler>

3503 g of niobium pentoxide ($Nb_2O_5$, manufactured by SANWA KAKO CO., LTD.), 672 g of sodium carbonate ($Na_2CO_3$, manufactured by Tokuyama Corporation), and 825 g of potassium carbonate (fine powder for food additives $K_2CO_3$, manufactured by Nippon Soda Co., Ltd.) were put into a Henschel mixer (FM-20B, manufactured by NIPPON COKE & ENGINEERING CO., LTD). At this time, in the put raw materials, sodium was 24.88 mol %, potassium was 23.44 mol %, niobium was 51.68 mol %, the ratio ((Li+Na+K)/Nb) of alkali metals to niobium was 0.935, and the ratio (K/(Na+K)) of potassium to sodium and potassium was 0.485, in terms of atoms. Subsequently, niobium pentoxide, sodium carbonate, and potassium carbonate put therein were dry-mixed using a Henschel mixer under conditions of 2000 rpm and 2.5 minutes, to obtain a first firing raw material.

The first firing raw material thus obtained was fired at 700° C. for 7 hours using an elevating electric furnace (SLV-6060L-SP, manufactured by Motoyama Co., Ltd.) (first firing). After cooling to room temperature, it was ground using a jet mill (STJ-200, manufactured by Seishin Enterprise Co., Ltd.) under conditions of a processing speed of 10 kg/h, an introduction pressure of 0.30 MPa, and a grinding pressure of 0.15 MPa, to obtain a first ground product.

As a result of analyzing the composition of the first ground product by fluorescent X-ray, sodium was 25.21 mol %, potassium was 23.05 mol %, niobium was 51.74 mol %, the ratio ((Li+Na+K)/Nb) of alkali metal elements to niobium was 0.933, and the ratio (K/(Na+K)) of potassium to sodium and potassium was 0.478.

In order to finely adjust the ratio ((Li+Na+K)/Nb) of alkali metals to niobium to 1.000 and the ratio (K/(Na+K)) of potassium to sodium and potassium to 0.480, 52.6 g of lithium carbonate ($Na_2CO_3$, manufactured by Ganfeng Lithium Co. Ltd.), 1.9 g of sodium carbonate, and 9.3 g of potassium carbonate were added to 4000 g of the first ground product, followed by dry-mixing using a Henschel mixer under conditions of 2000 rpm and 3 minutes, to obtain a second firing raw material.

The second firing raw material thus obtained was fired at 650° C. for 7 hours using an elevating electric furnace. After cooling to room temperature, it was ground using a jet mill under conditions of a processing speed of 10 kg/h, an introduction pressure of 0.3 MPa, and a grinding pressure of 0.15 MPa, to obtain a second ground product.

As a result of analyzing sodium, potassium, and niobium in the composition of the second ground product by fluorescent X-ray, sodium was 25.22 mol %, potassium was 23.27 mol %, niobium was 51.51 mol %, and the molar ratio (K/(Na+K)) of potassium to sodium and potassium was 0.480. Further, the molar ratio of lithium to niobium, as determined by measuring the content of each of lithium and niobium by ICP-AES analysis, was 0.06. From these results, the ratio ((Li+Na+K)/Nb) of alkali metals to niobium was calculated at 1.001, and the ratio (Li/(Li+Na+K)) of the number of moles of lithium to the number of moles of the alkali metals was calculated at 0.060.

In order to further enhance the crystallinity, the second ground product was fired at 900° C. for 10 hours using an elevating electric furnace (third firing). After cooling to room temperature, it was ground using a jet mill under conditions of a processing speed of 10 kg/h, an introduction pressure of 0.30 MPa, and a grinding pressure of 0.15 MPa, to obtain lithium potassium sodium niobate particles.

<Analysis>

As a result of analyzing the components excluding lithium in the composition of the obtained lithium potassium sodium niobate by fluorescent X-ray using ZSX100e, manufactured by Rigaku Corporation, sodium was 25.23 mol %, potassium was 23.25 mol %, niobium was 51.52 mol %, the molar ratio ((Na+K)/Nb) of the total amount of sodium and potassium to niobium was 0.941, and the molar ratio (K/(Na+K)) of potassium to sodium and potassium was 0.480. Further, the molar ratio of lithium to niobium, as determined by measuring the content of each of lithium and niobium by ICP-AES analysis using ICPS-8100CL, manufactured by SHIMADZU CORPORATION, was 0.06. Therefore, the ratio ((Li+Na+K)/Nb) of alkali metals to niobium was calculated at 0.999, and the ratio (Li/(Li+Na+K)) of the number of moles of lithium to the number of moles of the alkali metals was calculated at 0.060, finally, as a result of which it was confirmed that the components reached the respective target compositions.

Further, the obtained lithium potassium sodium niobate was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 13 and FIG. 14.

Figure 13:
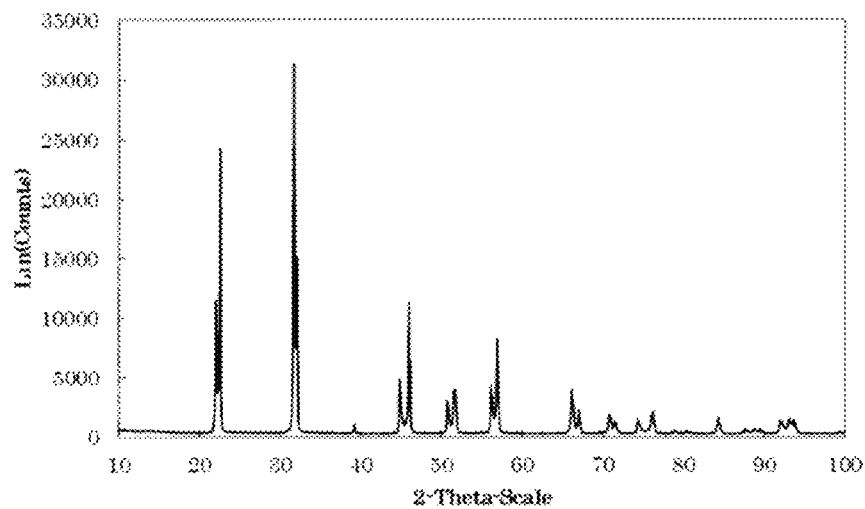
FIG. 13 is an XRD chart of a large-particle size filler produced in Production Example 2-5.
Figure 14:
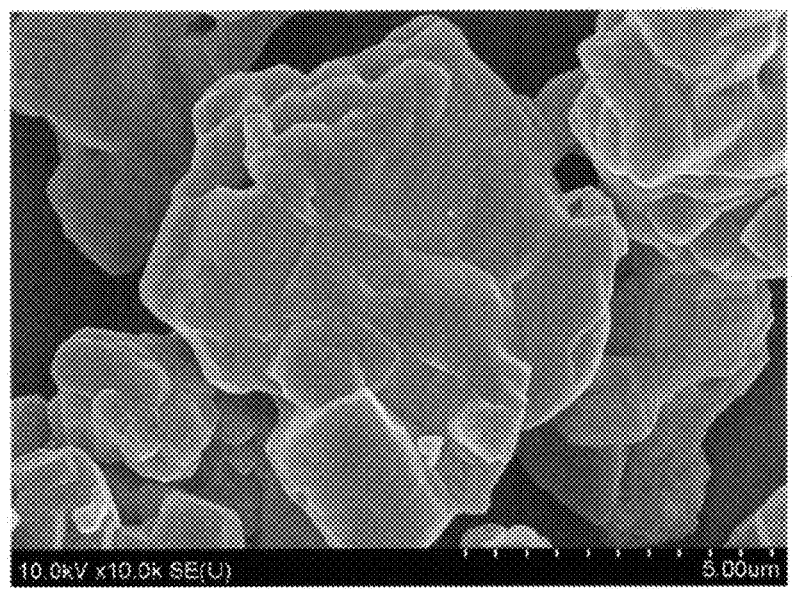
FIG. 14 is a SEM of the large-particle size filler produced in Production Example 2-5.

From the XRD chart of FIG. 13, it was confirmed that the obtained lithium potassium sodium niobate was in a single phase.

Figure 15:
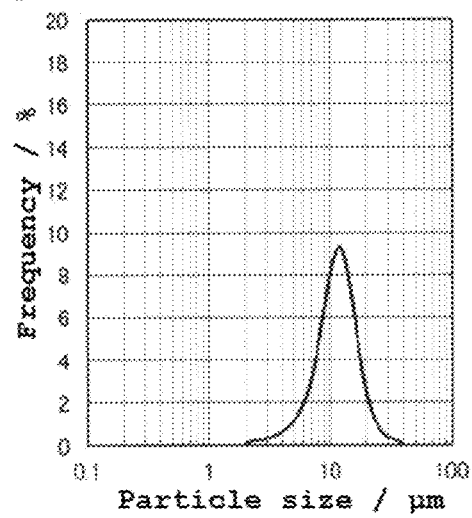
FIG. 15 is a particle size distribution curve of the large-particle size filler produced in Production Example 2-5.

Further, the D10, D50 (average particle size), and D90 of the obtained lithium potassium sodium niobate were measured using MT-3300EXII, manufactured by MicrotracBEL Corp. As a result, the D10 was 5.37 μm, the D50 was 10.71 μm, the D90 was 17.07 μm, and the SPAN ((D90−D10)/D50) was 1.09. Further, the obtained particle size distribution curve is shown in FIG. 15.

Further, the BET specific surface area of the obtained lithium potassium sodium niobate was measured using Macsorb HM model-1208, manufactured by Mountech Co., Ltd. As a result, the BET specific surface area was 0.66 $m^2$/g.

<Preparation of Mixed Composite Piezoelectric Material Filler>

The small-particle size potassium sodium niobate obtained in Production Example 1-1 and the large-particle size potassium sodium niobate obtained in Production Example 2-1 were mixed at a volume ratio of 40:60 (large-particle size:small-particle size), to obtain a composite piezoelectric material filler A.

Likewise, a mixed composite piezoelectric material filler B was obtained by combining Production Example 1-2 and Production Example 2-2, a mixed composite piezoelectric material filler C was obtained by combining Production Example 1-3 and Production Example 2-3, a mixed composite piezoelectric material filler D was obtained by combining Production Example 1-4 and Production Example 2-4, and mixed composite piezoelectric material fillers E and F were obtained by combining Production Example 1-5 and Production Example 2-5.

Figure 9:
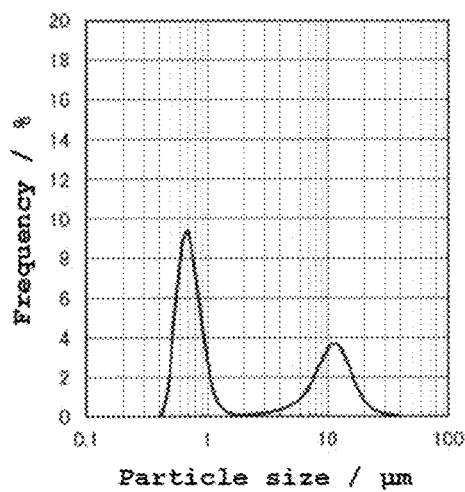
FIG. 9 is a particle size distribution curve of a mixed composite piezoelectric material filler A used in Example 11.
Figure 16:
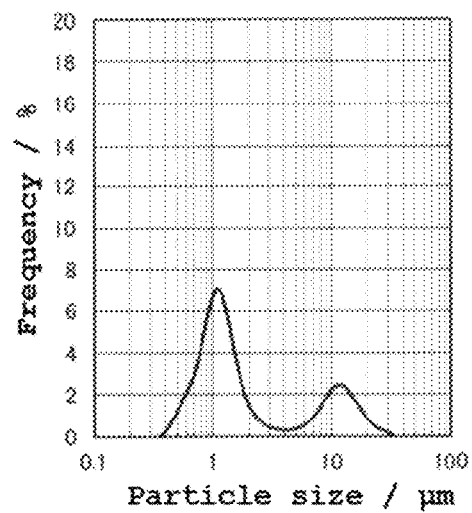
FIG. 16 is a particle size distribution curve of a mixed composite piezoelectric material filler E used in Example 19.
Figure 17:
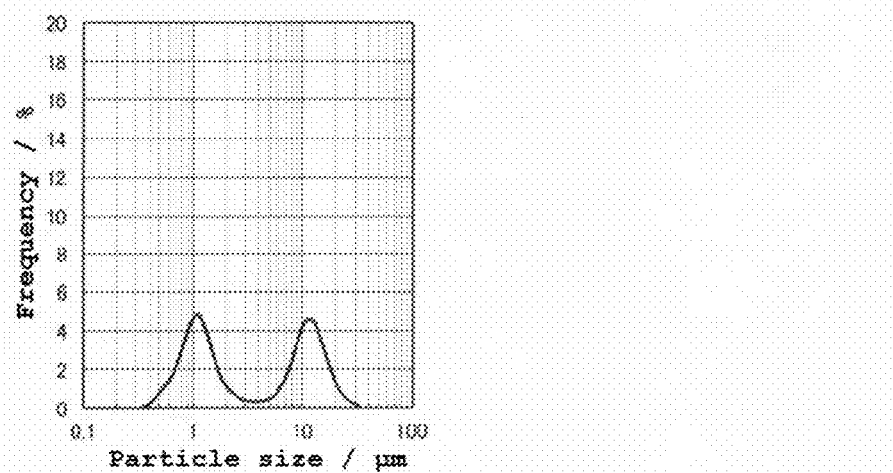
FIG. 17 is a particle size distribution curve of a mixed composite piezoelectric material filler F used in Example 20.

Subsequently, the particle size distributions of the obtained mixed composite piezoelectric material fillers A to F were measured. The particle size distribution curve of the mixed composite piezoelectric material filler A is shown in FIG. 9. The obtained particle size distribution curve showed a bimodal particle size distribution having a first peak on the small-particle size side and a second peak on the large-particle size side, where the peak top of the first peak was located at 0.69 μm, and the peak top of the second peak was located at 11.00 μm. Likewise, the particle size distribution curve of the mixed composite piezoelectric material filler E is shown in FIG. 16, and the particle size distribution curve of the mixed composite piezoelectric material filler is shown in FIG. 17. Each of them showed a bimodal particle size distribution having a first peak on the small-particle size side and a second peak on the large-particle size side. Various properties of them are shown in Table 4.

TABLE 2

| Small-particle size filler | Production Example 1-1 | Production Example 1-2 | Production Example 1-3 | Production Example 1-4 | Production Example 1-5 |
|---|---|---|---|---|---|
| (Li + K + Na)/Nb Molar ratio | 0.999 | 1.001 | 0.999 | 1.001 | 0.999 |
| K/(K + Na) Molar ratio | 0.498 | 0.473 | 0.448 | 0.423 | 0.486 |
| XRD | Single phase | Single phase | Single phase | Single phase | Single phase |
| Average particle size (D50) μm | 0.67 | 0.68 | 0.67 | 0.68 | 0.98 |
| D10 | 0.52 | 0.52 | 0.52 | 0.51 | 0.57 |
| D90 | 0.92 | 0.94 | 0.94 | 0.95 | 1.59 |
| SPAN | 0.60 | 0.62 | 0.62 | 0.64 | 1.05 |
| BET specific surface area m$^3$/g | 4.65 | 4.61 | 4.76 | 4.74 | 2.67 |

TABLE 3

| Large-particle size filler | Production Example 2-1 | Production Example 2-2 | Production Example 2-3 | Production Example 2-4 | Production Example 2-5 |
|---|---|---|---|---|---|
| (Li + K + Na)/Nb Molar ratio | 0.999 | 1.000 | 1.000 | 0.999 | 1.001 |
| K/(K + Na) Molar ratio | 0.497 | 0.474 | 0.445 | 0.422 | 0.480 |
| XRD | Single phase | Single phase | Single phase | Single phase | Single phase |
| Average particle size (D50) μm | 10.25 | 10.23 | 10.33 | 10.30 | 10.71 |
| D10 | 4.97 | 5.05 | 5.21 | 5.09 | 5.37 |
| D90 | 16.49 | 16.37 | 16.56 | 16.54 | 17.07 |
| SPAN | 1.12 | 1.11 | 1.10 | 1.11 | 1.09 |
| BET specific surface area m$^3$/g | 1.06 | 1.02 | 1.06 | 1.02 | 0.66 |

TABLE 4

| Composite piezoelectric material filler | A | B | C | D | E | F |
|---|---|---|---|---|---|---|
| Small-particle size filler | Production Example 1-1 | Production Example 1-2 | Production Example 1-3 | Production Example 1-4 | Production Example 1-5 | Production Example 1-5 |
| Large-particle size filler | Production Example 2-1 | Production Example 2-2 | Production Example 2-3 | Production Example 2-4 | Production Example 2-5 | Production Example 2-5 |
| Volume ratio (large-particle size:small-particle size) | 40:60 | 40:60 | 40:60 | 40:60 | 40:60 | 60:40 |
| First peak top position (μm) | 0.69 | 0.69 | 0.69 | 0.69 | 1.06 | 1.06 |
| Second peak top position (μm) | 11.00 | 11.00 | 11.00 | 11.00 | 12.00 | 12.00 |
| B/A* | 0.39 | 0.39 | 0.39 | 0.39 | 0.35 | 0.94 |

*A: Frequency (%) of the particle size at the first peak top, and B: Frequency (%) of the particle size at the second peak top

Examples 11 to 20

<Fabrication of Composite Piezoelectric Material and Composite Piezoelectric Device>

A composite piezoelectric material filler was kneaded with an epoxy resin so that the volume fractions of the polymer matrix and the composite piezoelectric material filler were as shown in Table 5, to obtain an epoxy resin composition. The epoxy resin used herein was composed of 99 mass % of a thermosetting epoxy resin (product name: JER® 828EL, manufactured by Mitsubishi Chemical Corporation, with a molecular weight of about 370, a specific gravity of 1.17, and a nominal viscosity at 25° C. of 120 to 150 P), and 1 mass % of an imidazole curing accelerator (product name: 2E4MZ, manufactured by SHIKOKU CHEMICALS CORPORATION). The obtained epoxy resin composition was cured at 140° C. for 5 hours to fabricate a plate composite piezoelectric material with a thickness of 0.6 mm. Subsequently, 30-nm thick platinum films were formed as electrodes on both surfaces of the obtained composite piezoelectric material by vapor deposition, and thereafter −8.0 kV was applied thereto using a corona discharge system (ELC-01N, manufactured by ELEMENT Co., Ltd.) for 30 minutes, to obtain a composite piezoelectric device polarized in the thickness direction.

The piezoelectric constant ($d_{33}$), the relative permittivity, and the dielectric loss of the obtained composite piezoelectric device were measured by the following measurement methods. Further, the piezoelectric constant ($g_{33}$) was determined by calculation using the piezoelectric constant ($d_{33}$) and the relative permittivity obtained. The results are shown in Table 5.

(Measurement Method)

<Piezoelectric Constant ($d_{33}$)>

The composite piezoelectric device was set in the force head of a piezometer system (PM200, manufactured by Piezo Test Ltd.) in the thickness direction, and the static force was adjusted to 5 N. The $d_{33}$ was measured with a vibration frequency of 110 Hz and a force of 0.25 N.

<Relative Permittivity and Dielectric Loss>

Using an impedance analyzer (1255B, manufactured by Solartron Analytical) and an interface (1296, manufactured by Solartron Analytical), the relative permittivity and the dielectric loss at a frequency of 100 Hz and an applied voltage of 1 V were measured.

Examples 21 to 26

<Fabrication of Composite Piezoelectric Material and Composite Piezoelectric Device>

The small-particle size filler and the large-particle size filler obtained in each of Production Examples were kneaded with a polymer matrix, so that the volume fractions of the small-particle size filler and the large-particle size filler were as shown in Table 6, by first kneading the small-particle size filler with an epoxy resin and then kneading the large-particle size filler, to obtain an epoxy resin composition. The epoxy resin used herein was composed of 99 mass % of a thermosetting epoxy resin (product name: JER® 828EL, manufactured by Mitsubishi Chemical Corporation, with a molecular weight of about 370, a specific gravity of 1.17, and a nominal viscosity at 25° C. of 120 to 150 P), and 1 mass % of an imidazole curing accelerator (product name: 2E4MZ, manufactured by SHIKOKU CHEMICALS CORPORATION). The obtained epoxy resin composition was cured at 140° C. for 5 hours to fabricate a plate composite piezoelectric material with a thickness of 0.6 mm. Subsequently, 30-nm thick platinum films were formed as electrodes on both surfaces of the obtained composite piezoelectric material by vapor deposition, and thereafter −8.0 kV was applied thereto using a corona discharge system (ELC-01N, manufactured by ELEMENT Co., Ltd.) for 30 minutes, to obtain a composite piezoelectric device polarized in the thickness direction.

The piezoelectric constant ($d_{33}$), the relative permittivity, and the dielectric loss of the obtained composite piezoelectric device were measured by the following measurement methods. Further, the piezoelectric constant ($g_{33}$) was determined by calculation using the piezoelectric constant ($d_{33}$) and the relative permittivity obtained. The results are shown in Table 6.

TABLE 5

| | Example 11 | Example 12 | Example 13 | Example 14 | Example 15 | Example 16 | Example 17 | Example 18 | Example 19 | Example 20 |
|---|---|---|---|---|---|---|---|---|---|---|
| Composite piezoelectric material | | | | | | | | | | |
| Composite piezoelectric material filler | A | B | C | D | A | B | C | D | E | F |
| Filler content (vol %) | 40 | 40 | 40 | 40 | 50 | 50 | 50 | 50 | 50 | 50 |
| Matrix (vol %) | 60 | 60 | 60 | 60 | 50 | 50 | 50 | 50 | 50 | 50 |
| Composite piezoelectric device | | | | | | | | | | |
| Piezoelectric constant $d_{33}$ pC/N | 2.92 | 3.45 | 1.59 | 0.85 | 6.72 | 7.31 | 3.51 | 1.21 | 3.30 | 5.48 |
| Piezoelectric constant $g_{33} \times 10^{-3}$ V·m/N | 11.6 | 13.9 | 6.3 | 3.5 | 17.3 | 19.9 | 9.4 | 3.7 | 9.1 | 12.4 |
| Relative permittivity | 28.4 | 28.0 | 28.7 | 27.1 | 43.8 | 41.5 | 42.2 | 37.2 | 41.1 | 49.9 |
| Dielectric loss | 0.007 | 0.007 | 0.008 | 0.007 | 0.010 | 0.009 | 0.009 | 0.007 | 0.009 | 0.012 |

TABLE 6

|  | Example 21 | Example 22 | Example 23 | Example 24 | Example 25 | Example 26 |
|---|---|---|---|---|---|---|
| Composite piezoelectric material | | | | | | |
| Small-particle size filler | Production Example 1-1 | Production Example 1-2 | Production Example 1-3 | Production Example 1-4 | Production Example 1-5 | Production Example 1-5 |
| Large-particle size filler | Production Example 2-1 | Production Example 2-2 | Production Example 2-3 | Production Example 2-4 | Production Example 2-5 | Production Example 2-5 |
| Volume ratio (large-particle size:small-particle size) | 40:60 | 40:60 | 40:60 | 40:60 | 40:60 | 60:40 |
| Filler content (vol %) | 40 | 40 | 40 | 40 | 50 | 50 |
| Matrix (vol %) | 60 | 60 | 60 | 60 | 50 | 50 |
| Composite piezoelectric device | | | | | | |
| Piezoelectric constant $d_{33}$ pC/N | 3.00 | 3.50 | 1.79 | 0.81 | 3.45 | 5.75 |
| Piezoelectric constant $g_{33} \times 10^{-3}$ V·m/N | 11.8 | 14.1 | 7.0 | 3.4 | 9.4 | 12.8 |
| Relative permittivity | 28.6 | 28.1 | 28.9 | 26.8 | 41.6 | 50.6 |
| Dielectric loss | 0.007 | 0.008 | 0.007 | 0.007 | 0.009 | 0.013 |

Comparative Examples 11 to 18

<Fabrication of Composite Piezoelectric Material and Composite Piezoelectric Device>

The small-particle size filler or the large-particle size filler obtained in each of Production Examples was kneaded with an epoxy resin so that the volume fractions of the small-particle size filler or the large-particle size filler and the polymer matrix were as shown in Table 7, to obtain an epoxy resin composition. The epoxy resin used herein was composed of 99 mass % of a thermosetting epoxy resin (product name: JER® 828EL, manufactured by Mitsubishi Chemical Corporation, with a molecular weight of about 370, a specific gravity of 1.17, and a nominal viscosity at 25° C. of 120 to 150 P), and 1 mass % of an imidazole curing accelerator (product name: 2E4MZ, manufactured by SHIKOKU CHEMICALS CORPORATION). The obtained epoxy resin composition was cured at 140° C. for 5 hours to fabricate a plate composite piezoelectric material with a thickness of 0.6 mm. Subsequently, 30-nm thick platinum films were formed as electrodes on both surfaces of the obtained composite piezoelectric material by vapor deposition, and thereafter −8.0 kV was applied thereto using a corona discharge system (ELC-01N, manufactured by ELEMENT Co., Ltd.) for 30 minutes, to obtain a composite piezoelectric device polarized in the thickness direction.

The piezoelectric constant ($d_{33}$), the relative permittivity, and the dielectric loss of the obtained composite piezoelectric device were measured by the following measurement methods. Further, the piezoelectric constant ($g_{33}$) was determined by calculation using the piezoelectric constant ($d_{33}$) and the relative permittivity obtained. The results are shown in Table 7.

TABLE 7

|  | Comparative Example 11 | Comparative Example 12 | Comparative Example 13 | Comparative Example 14 | Comparative Example 15 | Comparative Example 16 | Comparative Example 17 | Comparative Example 18 |
|---|---|---|---|---|---|---|---|---|
| Composite piezoelectric material | | | | | | | | |
| Filler used | Production Example 1-1 | Production Example 1-2 | Production Example 1-3 | Production Example 1-4 | Production Example 2-1 | Production Example 2-2 | Production Example 2-3 | Production Example 2-4 |
| Filler content (vol %) | 40 | 40 | 40 | 40 | 25 | 25 | 25 | 25 |
| Matrix (vol %) | 60 | 60 | 60 | 60 | 75 | 75 | 75 | 75 |
| Composite piezoelectric device | | | | | Device x | Device x | Device x | Device x |
| Piezoelectric constant $d_{33}$ pC/N | 0.26 | 0.55 | 0.30 | 0.12 | | | | |
| Piezoelectric constant $g_{33} \times 10^{-3}$ V·m/N | 1.3 | 2.7 | 1.5 | 0.6 | | | | |
| Relative permittivity | 22.0 | 23.1 | 22.3 | 22.8 | | | | |
| Dielectric loss | 0.007 | 0.006 | 0.007 | 0.007 | | | | |

*) In the table, "Device x" indicates that kneading of the epoxy resin and the filler was difficult, making it impossible to fabricate any device.
*) In the table, "Device x" indicates that kneading of the epoxy resin and the filler was difficult, making it impossible to fabricate any device.

Example 31

<Production of Potassium Sodium Niobate>

4485 g of niobium pentoxide ($Nb_2O_5$, manufactured by Jiujiang Tanbre Co., Ltd.), 893 g of sodium carbonate ($Na_2CO_3$, manufactured by Tokuyama Corporation), and 1160 g of potassium carbonate (fine powder for food additives K$_2$CO$_3$, manufactured by Nippon Soda Co., Ltd.) were put into a Henschel mixer (FM-20B, manufactured by NIPPON COKE & ENGINEERING CO., LTD). At this time, in the put raw materials, sodium was 25.00 mol %, potassium was 25.00 mol %, niobium was 50.00 mol %, the ratio ((Na+K)/Nb) of alkali metals to niobium was 1.000, and the ratio (K/(Na+K)) of potassium to sodium and potassium was 0.500, in terms of atoms. Subsequently, niobium pentoxide, sodium carbonate, and potassium carbonate put therein were dry-mixed using a Henschel mixer under conditions of 2000 rpm and 2.5 minutes, to obtain a first firing raw material.

The first firing raw material thus obtained was fired at 650° C. for 7 hours using an elevating electric furnace (SLV-6060L-SP, manufactured by Motoyama Co., Ltd.) (first firing). After cooling to room temperature, it was ground using a jet mill (STJ-200, q Seishin Enterprise Co., Ltd.) under conditions of a processing speed of 6 kg/h, an introduction pressure of 0.6 MPa, and a grinding pressure of 0.5 MPa, to obtain a first ground product.

As a result of analyzing the composition of the first ground product by fluorescent X-ray, sodium was 25.18 mol %, potassium was 24.57 mol %, niobium was 50.25 mol %, the ratio ((Na+K)/Nb) of alkali metals to niobium was 0.990, and the ratio (K/(Na+K)) of potassium to sodium and potassium was 0.494.

In order to finely adjust the ratio ((Na+K)/Nb) of alkali metals to niobium to 1.000 and the ratio (K/(Na+K)) of potassium to sodium and potassium to 0.500, 27 g of potassium carbonate was added to 5500 g of the first ground product, followed by dry-mixing using a Henschel mixer under conditions of 2000 rpm and 3 minutes, to obtain a second firing raw material.

The second firing raw material thus obtained was fired at 650° C. for 7 hours using an elevating electric furnace (second firing). After cooling to room temperature, it was ground using a jet mill under conditions of a processing speed of 10 kg/h, an introduction pressure of 0.6 MPa, and a grinding pressure of 0.5 MPa, to obtain a second ground product.

As a result of analyzing the composition of the second ground product by fluorescent X-ray, sodium was 25.10%, potassium was 24.95 mol %, niobium was 49.96 mol %, the ratio ((Na+K)/Nb) of alkali metals to niobium was 1.002, and the ratio (K/(Na+K)) of potassium to sodium and potassium was 0.498.

In order to further enhance the crystallinity, the second ground product was fired at 900° C. for 15 hours using an elevating electric furnace (third firing). After cooling to room temperature, it was ground using a jet mill under conditions of a processing speed of 5 kg/h, an introduction pressure of 0.30 MPa, and a grinding pressure of 0.15 MPa, to obtain potassium sodium niobate particles.

<Analysis>

As a result of analyzing the composition of the obtained potassium sodium niobate by fluorescent X-ray using ZSX100e, manufactured by Rigaku Corporation, the ratio ((Na+K)/Nb) of alkali metals to niobium was 0.999, and the ratio (K/(Na+K)) of potassium to the total alkali metals was 0.498. From the aforementioned results, the difference from 0.500 that was the ratio (K/(Na+K)) of potassium to sodium and potassium in the first firing raw material was 0.002.

Further, the obtained potassium sodium niobate was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 18 and FIG. 19.

Figure 18:
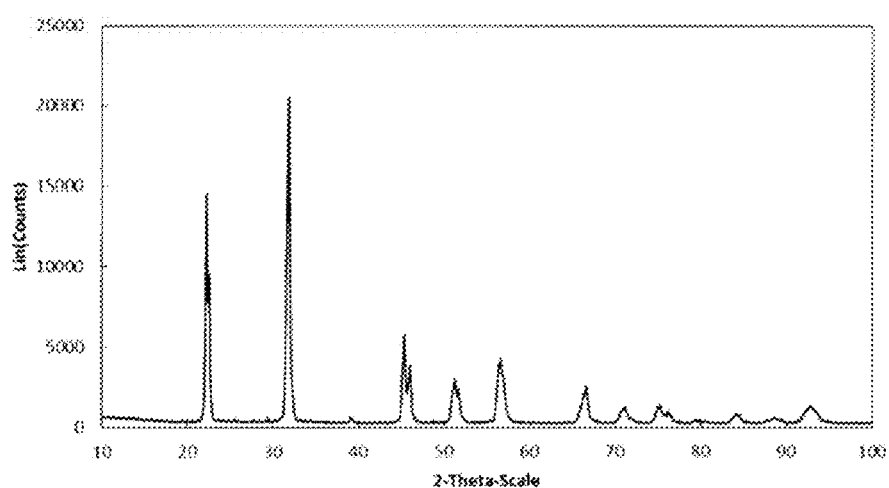
FIG. 18 is an XRD chart of potassium sodium niobate obtained in Example 31.
Figure 19:
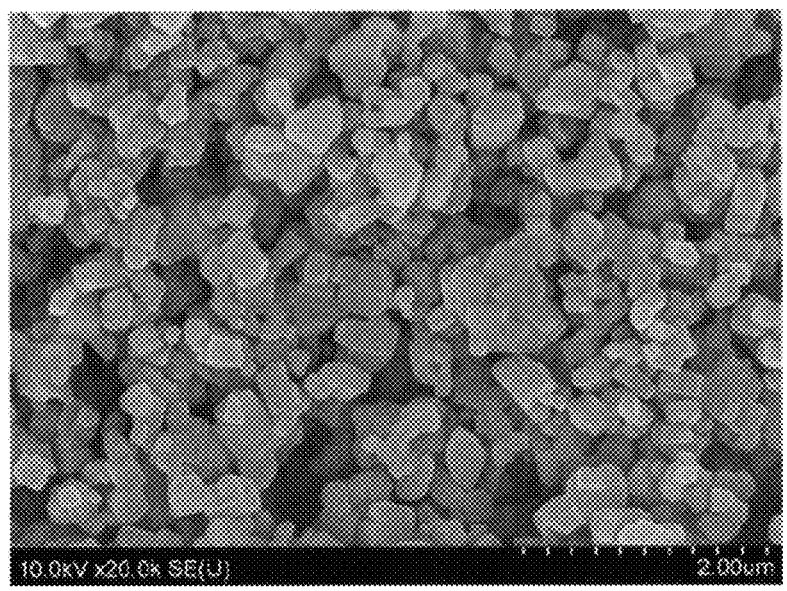
FIG. 19 is a SEM of the potassium sodium niobate obtained in Example 31.

From the XRD chart of FIG. 18, it was confirmed that the obtained potassium sodium niobate was in a single phase.

Further, the particle size distribution of the obtained potassium sodium niobate was measured using MT-3300EXII, manufactured by MicrotracBEL Corp. As a result, the average particle size D50 was 0.67 µm.

Further, the BET specific surface area of the obtained potassium sodium niobate was measured using Macsorb HM model-1208, manufactured by Mountech Co., Ltd. As a result, the BET specific surface area was 4.65 m$^2$/g.

Example 32

The same procedure as in Example 31 was performed except that 4485 g of niobium pentoxide (Nb$_2$O$_5$, manufactured by Jiujiang Tanbre Co., Ltd.), 937 g of sodium carbonate (Na$_2$CO$_3$, manufactured by Tokuyama Corporation), and 1108 g of potassium carbonate (fine powder for food additives K$_2$CO$_3$, manufactured by Nippon Soda Co., Ltd.) were used as raw materials. At this time, in the put raw materials, sodium was 26.25 mol %, potassium was 23.75 mol %, niobium was 50.00 mol %, the ratio ((Na+K)/Nb) of alkali metals to niobium was 1.000, and the ratio (K/(Na+ K)) of potassium to sodium and potassium was 0.475, in terms of atoms.

In the obtained potassium sodium niobate, the ratio ((Na+ K)/Nb) of alkali metals to niobium was 1.001, and the ratio (K/(Na+K)) of potassium to the total alkali metals was 0.473. From the aforementioned results, the difference from 0.475 that was the ratio (K/(Na+K)) of potassium to sodium and potassium in the first firing raw material was 0.002. Further, from the X-ray diffraction analysis, it was in a single phase, the average particle size (D50) was 0.68 µm, and the BET specific surface area was 4.61 m$^2$/g.

Example 33

The same procedure as in Example 31 was performed except that 4485 g of niobium pentoxide (Nb$_2$O$_5$, manufactured by Jiujiang Tanbre Co., Ltd.), 981 g of sodium carbonate (Na$_2$CO$_3$, manufactured by Tokuyama Corporation), and 1050 g of potassium carbonate (fine powder for food additives K$_2$CO$_3$, manufactured by Nippon Soda Co., Ltd.) were used as raw materials. At this time, in the put raw materials, sodium was 27.50 mol %, potassium was 22.50 mol %, niobium was 50.00 mol %, the ratio ((Na+K)/Nb) of alkali metals to niobium was 1.000, and the ratio (K/(Na+ K)) of potassium to sodium and potassium was 0.450, in terms of atoms.

In the obtained potassium sodium niobate, the ratio ((Na+ K)/Nb) of alkali metals to niobium was 0.999, and the ratio (K/(Na+K)) of potassium to the total alkali metals was 0.448. From the aforementioned results, the difference from 0.450 that was the ratio (K/(Na+K)) of potassium to sodium and potassium in the first firing raw material was 0.002. Further, from the X-ray diffraction analysis, it was in a single phase, the average particle size (D50) was 0.67 µm, and the BET specific surface area was 4.76 m$^2$/g.

Example 34

The same procedure as in Example 31 was performed except that 4485 g of niobium pentoxide (Nb$_2$O$_5$, manufactured by Jiujiang Tanbre Co., Ltd.), 1026 g of sodium carbonate ($Na_2CO_3$, manufactured by Tokuyama Corporation), and 991 g of potassium carbonate (fine powder for food additives $K_2CO_3$, manufactured by Nippon Soda Co., Ltd.) were used as raw materials. At this time, in the put raw materials, sodium was 28.75 mol %, potassium was 21.25 mol %, niobium was 50.00 mol %, the ratio ((Na+K)/Nb) of alkali metals to niobium was 1.000, and the ratio (K/(Na+K)) of potassium to sodium and potassium was 0.425, in terms of atoms.

In the obtained potassium sodium niobate, the ratio ((Na+K)/Nb) of alkali metals to niobium was 1.001, and the ratio (K/(Na+K)) of potassium to the total alkali metals was 0.424. From the aforementioned results, the difference from 0.425 that was the ratio (K/(Na+K)) of potassium to sodium and potassium in the first firing raw material was 0.001. Further, from the X-ray diffraction analysis, it was in a single phase, the average particle size (D50) was 0.68 μm, and the BET specific surface area was 4.74 $m^2/g$.

Comparative Example 31

A firing raw material that was the same as the first firing raw material of Example 31 was obtained.

The obtained firing raw material was fired at 900° C. for 15 hours using an elevating electric furnace (SLV-6060L-SP, manufactured by Motoyama Co., Ltd.). After cooling to room temperature, it was ground using a jet mill (STJ-200, manufactured by Seishin Enterprise Co., Ltd.) under conditions of a processing speed of 5 kg/h, an introduction pressure of 0.30 MPa, and a grinding pressure of 0.15 MPa, to obtain potassium sodium niobate particles.

In the obtained potassium sodium niobate, the ratio ((Na+K)/Nb) of alkali metals to niobium was 0.987, and the ratio (K/(Na+K)) of potassium to sodium and potassium was 0.493, thus failing to achieve the target compositions. From the X-ray diffraction analysis, it was confirmed that the potassium sodium niobate was in a single phase, the average particle size (D50) was 0.96 μm, and the BET specific surface area was 2.93 $m^2/g$.

Example 35

The same procedure as in Example 31 was performed except that 4983 g of niobium pentoxide ($Nb_2O_5$, manufactured by Jiujiang Tanbre Co., Ltd.) and 1991 g of sodium carbonate ($Na_2CO_3$, manufactured by Tokuyama Corporation) were used as raw materials, the firing temperature in the first firing and the second firing was set to 570° C., and the firing temperature in the third firing was set to 590° C. At this time, in the first firing raw material, sodium was 50.00 mol %, niobium was 50.00 mol %, the ratio (Na/Nb) of alkali metals to niobium was 1.000, and the ratio (K/(Na+K)) of potassium to sodium and potassium was 0, in terms of atoms.

In the obtained sodium niobate, the ratio (Na/Nb) of alkali metals to niobium was 1.001, and the ratio (K/(Na+K)) of potassium to sodium and potassium was 0. Further, from the X-ray diffraction analysis, it was in a single phase, the average particle size (D50) was 0.61 μm, and the BET specific surface area was 5.31 $m^2/g$.

Example 36

The same procedure as in Example 31 was performed except that 2647 g of niobium pentoxide ($Nb_2O_5$, manufactured by Jiujiang Tanbre Co., Ltd.) and 1377 g of potassium carbonate (fine powder for food additives $K_2CO_3$, manufactured by Nippon Soda Co., Ltd.) were used as raw materials, the firing conditions in the second firing were changed to 800° C. and 15 h, and the procedure up to the second grinding was performed. At this time, in the first firing raw material, potassium was 50.00 mol %, niobium was 50.00 mol %, the ratio (K/Nb) of alkali metals to niobium was 1.000, and the ratio (K/(Na+K)) of potassium to sodium and potassium was 1, in terms of atoms.

In the obtained potassium niobate, the ratio (K/Nb) of alkali metals to niobium was 1.002, and the ratio (K/(Na+K)) of potassium to sodium and potassium was 1.000. Further, from the X-ray diffraction analysis, it was in a single phase, the average particle size (D50) was 0.64 μm, and the BET specific surface area was 4.33 $m^2/g$.

Example 37

<Production of Lithium Sodium Lithium Niobate>

3508 g of niobium pentoxide ($Nb_2O_5$, manufactured by Jiujiang Tanbre Co., Ltd.), 670 g of sodium carbonate ($Na_2CO_3$, manufactured by Tokuyama Corporation), and 822 g of potassium carbonate (fine powder for food additives $K_2CO_3$, manufactured by Nippon Soda Co., Ltd.) were put into a Henschel mixer (FM-20B, manufactured by NIPPON COKE & ENGINEERING CO., LTD). At this time, in the put raw materials, sodium was 24.44 mol %, potassium was 22.56 mol %, niobium was 50.00 mol %, the ratio ((Na+K)/Nb) of alkali metals to niobium was 0.940, and the ratio (K/(Na+K)) of potassium to sodium and potassium was 0.480, in terms of atoms. Subsequently, niobium pentoxide, sodium carbonate, and potassium carbonate put therein were dry-mixed using a Henschel mixer under conditions of 2000 rpm and 2.5 minutes, to obtain a first firing raw material.

The first firing raw material thus obtained was fired at 650° C. for 7 hours using an elevating electric furnace (SLV-6060L-SP, manufactured by Motoyama Co., Ltd.) (first firing). After cooling to room temperature, it was ground using a jet mill (STJ-200, manufactured by Seishin Enterprise Co., Ltd.) under conditions of a processing speed of 6 kg/h, an introduction pressure of 0.6 MPa, and a grinding pressure of 0.5 MPa, to obtain a first ground product.

As a result of analyzing the composition of the first ground product by fluorescent X-ray, sodium was 25.06 mol %, potassium was 23.28 mol %, niobium was 51.66 mol %, the ratio ((Li+Na+K)/Nb) of alkali metal to niobium was 0.936, and the ratio (K/(Na+K)) of potassium to sodium and potassium was 0.482.

In order to finely adjust the ratio ((Li+Na+K)/Nb) of alkali metals to niobium to 1.000 and the ratio (K/(Na+K)) of potassium to sodium and potassium to 0.480, 54.7 g of lithium carbonate ($Li_2CO_3$, manufactured by Ganfeng Lithium Co. Ltd.), 5.0 g of sodium carbonate, and 0.9 g of potassium carbonate were added to 4217 g of the first ground product, followed by dry-mixing using a Henschel mixer under conditions of 2000 rpm and 3 minutes, to obtain a second firing raw material.

The second firing raw material thus obtained was fired at 550° C. for 7 hours using an elevating electric furnace (second firing). After cooling to room temperature, it was ground using a jet mill under conditions of a processing speed of 10 kg/h, an introduction pressure of 0.6 MPa, and a grinding pressure of 0.5 MPa, to obtain a second ground product.

As a result of analyzing sodium, potassium, and niobium in the composition of the second ground product by fluorescent X-ray, sodium was 25.18 mol %, potassium was 23.25 mol %, niobium was 51.58 mol %, the molar ratio ((Na+K)/Nb) of the total amount of sodium and potassium to niobium was 0.939, the number of moles of potassium to the number of moles of sodium and potassium (K/(Na+K)) was 0.480. Further, the molar ratio of lithium to niobium, as determined by measuring the content of each of lithium and niobium by ICP-AES analysis, was 0.06. From these results, the ratio ((Li+Na+K)/Nb) of alkali metals to niobium was calculated at 0.999, and the ratio (Li/(Li+Na+K)) of the number of moles of lithium to the number of moles of the alkali metals was calculated at 0.060.

In order to further enhance the crystallinity, the second ground product was fired at 900° C. for 15 hours using an elevating electric furnace (third firing). After cooling to room temperature, it was ground using a jet mill under conditions of a processing speed of 5 kg/h, an introduction pressure of 0.30 MPa, and a grinding pressure of 0.15 MPa, to obtain lithium potassium sodium niobate particles.

<Analysis>

As a result of analyzing the components excluding lithium in the composition of the obtained lithium potassium sodium niobate by fluorescent X-ray using ZSX100e, manufactured by Rigaku Corporation, sodium was 25.18%, potassium was 23.25 mol %, niobium was 51.58 mol %, the molar ratio ((Na+K)/Nb) of the total amount of sodium and potassium to niobium was 0.939, and the number of moles of potassium to the number of moles of sodium and potassium (K/(Na+K)) was 0.480. Further, the molar ratio of lithium to niobium, as determined by measuring the content of each of lithium and niobium by ICP-AES analysis using ICPS-8100CL, manufactured by SHIMADZU CORPORATION, was 0.06. Therefore, the ratio ((Li+Na+K)/Nb) of alkali metals to niobium was calculated at 0.999, and the ratio (Li/(Li+Na+K)) of the number of moles of lithium to the number of moles of the alkali metals was calculated at 0.060, finally, as a result of which it was confirmed that the components reached the respective target compositions.

Further, the obtained lithium potassium sodium niobate was subjected to X-ray diffraction analysis (XRD) using UltimaIV, manufactured by Rigaku Corporation, and scanning electron microscopy (SEM) using S-4800, manufactured by Hitachi High-Technologies Corporation. The results are shown in FIG. 20 and FIG. 21.

Figure 20:
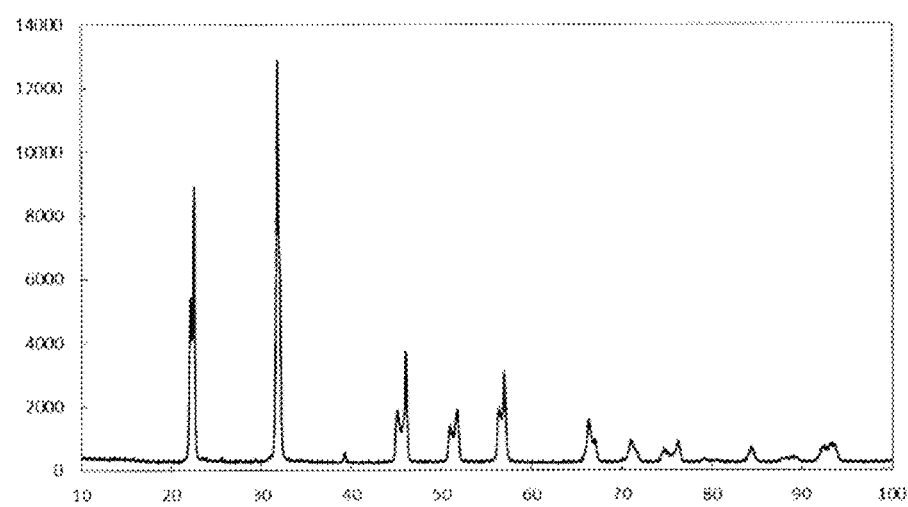
FIG. 20 is an XRD chart of lithium potassium sodium niobate obtained in Example 37.
Figure 21:
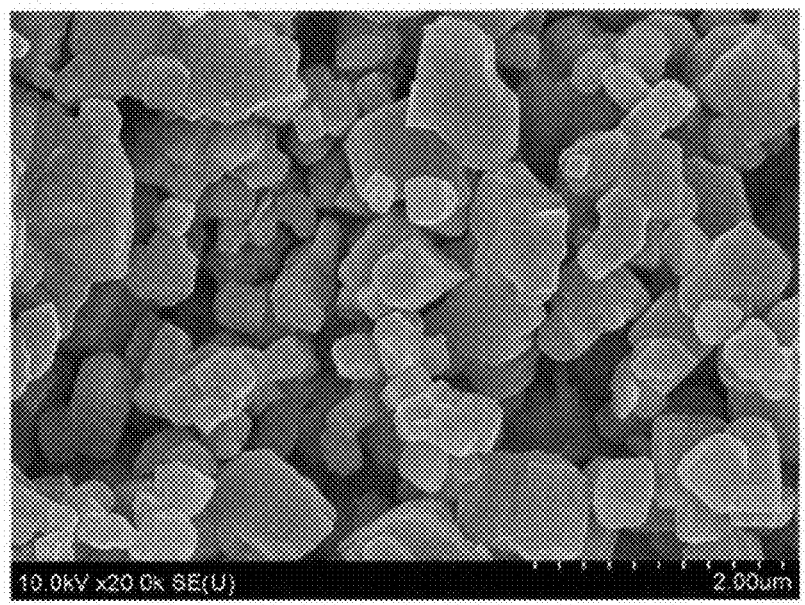
FIG. 21 is a SEM of the lithium potassium sodium niobate obtained in Example 37.

From the XRD chart of FIG. 20, it was confirmed that the obtained lithium potassium sodium niobate was in a single phase.

Further, the particle size distribution of the obtained lithium potassium sodium niobate was measured using MT-3300EXII, manufactured by MicrotracBEL Corp. As a result, the average particle size D50 was 1.01 μm.

Further, the BET specific surface area of the obtained lithium potassium sodium niobate was measured using Macsorb HM model-1208, manufactured by Mountech Co., Ltd. As a result, the BET specific surface area was 2.63 m²/g.

The invention claimed is:

1. A composite piezoelectric material comprising:
a polymer matrix; and
a composite piezoelectric material filler dispersed in the polymer matrix, wherein
the composite piezoelectric material filler comprises:
  a small-particle size filler comprising an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li; and
  a large-particle size filler comprising an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li,
a total content of the small-particle size filler and the large-particle size filler is 20 to 80 vol % based on the entire composite piezoelectric material,
the small-particle size filler has an average particle size (D50) of 0.1 to 1.2 μm,
the large-particle size filler has an average particle size (D50) of 1 to 15 μm, and
a content ratio of the large-particle size filler to the small-particle size filler (large-particle size filler:small-particle size filler) is 10:90 to 90:10 by volume.

2. The composite piezoelectric material according to claim 1, wherein the small-particle size filler has a BET specific surface area of 2 to 15 m²/g, and the large-particle size filler has a BET specific surface area of 0.1 to 3 m²/g.

3. The composite piezoelectric material according to claim 1, wherein a ratio (large-particle size filler/small-particle size filler) of the average particle size (D50) of the large-particle size filler to the average particle size (D50) of the small-particle size filler is 2 to 150.

4. The composite piezoelectric material according to claim 1, wherein
a ratio (Li/(Li+Na+K)) of the number of moles of lithium to the total number of moles of alkali metal elements in the small-particle size filler is 0 or more and less than 0.10 in terms of atoms, and
a ratio (Li/(Li+Na+K)) of the number of moles of lithium to the total number of moles of alkali metal elements in the large-particle size filler is 0 or more and less than 0.10 in terms of atoms.

5. A composite piezoelectric device comprising:
the composite piezoelectric material according to claim 1 which has been polarized.

6. A composite piezoelectric material comprising:
a polymer matrix; and
a composite piezoelectric material filler dispersed in the polymer matrix, wherein
the composite piezoelectric material filler comprises an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li,
a content of the alkali niobate compound is 20 to 80 vol % based on the entire composite piezoelectric material, and
the alkali niobate compound exhibits a bimodal particle size distribution including a first peak having a peak top in a particle size range of 0.1 to 1.2 μm and a second peak having a peak top in a particle size range of 1 to 15 μm in a particle size distribution measurement, wherein a ratio (B/A) of a value (B) of a frequency (%) of a particle size at the peak top of the second peak to a value (A) of a frequency (%) of a particle size at the peak top of the first peak is 0.1 to 20.

7. The composite piezoelectric material according to claim 6, wherein a ratio (the particle size at the peak top of the second peak/the particle size at the peak top of the first peak) of the particle size at the peak top of the second peak to the particle size at the peak top of the first peak is 2 to 150.

8. The composite piezoelectric material according to claim 6, wherein a ratio (Li/(Li+Na+K)) of the number of moles of lithium to the total number of moles of alkali metal elements in the alkali niobate compound is 0 or more and less than 0.10 in terms of atoms.

9. A composite piezoelectric device comprising:
the composite piezoelectric material according to claim 6 which has been polarized.

10. A composite piezoelectric material filler comprising a mixture of:
a small-particle size filler comprising an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li; and
a large-particle size filler comprising an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li, wherein
the small-particle size filler has an average particle size (D50) of 0.1 to 1.2 μm,
the large-particle size filler has an average particle size (D50) of 1 to 15 μm, and
a mixing ratio (large-particle size filler:small-particle size filler) of the large-particle size filler to the small-particle size filler is 10:90 to 90:10 by volume.

11. The composite piezoelectric material filler according to claim 10, wherein
the small-particle size filler has a BET specific surface area of 2 to 15 m²/g, and
the large-particle size filler has a BET specific surface area of 0.1 to 3 m2/g.

12. The composite piezoelectric material filler according to claim 10, wherein a ratio (large-particle size filler/small-particle size filler) of the average particle size (D50) of the large-particle size filler to the average particle size (D50) of the small-particle size filler is 2 to 150.

13. The composite piezoelectric material filler according to claim 10, wherein a ratio (Li/(Li+Na+K)) of the number of moles of lithium to the total number of moles of alkali metal elements in the small-particle size filler is 0 or more and less than 0.10 in terms of atoms, and a ratio (Li/(Li+Na+K)) of the number of moles of lithium to the total number of moles of alkali metal elements in the large-particle size filler is 0 or more and less than 0.10 in terms of atoms.

14. A composite piezoelectric material comprising:
the composite piezoelectric material filler according to claim 10; and
a polymer matrix.

15. A composite piezoelectric device comprising:
the composite piezoelectric material according to claim 14 which has been polarized.

16. A composite piezoelectric material filler comprising:
an alkali niobate compound represented by the formula $ANbO_3$ having a ratio (K/(Na+K)) of the number of moles of potassium to the total number of moles of sodium and potassium of 0.40 to 0.60 in terms of atoms and a ratio ((Li+Na+K)/Nb) of the total number of moles of alkali metal elements to the number of moles of niobium of 0.995 to 1.005 in terms of atoms, wherein A is an alkali metal element containing Na and K, and optionally Li,
the composite piezoelectric material filler exhibiting a bimodal particle size distribution including a first peak having a peak top in a particle size range of 0.1 to 1.2 μm and a second peak having a peak top in a particle size range of 1 to 15 μm in a particle size distribution measurement, wherein a ratio (B/A) of a value (B) of a frequency (%) of a particle size at the peak top of the second peak to a value (A) of a frequency (%) of a particle size at the peak top of the first peak is 0.1 to 20.

17. The composite piezoelectric material filler according to claim 16, wherein a ratio (Li/(Li+Na+K)) of the number of moles of lithium to the total number of moles of alkali metal elements in the alkali niobate compound is 0 or more and less than 0.10 in terms of atoms.

18. The composite piezoelectric material filler according to claim 16, wherein a ratio (the particle size at the peak top of the second peak/the particle size at the peak top of the first peak) of the particle size at the peak top of the second peak to the particle size at the peak top of the first peak is 2 to 150.

19. A composite piezoelectric material comprising:
the composite piezoelectric material filler according to claim 16; and
a polymer matrix.

20. A composite piezoelectric device comprising:
the composite piezoelectric material according to claim 19 which has been polarized.

* * * * *